US012394711B2

(12) United States Patent
Jain et al.

(10) Patent No.: US 12,394,711 B2
(45) Date of Patent: Aug. 19, 2025

(54) MICROELECTRONIC DEVICES WITH STAIRCASED STADIUMS AND BOTH THROUGH-STEP AND TO-STEP CONTACTS, AND RELATED SYSTEMS AND METHODS

(71) Applicant: Micron Technology, Inc., Boise, ID (US)

(72) Inventors: Harsh Narendrakumar Jain, Boise, ID (US); Scott L. Light, Boise, ID (US); Shruthi Kumara Vadivel, Boise, ID (US); Shuangqiang Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 372 days.

(21) Appl. No.: 17/709,020

(22) Filed: Mar. 30, 2022

(65) Prior Publication Data
US 2023/0317601 A1 Oct. 5, 2023

(51) Int. Cl.
| | | |
|---|---|---|
| *H01L 23/52* | (2006.01) | |
| *H01L 21/768* | (2006.01) | |
| *H01L 23/528* | (2006.01) | |
| *H10B 43/27* | (2023.01) | |
| *H10B 20/00* | (2023.01) | |
| *H10B 41/20* | (2023.01) | |
| *H10B 43/20* | (2023.01) | |

(Continued)

(52) U.S. Cl.
CPC ...... *H01L 23/528* (2013.01); *H01L 21/76895* (2013.01); *H10B 43/27* (2023.02); *H10B 20/50* (2023.02); *H10B 41/20* (2023.02); *H10B 43/20* (2023.02); *H10B 51/20* (2023.02); *H10B 53/20* (2023.02); *H10D 88/00* (2025.01)

(58) Field of Classification Search
CPC . H01L 23/5283; H01L 27/0688; H10B 20/50; H10B 41/20; H10B 41/27; H10B 41/50; H10B 43/20; H10B 43/27; H10B 43/50; H10B 51/20
See application file for complete search history.

(56) References Cited

U.S. PATENT DOCUMENTS

| | | |
|---|---|---|
| 8,759,217 B1 | 6/2014 | Chen |
| 9,589,978 B1 | 3/2017 | Yip |

(Continued)

OTHER PUBLICATIONS

Moyer, "How It's Built: Micron/Intel 3D Nand, Micron Opens the Veil a Little", EE Journal, (available at https://www.eejournal.com/article/20160201-micron/), Feb. 1, 2016, 9 pages.

(Continued)

*Primary Examiner* — Ida M Soward
(74) *Attorney, Agent, or Firm* — TraskBritt

(57) ABSTRACT

Microelectronic devices include a tiered stack including a vertically alternating sequence of insulative structures and conductive structures arranged in tiers. A stadium within the tiered stack includes a staircase with steps at ends of some of the tiers. The steps each have a tread provided by an upper surface portion of one of the conductive structures. Conductive contact structures extend to one of the steps and include a first conductive contact structure terminating at the tread of the step and a second conductive contact structure extending through the tread of the step. Related fabrication methods and electronic systems are also disclosed.

22 Claims, 56 Drawing Sheets

(51) Int. Cl.
*H10B 51/20* (2023.01)
*H10B 53/20* (2023.01)
*H10D 88/00* (2025.01)

(56) References Cited

U.S. PATENT DOCUMENTS

| | | | |
|---|---|---|---|
| 9,779,948 | B1 | 10/2017 | Baraskar et al. |
| 10,043,818 | B2* | 8/2018 | Lee .................. H10B 43/50 |
| 10,204,919 | B2* | 2/2019 | Lee .................. H01L 27/0207 |
| 10,373,970 | B2 | 8/2019 | Lee |
| 10,615,169 | B2 | 4/2020 | van Schravendijk et al. |
| 10,818,681 | B2 | 10/2020 | Hu et al. |
| 10,847,526 | B1* | 11/2020 | Yip .................. H10B 41/27 |
| 10,879,175 | B2 | 12/2020 | Tessariol et al. |
| 10,910,395 | B2 | 2/2021 | Lee |
| 10,978,478 | B1 | 4/2021 | Yip |
| 11,088,017 | B2 | 8/2021 | Matovu et al. |
| 11,088,088 | B2 | 8/2021 | Jhothiraman et al. |
| 2013/0219803 | A1 | 8/2013 | Ruhmann et al. |
| 2015/0228623 | A1* | 8/2015 | Oh .................. H10B 63/84 257/315 |
| 2016/0372322 | A1* | 12/2016 | Oh .................. H01L 21/30604 |
| 2017/0256551 | A1 | 9/2017 | Lee |
| 2017/0263556 | A1* | 9/2017 | Tessariol ............... H10B 43/50 |
| 2017/0294383 | A1* | 10/2017 | Tanzawa ............... H10B 43/27 |
| 2019/0081061 | A1 | 3/2019 | Tessariol et al. |
| 2019/0371728 | A1 | 12/2019 | Gossman et al. |
| 2020/0091081 | A1 | 3/2020 | Hatazaki et al. |
| 2020/0251491 | A1* | 8/2020 | Ozawa .............. H01L 21/0274 |
| 2020/0357813 | A1 | 11/2020 | Tanzawa |
| 2021/0050357 | A1 | 2/2021 | Yip |
| 2021/0134825 | A1 | 5/2021 | Liu et al. |
| 2021/0143169 | A1* | 5/2021 | Lee .................. H10B 41/27 |
| 2021/0151455 | A1 | 5/2021 | Xu et al. |
| 2021/0257298 | A1 | 8/2021 | Xu et al. |
| 2021/0343637 | A1* | 11/2021 | Clampitt ............... H10B 43/35 |
| 2022/0068827 | A1* | 3/2022 | Jain .................. H10B 43/35 |
| 2022/0130954 | A1* | 4/2022 | Luo .................. H01L 23/53295 |
| 2022/0181342 | A1* | 6/2022 | Vadivel ............... H10B 41/50 |
| 2022/0189982 | A1* | 6/2022 | Luo .................. H10B 43/10 |
| 2022/0199637 | A1* | 6/2022 | Luo .................. H10B 43/50 |
| 2022/0285378 | A1* | 9/2022 | Larsen ............... H01L 23/5384 |
| 2023/0010799 | A1* | 1/2023 | Xu .................. H10B 43/10 |
| 2023/0063111 | A1* | 3/2023 | Luo .................. H01L 21/76816 |
| 2023/0063178 | A1* | 3/2023 | Zhao ................ H01L 21/76816 |
| 2023/0178488 | A1* | 6/2023 | Luo .................. H01L 21/76834 257/614 |
| 2023/0197608 | A1* | 6/2023 | Clampitt ............... H10B 41/27 257/773 |
| 2023/0207470 | A1* | 6/2023 | Luo .................. H10B 43/40 257/314 |
| 2023/0276620 | A1* | 8/2023 | Zhang ............... H10B 43/35 257/314 |
| 2023/0307350 | A1* | 9/2023 | Xu .................. H01L 23/535 |
| 2024/0074197 | A1* | 2/2024 | Zhang ............... H01L 21/76816 |

OTHER PUBLICATIONS

Luo et al., "Microelectronic Devices With Multiple Step Contacts Extending to Stepped Tiers, and Related Systems and Methods," U.S. Appl. No. 17/476,344, filed Sep. 15, 2021, 79 pages.

Xu et al., "Microelectronic Devices With Active Source/Drain Contacts in Trench in Symmetrical Dual-Block Structure, and Related Systems and Methods," U.S. Appl. No. 17/373,258, filed Jul. 12, 2021, 73 pages.

* cited by examiner

FIG. 3

MICROELECTRONIC DEVICES WITH STAIRCASED STADIUMS AND BOTH THROUGH-STEP AND TO-STEP CONTACTS, AND RELATED SYSTEMS AND METHODS

TECHNICAL FIELD

Embodiments of the disclosure relate to the field of microelectronic device design and fabrication. More particularly, the disclosure relates to microelectronic devices (e.g., memory devices, such as 3D NAND memory devices) with series of staircased stadiums formed in a tiered stack of conductive structures vertically alternating with insulative structures. The disclosure also relates to methods for forming such devices and to systems incorporating such devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. The stack of tiers vertically alternate conductive materials with insulating (e.g., dielectric) materials. The conductive materials function as control gates for, e.g., access lines (e.g., word lines) of the memory cells. Vertical structures (e.g., pillars comprising channel structures and tunneling structures) extend along the vertical string of memory cells. A drain end of a string is adjacent one of the top and bottom of the vertical structure (e.g., pillar), while a source end of the string is adjacent the other of the top and bottom of the pillar. The drain end is operably connected to a bit line, while the source end is operably connected to a source structure (e.g., a source plate, a source line). A 3D NAND memory device also includes electrical connections between, e.g., access lines (e.g., word lines) and other conductive structures of the device so that the memory cells of the vertical strings can be selected for writing, reading, and erasing operations.

Some 3D NAND memory devices include so-called "staircase" structures having "steps" (or otherwise known as "stairs") at edges (e.g., ends) of the tiers of the stack. The steps have treads (e.g., upper surfaces) defining contact regions of conductive structures of the device, such as of access lines (e.g., word lines), which may be formed by the conductive materials of the tiered stack. Contact structures may be formed in physical contact with the steps to provide electrical access to the conductive structures (e.g., word lines) associated with the steps. The contact structures may be in electrical communication, via conductive routing lines, to additional contact structures that communicate to a source/drain region. String drivers drive the access line (e.g., word line) voltages to write to or read from the memory cells controlled via the access lines (e.g., word lines).

A continued goal in the microelectronic device fabrication industry is to minimize the footprint of the features of microelectronic devices so as to maximize the number of devices, and functional features thereof, in a given structural area. However, as device and feature sizes are reduced (e.g., scaled to smaller sizes) to accommodate a greater density of features, and as features are fabricated at the base of openings with higher aspect ratios, precise and accurate fabrication of structure features—such as steps and the contact structures that extend thereto—may be more challenging and may lead to fabrication errors. These errors may include, e.g., misalignments between a contact structure and its target step and/or electrical shorting between a contact structure and the conductive structure(s) of tiers other than that of its intended, target step. Accordingly, designing and fabricating 3D NAND memory devices continues to present challenges.

BRIEF DESCRIPTION OF THE DRAWINGS

FIG. 3 is a top plan, schematic view of the microelectronic device structure of FIG. 1, wherein the front of FIG. 1 corresponds to a view from section line C-C of FIG. 3.

FIG. 28 is a schematic, cross-sectional, perspective view of a structure of a multi-series stadium (e.g., FIG. 4) of a microelectronic device structure (e.g., FIG. 1 and FIG. 3), according to embodiments of the disclosure and which may be formed according to the fabrication processing stages illustrated in FIG. 8 through FIG. 28, wherein the view of FIG. 28 corresponds to section line A-A of FIG. 1 and FIG. 3.

FIG. 29 is a schematic, cross-sectional, perspective view of a structure of a single-series stadium (e.g., FIG. 5) of a microelectronic device structure (e.g., FIG. 1 and FIG. 3), according to embodiments of the disclosure and which may be formed according to the fabrication processing stages illustrated in FIG. 8 through FIG. 27 then FIG. 29, wherein the view of FIG. 29 corresponds to section line B-B of FIG. 1 and FIG. 3.

FIG. 33 is a schematic, cross-sectional, perspective view of a structure of a multi-series stadium (e.g., FIG. 4) of a microelectronic device structure (e.g., FIG. 1 and FIG. 3), according to embodiments of the disclosure and which may be formed according to the fabrication processing stages illustrated in FIG. 8 through FIG. 23 and FIG. 31 through FIG. 33, wherein the view of FIG. 33 corresponds to section line A-A of FIG. 1 and FIG. 3.

FIG. 34 is a schematic, cross-sectional, perspective view of a structure of a single-series stadium (e.g., FIG. 5) of a microelectronic device structure (e.g., FIG. 1 and FIG. 3), according to embodiments of the disclosure and which may be formed according to the fabrication processing stages illustrated in FIG. 8 through FIG. 23, FIG. 31, and FIG. 32 then FIG. 34, wherein the view of FIG. 34 corresponds to section line B-B of FIG. 1 and FIG. 3.

FIG. 38 is a schematic, cross-sectional, perspective view of a structure of a multi-series stadium (e.g., FIG. 4) of a microelectronic device structure (e.g., FIG. 1 and FIG. 3), according to embodiments of the disclosure and which may be formed according to the fabrication processing stages illustrated in FIG. 8 through FIG. 23 and FIG. 35 through FIG. 38, wherein the view of FIG. 38 corresponds to section line A-A of FIG. 1 and FIG. 3.

FIG. 39 is a schematic, cross-sectional, perspective view of a structure of a single-series stadium (e.g., FIG. 5) of a microelectronic device structure (e.g., FIG. 1 and FIG. 3), according to embodiments of the disclosure and which may be formed according to the fabrication processing stages illustrated in FIG. 8 through FIG. 23, FIG. 35 through FIG. 37 then FIG. 39, wherein the view of FIG. 39 corresponds to section line B-B of FIG. 1 and FIG. 3.

FIG. 48 is a schematic, cross-sectional, perspective view of a structure of a multi-series stadium (e.g., FIG. 4) of a microelectronic device structure (e.g., FIG. 1 and FIG. 3), according to embodiments of the disclosure and which may be formed according to the fabrication processing stages illustrated in FIG. 8 through FIG. 15 and FIG. 40 through FIG. 48, wherein the view of FIG. 48 corresponds to section line A-A of FIG. 1 and FIG. 3.

FIG. 49 is a schematic, cross-sectional, perspective view of a structure of a single-series stadium (e.g., FIG. 5) of a microelectronic device structure (e.g., FIG. 1 and FIG. 3), according to embodiments of the disclosure and which may be formed according to the fabrication processing stages illustrated in FIG. 8 through FIG. 15, FIG. 40 through FIG. 47 then FIG. 49, wherein the view of FIG. 49 corresponds to section line B-B of FIG. 1 and FIG. 3.

FIG. 54 is a schematic, cross-sectional, perspective view of a structure of a multi-series stadium (e.g., FIG. 4) of a microelectronic device structure (e.g., FIG. 1 and FIG. 3), according to embodiments of the disclosure and which may be formed according to the fabrication processing stages illustrated in FIG. 8 through FIG. 15, FIG. 40 through FIG. 45, and FIG. 50 through FIG. 54, wherein the view of FIG. 54 corresponds to section line A-A of FIG. 1 and FIG. 3.

FIG. 55 is a schematic, cross-sectional, perspective view of a structure of a single-series stadium (e.g., FIG. 5) of a microelectronic device structure (e.g., FIG. 1 and FIG. 3), according to embodiments of the disclosure and which may be formed according to the fabrication processing stages illustrated in FIG. 8 through FIG. 15, FIG. 40 through FIG. 45, FIG. 50 through FIG. 53 then FIG. 55, wherein the view of FIG. 55 corresponds to section line B-B of FIG. 1 and FIG. 3.

DETAILED DESCRIPTION

Figure 1:
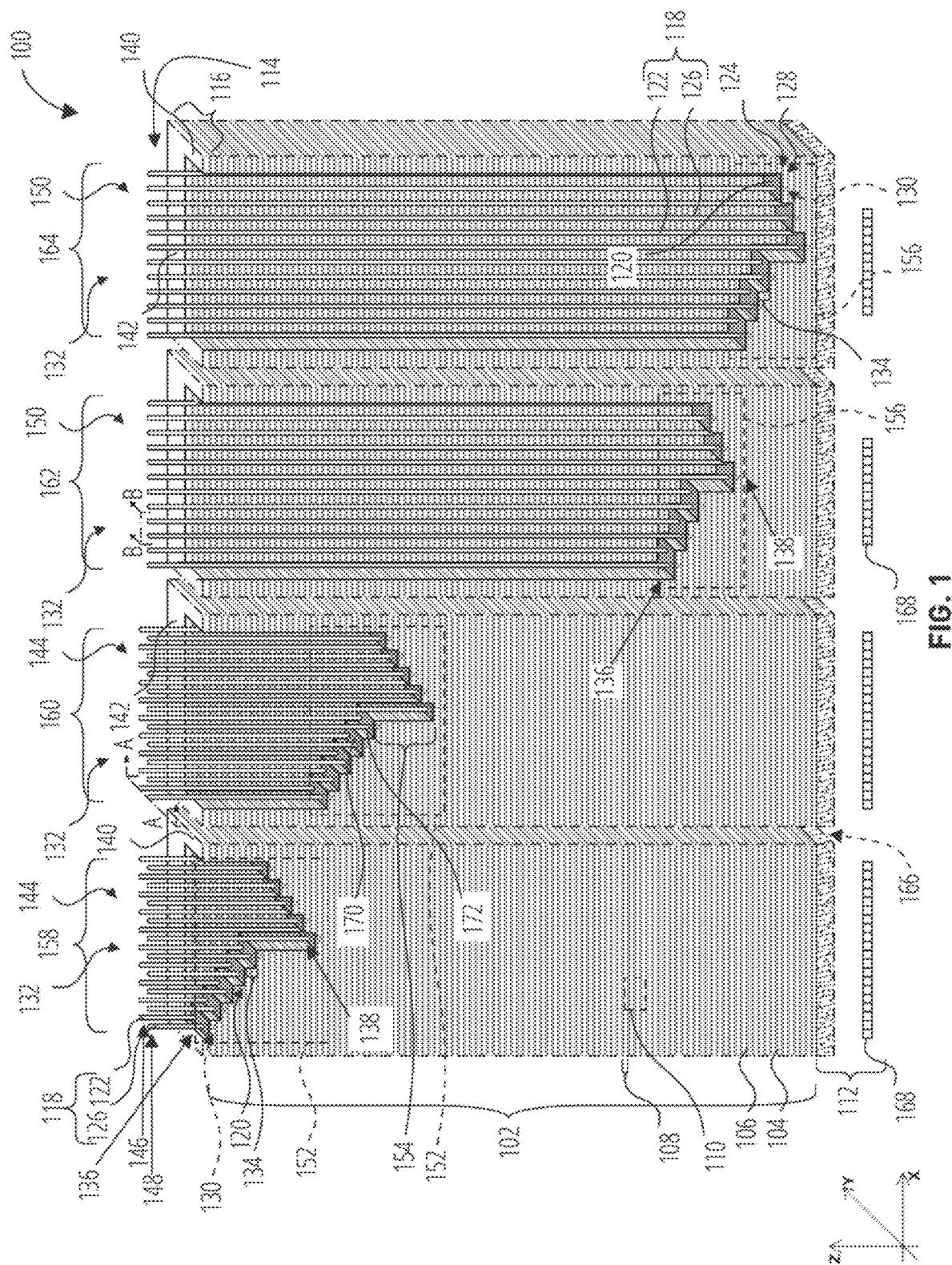
FIG. 1 is a schematic, cross-sectional, perspective view of a microelectronic device structure of a microelectronic device, according to embodiments of the disclosure.

Structures (e.g., microelectronic device structures), apparatuses (e.g., microelectronic devices), and systems (e.g., electronic systems), according to embodiments of the disclosure, include a stack of vertically alternating conductive structures and insulative structures arranged in tiers. A series of stadiums is patterned into the tiered stack with non-patterned "crest" portions of the stack spacing neighboring stadiums from one another. The stadiums include staircase structures having steps at ends of some tiers of the stack. The steps include treads defined by upper horizontal surfaces of conductive structures of the tiers that include such exposed surfaces. In their respective staircases, the steps also include risers defined by vertical sidewalls, at the distal end of the treads, of multiple of the tiers (e.g., multiple of the conductive structures and multiple of the insulative structures). Conductive "line contacts" (e.g., access line contacts, word line contacts) extend to the conductive structures of the staircases. In at least one stadium, the line contacts include both "to-step contacts" and "through-step contacts." Each "to-step contact" extends to "land on" the conductive structure providing a tread of a defined step of the staircase. Each "through-step contact" extends through at least one tread to land on a lower conductive structure that does not otherwise have an exposed step tread. Accordingly, a stadium accommodating "X" number of line contacts may include fewer (e.g., half as many) steps. Therefore, the steps, themselves, may be formed to define relatively greater-area treads without sacrificing line contact density. The greater-area steps may be relatively easier to fabricate precisely and accurately and may lessen the risk of contact misalignments and electrical shorting between contacts and non-target conductive structures.

As used herein, the term "series" means and refers to a group of items arranged substantially in a row (e.g., in the illustrated X-axis direction).

As used herein, the term "series of stadiums" means and refers to a group of stadiums distributed across a stack structure in a row (e.g., in the illustrated X-axis direction), with neighboring stadiums spaced from one another by a non-patterned "crest" portion of the stack.

As used herein, the term "set of staircases" means and refers to one or more staircases that collectively define a row (e.g., in the illustrated X-axis direction) of steps, each of which steps may be at a respectively different tier elevation of a stack structure. A respective "set of staircases" may include one or more descending staircases, one or more ascending staircases, or any combination thereof.

As used herein, the term "descending staircase" means and refers to a staircase generally exhibiting negative slope, as defined by a phantom line extending from a vertically highest step of the staircase to a vertically lowest step of the staircase.

As used herein, the term "ascending staircase" means and refers to a staircase generally exhibiting positive slope, as defined by a phantom line extending from a vertically highest step of the staircase to a vertically lowest step of the staircase.

As used herein, the term "high-aspect-ratio" means and refers to a height-to-width (e.g., a ratio of a maximum height to a maximum width) of greater than about 10:1 (e.g., greater than about 20:1, greater than about 30:1, greater than about 40:1, greater than about 50:1, greater than about 60:1, greater than about 70:1, greater than about 80:1, greater than about 90:1, greater than about 100:1).

As used herein, a feature referred to with the adjective "source/drain" means and refers to the feature being configured for association with either or both the source region and the drain region of the device that includes the "source/drain" feature. A "source region" may be otherwise configured as a "drain region" and vice versa without departing from the scope of the disclosure.

As used herein, the terms "opening," "trench," and "slit" mean and include a volume extending through or into at least one structure or at least one material, leaving a gap in that at least one structure or at least one material, or a volume extending between structures or materials, leaving a gap between the structures or materials. Unless otherwise described, an "opening," "trench," and/or "slit" is not necessarily empty of material. That is, an "opening," "trench," or "slit" is not necessarily void space. An "opening," "trench," or "slit" formed in or between structures or materials may comprise structure(s) or material(s) other than that in or between which the opening is formed. And, structure(s) or material(s) "exposed" within an opening, trench, or slit is/are not necessarily in contact with an atmosphere or non-solid environment. Structure(s) or material(s) "exposed" within an opening, trench, or slit may be adjacent or in contact with other structure(s) or material(s) that is/are disposed within the opening, trench, or slit.

As used herein, the terms "substrate" and "base structure" mean and include a base material or other construction upon which components, such as tiered stacks and structures therein, are formed. The substrate or base structure may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base structure" in the following description, previous process stages may have been utilized to form materials, structures, or junctions in the base semiconductor structure, base structure, or other foundation.

As used herein, the terms "insulative" and "insulating," when used in reference to a material or structure, means and includes a material or structure that is electrically insulative or electrically insulating. An "insulative" or "insulating" material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of "x," "y," and/or "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and/or "z" atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative" or "insulating" structure means and includes a structure formed of and including "insulative" or "insulating" material.

As used herein, the term "sacrificial," when used in reference to a material or structure, means and includes a material or structure that is formed during a fabrication process but which is removed (e.g., substantially removed) prior to completion of the fabrication process.

As used herein, the term "horizontal" means and includes a direction that is parallel to a primary surface of the substrate on which the referenced material or structure is located. The "width" and "length" of a respective material or structure may be defined as dimensions in a horizontal plane. With reference to the figures, the "horizontal" direction may be perpendicular to an indicated "Z" axis, may be parallel to an indicated "X" axis, and may be parallel to an indicated "Y" axis.

As used herein, the term "lateral" means and includes a direction in a horizontal plane parallel to a primary surface of the substrate on which a referenced material or structure is located and substantially perpendicular to a "longitudinal" direction. The "width" of a respective material or structure may be defined as a dimension in the lateral direction of the horizontal plane. With reference to the figures, the "lateral" direction may be parallel to an indicated "X" axis, may be perpendicular to an indicated "Y" axis, and may be perpendicular to an indicated "Z" axis.

As used herein, the term "longitudinal" means and includes a direction in a horizontal plane parallel to a primary surface of the substrate on which a referenced material or structure is located, and substantially perpendicular to a "lateral" direction. The "length" of a respective material or structure may be defined as a dimension in the longitudinal direction of the horizontal plane. With reference to the figures, the "longitudinal" direction may be parallel to an indicated "Y" axis, may be perpendicular to an indicated "X" axis, and may be perpendicular to an indicated "Z" axis.

As used herein, the term "vertical" means and includes a direction that is perpendicular to a primary surface of the substrate on which a referenced material or structure is located. The "height" of a respective material or structure may be defined as a dimension in a vertical plane. With reference to the figures, the "vertical" direction may be parallel to an indicated "Z" axis, may be perpendicular to an indicated "X" axis, and may be perpendicular to an indicated "Y" axis.

As used herein, the term "width" means and includes a dimension, along an indicated "X" axis in a horizontal plane (e.g., at a certain elevation, if identified), defining a maximum distance, along such "X" axis in the horizontal plane, of the whole of the material or structure in question or of a concerned portion of the material or structure in question. For example, a width of a conductive structure may be a maximum X-axis dimension from one lateral end of the conductive structure to an opposite lateral end of the structure, whereas a width of a step defined by the conductive structure may be a maximum X-axis dimension of only that portion of the conductive structure that provides the step.

As used herein, the term "length" means and includes a dimension, along an indicated "Y" axis in a horizontal plane (e.g., at a certain elevation, if identified), defining a maximum distance, along such "Y" axis in the horizontal plane, of the material or structure in question or of a concerned portion of the material or structure in question. For example, a length of a conductive structure may be a maximum Y-axis dimension from one block-defining slit to another block-defining slit, whereas a length of a step defined by the conductive structure may be a maximum Y-axis dimension of only that portion of the conductive structure that provides the step.

As used herein, the terms "thickness" or "thinness" are spatially relative terms that mean and include a dimension in a straight-line direction that is normal to the closest surface of an immediately adjacent material or structure that is of a different composition or that is otherwise distinguishable from the material or structure whose thickness, thinness, or height is discussed.

As used herein, the term "between" is a spatially relative term used to describe the relative disposition of one material or structure relative to at least two other materials or structures. The term "between" may encompass both a disposition of one material or structure directly adjacent the other materials or structures and a disposition of one material or structure indirectly adjacent to the other materials or structures.

As used herein, the term "proximate" is a spatially relative term used to describe disposition of one material or structure near to another material or structure. The term "proximate" includes dispositions of indirectly adjacent to, directly adjacent to, and internal to.

As used herein, features (e.g., regions, materials, openings, structures, assemblies, devices) described as "neighboring" one another mean and include features of the disclosed identity (or identities) that are located most proximate (e.g., closest to) one another. One or more additional features (e.g., additional regions, additional materials, additional structures, additional openings, additional assemblies, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with the "neighboring" features is positioned between the "neighboring" features. For example, a structure of material X "neighboring" a structure of material Y is the first material X structure, e.g., of multiple material X structures, that is nearest the particular structure of material Y. Accordingly, features described as "vertically neighboring" one another mean and include features of the disclosed identity (or identities) that are located most vertically proximate (e.g., vertically closest to) one another. Moreover, features described as "horizontally neighboring" one another mean and include features of the disclosed identity (or identities) that are located most horizontally proximate (e.g., horizontally closest to) one another.

As used herein, the term "consistent"—when referring to a parameter, property, or condition of one structure, material, feature, or portion thereof in comparison to the parameter, property, or condition of another such structure, material, feature, or portion of such same aforementioned structure, material, or feature—is a relative term that means and includes the parameter, property, or condition of the two such structures, materials, features, or portions being equal, substantially equal, or about equal, at least in terms of respective dispositions of such structures, materials, features, or portions. For example, two structures having "consistent" heights as one another may each define a same, substantially same, or about the same height, from a lower surface to an upper surface of each respective such structure, despite the two structures being at different elevations of a larger structure.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0 percent met, at least 95.0 percent met, at least 99.0 percent met, or even at least 99.9 percent met.

As used herein, the terms "on" or "over," when referring to an element as being "on" or "over" another element, are spatially relative terms that mean and include the element being directly on top of, adjacent to (e.g., laterally adjacent to, horizontally adjacent to, longitudinally adjacent to, vertically adjacent to), underneath, or in direct contact with the other element. It also includes the element being indirectly on top of, adjacent to (e.g., laterally adjacent to, horizontally adjacent to, longitudinally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, any spatially relative terms used in this disclosure are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the lowest illustrated surface of the structure that includes the materials or features. As used herein, a "level" and an "elevation" are each defined by a horizontal plane parallel to a primary surface of the substrate or base structure on or in which the structure (that includes the materials or features) is formed. When used with reference to the drawings, "lower levels" and "lower elevations" are relatively nearer to the bottom-most illustrated surface of the respective structure, while "higher levels" and "higher elevations" are relatively further from the bottom-most illustrated surface of the respective structure.

As used herein, the term "depth" is a spatially relative term used to describe one material's or feature's relationship to another material(s) or feature(s) as illustrated in the figures, using—as a reference point—the highest illustrated surface of the structure (e.g., stack structure) that includes the materials or features. When used with reference to the drawings, a "depth" is defined by a horizontal plane parallel to the highest illustrated surface of the structure (e.g., stack structure) that includes the materials or features.

Unless otherwise specified, any spatially relative terms used in this disclosure are intended to encompass different orientations in addition to the orientation as depicted in the drawings. For example, the materials in the drawings may be inverted, rotated, etc., with the "upper" levels and elevations then illustrated proximate the bottom of the page, the "lower" levels and elevations then illustrated proximate the top of the page, and the greatest "depths" extending a greatest vertical distance upward.

As used herein, the terms "comprising," "including," "having," and grammatical equivalents thereof are inclusive, open-ended terms that do not exclude additional, unrecited elements or method steps. These terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a material (e.g., composition) described as "comprising," "including," and/or "having" a species may be a material that, in some embodiments, includes additional species as well and/or a material that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, an "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced feature (e.g., region, material, structure, opening, assembly, device) so as to facilitate a referenced operation or property of the referenced feature in a predetermined way.

The illustrations presented herein are not meant to be actual views of any particular material, structure, substructure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded; surfaces and features illustrated to be vertical may be non-vertical, bent, and/or bowed; and/or structures illustrated with consistent transverse widths and/or lengths throughout the height of the structure may taper in transverse width and/or length. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

With reference to FIG. 1, illustrated is a microelectronic device structure 100 that includes a stack 102 (which may otherwise be referred to herein as a "stack structure" or as a "tiered stack") of vertically alternating (e.g., vertically interleaved) insulative structures 104 and conductive structures 106 arranged in tiers 108. Each tier 108—as the term "tier" is used herein—includes one of the insulative structures 104 and one of the conductive structures 106 vertically neighboring the one of the insulative structures 104. This vertically alternating, interleaved arrangement of the insulative structures 104 and the conductive structures 106 providing the tiers 108 is illustrated in greater detail in FIG. 2, which is an enlargement of the area of box 110 of FIG. 1, but may be equally illustrative of other portions of the stack 102.

With continued reference to FIG. 1, the number (e.g., quantity) of tiers 108 (and conductive structures 106) illustrated is for example only, and the disclosure is not so limiting. For example, a microelectronic device structure, in accordance with embodiments of the disclosure, may include a different quantity of the tiers 108 (e.g., and of the conductive structures 106) in the stack 102. In some embodiments, the stack 102 includes one-hundred twenty-six or one-hundred twenty-eight of the tiers 108 (and of the conductive structures 106). The number (e.g., quantity) of the tiers 108—and therefore of the conductive structures 106—of the stack 102 may be within a range of from thirty-two to three-hundred or more. The tiers 108 may be included in one or more decks of the stack 102.

The conductive structures 106 may be formed of and include (e.g., each be formed of and include) one or more conductive materials, such as one or more of: at least one metal (e.g., one or more of tungsten, titanium, nickel, platinum, rhodium, ruthenium, iridium, aluminum, copper, molybdenum, silver, gold), at least one alloy (e.g., an alloy of one or more of the aforementioned metals), at least one metal-containing material that includes one or more of the aforementioned metals (e.g., metal nitrides, metal silicides, metal carbides, metal oxides, such as a material including one or more of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof), at least one conductively-doped semiconductor material (e.g., conductively-doped silicon, conductively-doped germanium, conductively-doped silicon germanium), polysilicon, and at least one other material exhibiting electrical conductivity. In some embodiments, the conductive structures 106 include at least one of the aforementioned conductive materials along with at least one additional of the aforementioned conductive materials formed as a liner. Some or all of the conductive structures 106 may have the same (e.g., consistent) or different thicknesses (e.g., heights) as one another.

The insulative structures 104 may be formed of and include (e.g., each be formed of and include) at least one insulative material, such as a dielectric oxide material (e.g., silicon dioxide). In this and other embodiments described herein, the insulative material of the insulative structures 104 may be substantially the same as or different than other insulative material(s) of the microelectronic device structure 100. Some or all of the insulative structures 104 may have the same (e.g., consistent) or different thicknesses (e.g., heights) as one another. In some embodiments, some of the insulative structures 104 (e.g., an uppermost, a lowest, and/or intermediate insulative structures 104) are relatively thicker than others of the insulative structures 104 in the stack 102.

The stack 102 may be provided on or over a base structure 112, which may include one or more regions formed of and including, for example, one or more semiconductor materials (e.g., polycrystalline silicon (polysilicon)) doped with one or more P-type conductivity chemical species (e.g., one or more of boron, aluminum, and gallium) and/or one or more N-type conductivity chemical species (e.g., one or more of arsenic, phosphorous, and antimony) to provide one or more source/drain regions of the microelectronic device structure 100.

In addition to the semiconductor materials and/or source/ drain region, the base structure 112 may include other base material(s) or structure(s), such as conductive regions for making electrical connections with other conductive structures of the device that includes the microelectronic device structure 100. In some such embodiments, CMOS (complementary metal-oxide-semiconductor) circuitry is included, within the base structure 112, in a CMOS region below the source/drain region, which CMOS region may be characterized as a so-called "CMOS under Array" ("CuA") region.

Figure 3:
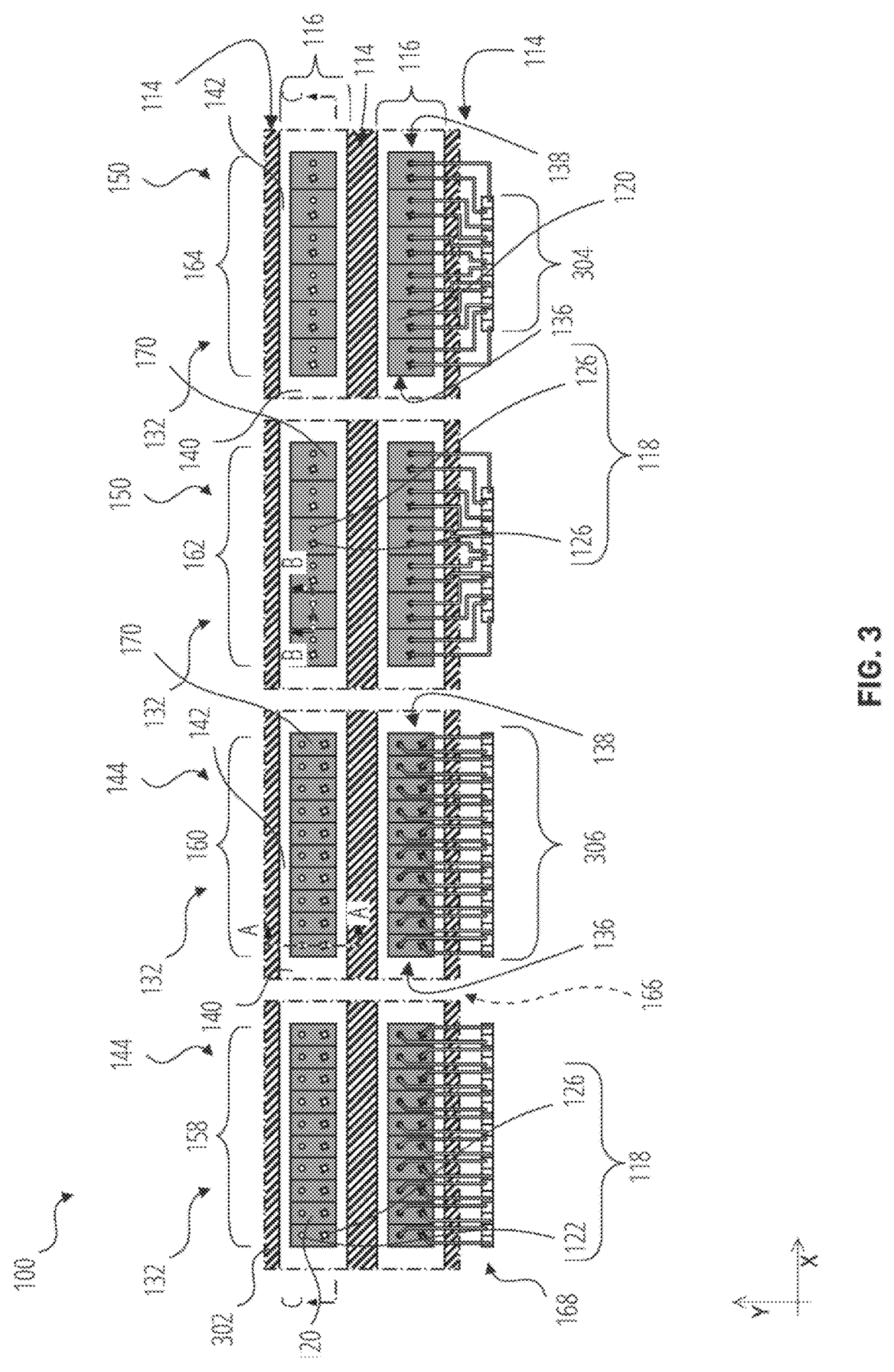

With continued reference to FIG. 1 and also with reference to FIG. 3—which is a top plan view of the microelectronic device structure 100 of FIG. 1—a series of slits 114 or other elongate structures may extend through the stack 102 to divide the stack 102 into a series of blocks 116 that extend in the lateral direction (e.g., with a greater dimension (e.g., width) in the "X"-axis direction than a dimension (e.g., length) in the "Y"-axis direction).

FIG. 3 is a top plan view of a pair of neighboring blocks 116 including the block 116 illustrated in FIG. 1. As illustrated in FIG. 3, a pair of slits 114 may be formed, parallel to the "X"-axis, to define the front and rear of a respective one of the blocks 116 of the microelectronic device structure 100. A longitudinally forward and/or rearward neighboring block 116, to the block 116 of FIG. 1, may be similarly structured to the block 116 of FIG. 1 such that the illustration of FIG. 1 may represent such neighboring blocks 116 as well. Alternatively, such neighboring blocks 116 may have structures substantially mirrored to that of the block 116 of FIG. 1, reflected about the slit 114 that separates the blocks 116 from one another. The slits 114 may be substantially filled with non-conductive material(s) 302 to form one slit structure between each pair of neighboring blocks 116.

Other portions of the microelectronic device structure 100 (e.g., portions horizontally disposed relative to the portions illustrated in, e.g., FIG. 1 and FIG. 3) may include array(s) of pillars (e.g., including channel material and memory material) extending through the stack 102 and to and/or into the base structure 112 (e.g., to and/or into a source/drain region). The pillars may effectuate the formation of strings of memory cells of a memory device (e.g., a memory device including any of the microelectronic device structures described or illustrated herein). The conductive structures 106 of the tiers 108 may be coupled to, or may form control gates of, the memory cells effectuated by the pillars. For example, each conductive structure 106 may be coupled to an individual memory cell of a particular string (e.g., effectuated by a particular pillar) of memory cells.

With returned reference to FIG. 1, to facilitate electrical communication to particular selected conductive structures 106 within the stack 102, conductive contact structures— referred to herein as "line contacts" 118 extend to (or from) and physically contact the conductive structures 106 of the tiers 108. Each such line contact 118 is positioned to physically contact a particular one of the conductive structures 106.

Some of the line contacts 118 are positioned and formed to physically contact (e.g., "land on") a particular one of the conductive structures 106 at an exposed upper (e.g., horizontal) surface portion of that conductive structure 106, which exposed area is referred to herein as a "tread" 170 of a "step" 120. The vertical sidewall at the distal end of the step 120 tread 170 is referred to herein as a "riser" 172 of the step 120.

The line contacts 118 that extend to, and physically contact, such step 120 treads 170 are referred to herein as "to-step contacts" 122. Accordingly, a lowest surface of a to-step contact 122 may be on or in a conductive structure 106 that provides a step 120 tread 170, which conductive structures 106 may be referred to herein as being a "treaded" conductive structure 106 and/or in a "treaded" tier 124. The step 120 tread 170 of the treaded tier 124 functions as a landing area for physical contact with at least one of the to-step contacts 122.

Others of the line contacts 118 are positioned and formed to physically contact (e.g., land on) a particular one of the conductive structures 106 at an otherwise covered (e.g., not exposed) upper (e.g., horizontal) surface portion of that targeted conductive structure 106. To reach such covered surface portions, these line contacts 118 extend through— and do not come into physical or electrical contact with—at least one other conductive structure 106 (e.g., a treaded conductive structure 106) that is vertically above the target conductive structure 106. The line contacts 118 of this type are referred to herein as "through-step contacts" 126. Accordingly, a lowest surface of a through-step contact 126 may be on or in a conductive structure 106 that does not provide a step 120 tread 170, which conductive structures 106 may be referred to herein as a "covered" conductive structure 106 and/or in a "covered" tier 128. The area of the upper surface of the covered conductive structure 106 (of the covered tier 128) that is vertically below a step 120 of a treaded tier 124 is the conductive structure 106 that functions as a landing area for physical contact with at least one of the through-step contacts 126.

To provide the steps 120 of the conductive structures 106, the stack 102 is patterned (e.g., etched) to expose the "treads" 170 of the steps 120, that is, to expose one or more upper (e.g., horizontal) surface area portion(s) of individual conductive structures 106. More particularly, the tiers 108 are selectively patterned to remove portions of otherwise-overlying tiers 108 to leave exposed (until otherwise covered by fill material and/or line contacts 118) at least one upper surface area of the conductive structure 106 of the next lower tier 108. Each exposed area provides one step 120 tread 170 for the respective tier 108 (and conductive structure 106) (e.g., the treaded tier 124).

Because individual conductive structures 106 in the stack 102 occupy different elevations of the stack 102 (also referred to herein as different "tier elevations"), the steps 120 are formed at the various elevations of the conductive structures 106. The line contacts 118 of the to-step contact 122 type extend downward to physically contact (e.g., "land on") respective steps 120, and the line contacts 118 of the through-step contact 126 type extend downward, through respective steps 120, to land on a respective covered tier 128 below the step 120. The through-step contacts 126 therefore each include an extension 130 of at least the height of one tier 108.

The height of an individual line contact 118 may be tailored according to the depth (e.g., elevation) of its respective treaded tier 124 or covered tier 128, depending on whether the line contact 118 is a to-step contact 122 or a through-step contact 126, respectively. The line contacts 118 extending to or through steps 120 of relatively shallower stadiums 132, e.g., in the relatively higher elevations of the stack 102, may be generally shorter than the line contacts 118 that extend to or through steps 120 of relatively deeper stadiums 132, e.g., in relatively lower elevations of the stack 102. And, each through-step contact 126 that extends through a respective step 120 may be taller (e.g., define a vertical, Z-axis dimension that is greater) than each to-step contact 122 that extends to such respective step 120 by at least the extension 130 height (e.g., at least the height of one tier 108).

The microelectronic device structure 100 may include, in each respective block 116, at least one line contact 118 per conductive structure 106 (e.g., per tier 108) in the stack 102.

The steps 120 are grouped in staircases with each staircase providing at least a part of a row (extending in the X-axis direction) of the steps 120, all or at least some of which are at different tier elevations than others of the steps 120 in the staircase. The tier elevations of the steps 120 of a respective staircase may incrementally decrease or incrementally increase through the staircase according to the height of the step 120 riser 172, with both the "riser" 172 and the "riser height" indicated in the drawings at reference number 134. For example, in one staircase, the steps 120 may be formed at successively increasing tier 108 (and conductive structure 106) depths (e.g., decreasing tier 108 elevations) to define a descending staircase 136 having generally negative slope. In another staircase, the steps 120 may be formed at successively decreasing tier 108 (and conductive structure 106) depths (e.g., increasing tier 108 elevations) to define an ascending staircase 138 having generally positive slope. The elevation difference between neighboring steps 120 of the row of steps 120 of a respective staircases (e.g., one of the descending staircases 136, one of the ascending staircases 138) defines the riser height 134.

The staircases (e.g., the descending staircases 136 and the ascending staircases 138) are grouped in so-called "stadiums" 132. One set of staircases extends the width of each stadium 132. As used herein, a "set" of staircases comprises the one or more staircases that are horizontally aligned in the x-axis direction within a respective stadium 132 and that extend the width of the stadium 132.

In some embodiments, one set of staircases consists of a single (e.g., only one) descending staircase 136 and a single (e.g., only one) ascending staircase 138, such as in the microelectronic device structure 100 illustrated in FIG. 1. In some embodiments, the descending staircase 136 descends toward the ascending staircase 138, as illustrated in FIG. 1. In other embodiments, the ascending staircase 138 ascends toward the descending staircase 136 (such as if the illustrated lateral halves of the stadiums 132 of FIG. 1 were horizontally reversed with one another). In other embodiments, one set of staircases consists of a single descending staircase 136 or a single ascending staircase 138 that extends the whole width of the stadium 132. In other embodiments, more than one descending staircase 136 may be included in the set, alone or with one or more ascending staircases 138; or more than one ascending staircase 138 may be included in the set, alone or with one or more descending staircases 136.

The stadiums 132, of a respective block 116 of the microelectronic device structure 100, may be arranged in a series such that multiple stadiums 132 are distributed across a width of the block 116 and extend, in a row (e.g., in the X-axis direction), substantially parallel to the slits 114, as illustrated in FIG. 1 and FIG. 3. The microelectronic device structure 100 may include as many stadiums 132 at various elevation groups, within a respective block 116 (and stadium series), as necessary for each conductive structure 106 to be connected with at least one to-step contact 122 or at least one through-step contact 126.

Neighboring stadiums 132 may be spaced from one another, in the stadium series of the block 116, by a so-called "crest" 140 of the stack 102. The crests 140 may be formed by areas of the stack 102 where the tiers 108 have not been patterned. The crests 140 may, therefore, extend an entire height of the stack 102. In some embodiments, uppermost boundaries of the crests 140 may be positioned at (e.g., coplanar with) uppermost boundaries of the stack 102. In some embodiments, through-stack conductive structures may be included in the crests 140 and may be in electrical communication between the line contacts 118 (e.g., the to-step contacts 122, the through-step contacts 126) and other electrical components in the base structure 112.

One or more other non-patterned portions of the stack 102 may form one or more so-called "bridges" 142 that extend a width of the block 116. The bridge(s) 142 may extend the entire height of the stack 102. In some embodiments, uppermost boundaries of the bridge(s) 142 may be positioned at (e.g., coplanar with) uppermost boundaries of the stack 102. One of the bridges 142 may border one of the slits 114 that define the block 116 length (Y-axis dimension). In some embodiments, each block 116 includes two bridges 142, and each bridge 142 borders a different one of the slits 114 that define the block 116, as illustrated in FIG. 3. Via the one or more bridges 142, distal portions of a given conductive structure 106 of a respective tier 108 are part of a continuous, single conductive structure 106 of that tier 108. Therefore, an electrical connection between one or more of the line contacts 118 and one of the steps 120 may provide an electrical connection between the one or more line contacts 118 and the whole of the conductive structure 106—that provides the step 120 of the respective treaded tier 124—throughout the block 116.

Still referring to FIG. 1, one or more insulative fill material(s) (e.g., dielectric material(s)) may substantially fill remaining openings (e.g., trenches), referred to herein as "stadium openings" (e.g., "stadium trenches") vertically overlying and partially defined by the stadiums 132 to electrically insulate the line contacts 118 from one another. The line contacts 118 vertically extend through the insulative fill material(s) to one of the steps 120 (for the to-step contacts 122) or through one of the steps 120 to one of the covered tiers 128 (for the through-step contacts 126). For ease of illustration, FIG. 1 and FIG. 3 do not illustrate the insulative fill material(s). In some embodiments, the insulative fill material(s) may be one or more dielectric material(s) formed of and including any one or more insulative materials described above.

At least one of the stadiums 132 of the series in the block 116 includes both to-step contacts 122 and through-step contacts 126. Some such stadiums 132 may arrange the to-step contacts 122 and the through-step contacts 126 in multiple series, such as multiple parallel rows of the line contacts 118. Stadiums associated with this arrangement of line contacts 118 are referred to herein as "multi-series stadiums" 144. In some embodiment, such as illustrated in FIG. 1, the line contacts 118 of a multi-series stadium 144 are arranged in a first series 146 substantially laterally aligned (in the X-axis direction) and a second series 148 substantially laterally aligned (in the X-axis direction). The second series 148 may be parallel to and longitudinally adjacent (in the Y-axis direction) the first series 146.

In some embodiments, one or more other stadiums 132 of the series in the block 116 includes a single series (e.g., a single row) of line contacts 118, and the single series may include both to-step contacts 122 and through-step contacts 126, such as illustrated in FIG. 1, or all to-step contacts 122, as described further below. Stadiums associated with this arrangement of line contacts 118 are referred to herein as "single-series stadiums" 150. The line contacts 118 of a respective one of the single-series stadiums 150 may be substantially laterally aligned (in the X-axis direction).

Figure 4:
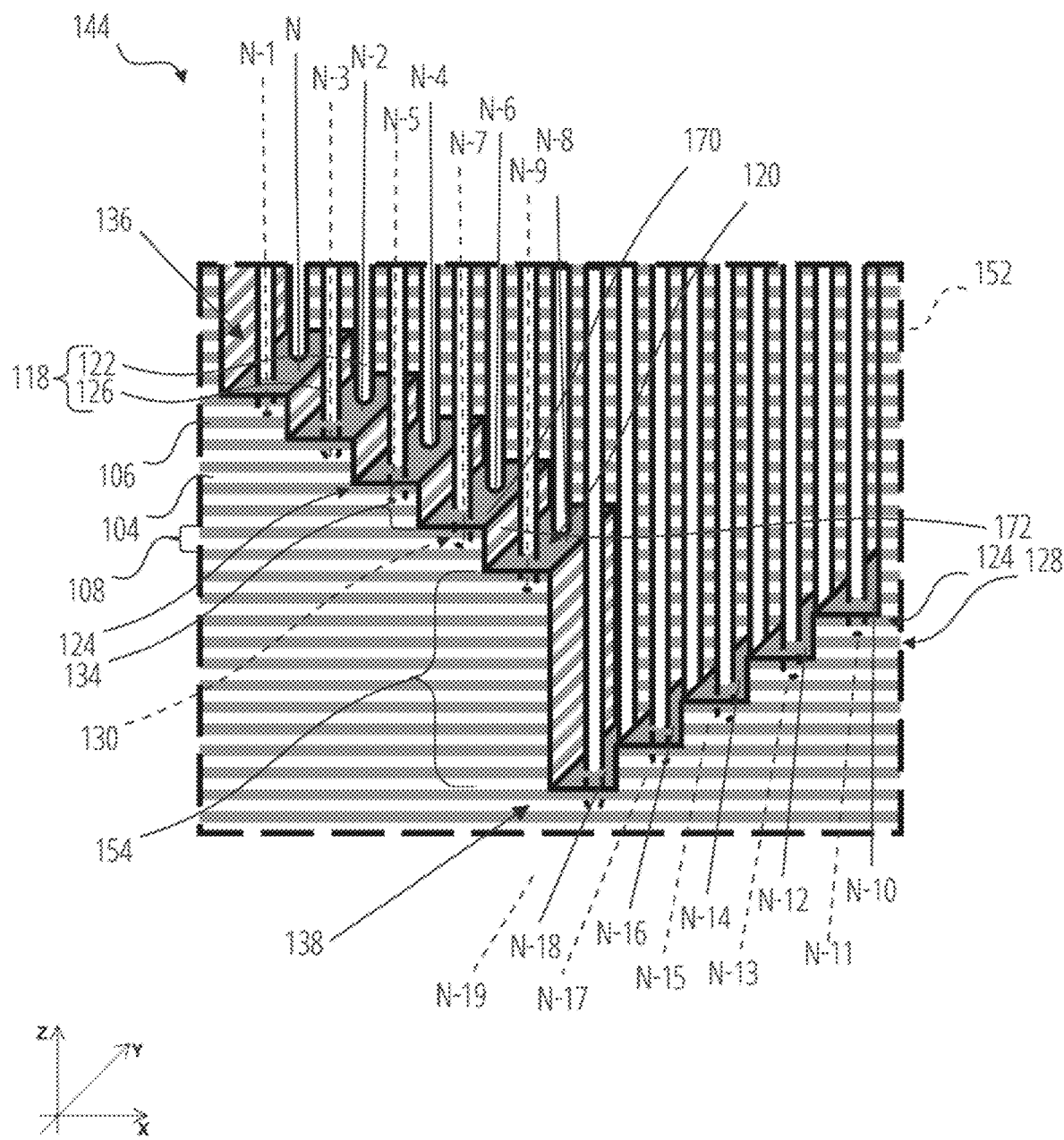
FIG. 4 is an enlarged view of the area of box 152 of FIG. 1, illustrating a multi-series stadium including at least one series of to-step contacts and at least one series of through-step contacts, according to embodiments of the disclosure.

FIG. 4 is an enlarged view, corresponding to boxes 152 of FIG. 1, showing the staircase profile of, and the associated line contacts 118 of, one of the multi-series stadiums 144 of the microelectronic device structure 100 of FIG. 1. This staircase profile and line contacts 118 configuration may be implemented for at least one (e.g., some, half, all) of the stadiums 132 of the series of stadiums 132 of the block 116 (FIG. 1).

In some embodiments, the multi-series stadium 144 may include a single descending staircase 136 and a single ascending staircase 138 (collectively a single "set" of staircases) that together provide a series of steps 120 with each step 120 occupying a unique tier 108 elevation. The staircases (e.g., the descending staircase 136 and the ascending staircase 138) may be formed so that, for example, about half of the tiers 108 included in the staircases are treaded tiers 124, each with a conductive structure 106 providing a step 120 tread 170, and so that the other about half of the tiers 108 included in the staircases plus the next vertically lower tier 108 are covered tiers 128, each with a conductive structure 106 that does not provide a step 120 tread 170. To accomplish this, each of the steps 120 may define a riser height 134, within its respective staircase (e.g., the descending staircase 136, the ascending staircase 138) of a multiple number of the tiers 108 of the stack 102, and one of the staircases (e.g., the descending staircase 136, the ascending staircase 138) may be vertically offset from the other by a vertical distance (e.g., a half-stadium offset 154) at least equaling the number of tiers 108 included in the lower of the staircases (e.g., the lower of the descending staircase 136 and the ascending staircase 138). Therefore, the half-stadium offset 154 may be selected to be at least the number of tiers 108 included in the riser height 134 multiplied by the number of steps 120 included in the lower of the staircases (e.g., the ascending staircase 138 of FIG. 4).

For example, the riser height 134 may be selected to be a height of two tiers 108, and the half-stadium offset 154 may be selected to be at least ten tiers 108 if the number of steps 120 in the lower staircase (e.g., the ascending staircase 138) is five. Accordingly, each subsequent step 120 of the descending staircase 136 may be at an elevation that is the riser height 134 of two tiers 108 (i.e., two conductive structures 106 plus two insulative structures 104) lower than its preceding step 120, such that the descending staircase 136 defines steps 120 (e.g., treads 170) at elevations N, N-2, N-4, N-6, and N-8, as illustrated in FIG. 4. Within the same example, each subsequent step 120 of the ascending staircase 138 may be at an elevation that is the riser height 134 of two tiers 108 higher than its preceding step 120, with the lowest step of the ascending staircase 138 being the half-stadium offset 154 lower than the lowest step of the descending staircase 136. Therefore, the ascending staircase 138 defines steps 120 (e.g., treads 170) at elevations N-18, N-16, N-14, N-12, and N-10. The elevation of the lowest step 120 of the descending staircase 136 (e.g., elevation N-8) may be at least the riser height 134 (e.g., two tiers 108) above the elevation of the highest step 120 of the ascending staircase 138 (e.g., elevation N-10).

Though FIG. 4 and other figures illustrate the ascending staircase 138—of the multi-series stadium 144—being the half-stadium offset 154 lower than the descending staircase 136, the disclosure is not so limited. For example, in other embodiments, the descending staircase 136 is the half-stadium offset 154 lower than the ascending staircase 138.

With a riser height 134 of, e.g., two tiers 108, the to-step contacts 122 may be formed to land on or in the conductive structures 106 of the treaded tiers 124 at the "even elevations," e.g., at elevations N, N-2, N-4, N-6, and N-8 (of the descending staircase 136) and N-18, N-16, N-14, N-12, and N-10 (of the ascending staircase 138). Contrarily, the through-step contacts 126, with their at least one-tier extension 130 (e.g., one-tier extension 130) may be formed to extend through the conductive structure 106 and insulative structure 104 of a respective one of the treaded tiers 124 to land on or in the conductive structure 106 of a respective one of the covered tiers 128, such as a next lower tier 108 to the treaded tier 124 through which the through-step contact 126 extends. Accordingly, the through-step contacts 126 may extend to the covered tiers 128 at the "odd elevations," e.g., at elevations N-1, N-3, N-5, N-7, and N-9 (of the descending staircase 136) and N-19, N-17, N-15, N-13, and N-11 (of the ascending staircase 138).

Though FIG. 4 and FIG. 1 illustrate the to-step contacts 122 as being in the first series 146 (FIG. 1) to the more rearward side of the through-step contacts 126 of the second series 148 (FIG. 1), the disclosure is not so limited. In other embodiments, the through-step contacts 126 may be in the more rearward first series 146, and the to-step contacts 122 may be in the more forward second series 148. In still other embodiments, the first series 146 may include the to-step contact 122 for some of the steps 120 and the through-step contact 126 for some other of the steps 120, and the second series 148 may include the neighboring through-step contact 126 for the some of the steps 120 and the to-step contact 122 for the some other of the steps 120.

By including both to-step contacts 122 and through-step contacts 126 in the multi-series stadiums 144, the stadium 132 may accommodate "X" number of line contacts 118 without having to pattern "X" number of steps 120. That is, compared to a stadium patterned to define one step per line contact, the multi-series stadium 144 may be fabricated to define significantly fewer (e.g., half as many) steps 120 while still accommodating the same number of line contacts 118. The steps 120, themselves, may therefore be relatively larger in horizontal area (e.g., relatively longer in the Y-axis direction), and a relatively larger step 120 area may be less challenging to fabricate accurately and precisely.

For example, the steps 120 may each span the length (e.g., Y-axis direction) between the bridges 142 of the block 116 (FIG. 3), and each step 120 may be associated with multiple line contacts 118: at least one (e.g., a single one) to-step contact 122 that extends to and physically contacts such step 120 and at least one (e.g., a single one) through-step contact 126 that extends through such step 120 and physically contacts a next-lower conductive structure 106 of a covered tier 128.

Though FIG. 4 illustrates one to-step contact 122 and one through-step contact 126 associated with each step 120 and a riser height 134 of two tiers 108, the disclosure is not so limited and the riser height 134 and the number of through-step contacts 126 associated with a single step 120 may be otherwise configured. For example, the riser height 134 may be selected to be three tiers 108 (and the half-stadium offset 154 may be selected to be three tiers 108 times (×) the number of steps 120 per the lower of the descending staircase 136 and the ascending staircase 138), and each step 120 may be associated with one to-step contact 122 and two through-step contacts 126. One of the through-step contacts 126 may extend through the step 120 and terminate at the conductive structure 106 of the vertically neighboring covered tier 128. The other of the through-step contacts 126 may extend through both the step 120 and the vertically adjacent covered tier 128 and terminate at a second vertically adjacent covered tier 128 (e.g., the next-lowest tier 108 of the stack 102).

Figure 5:
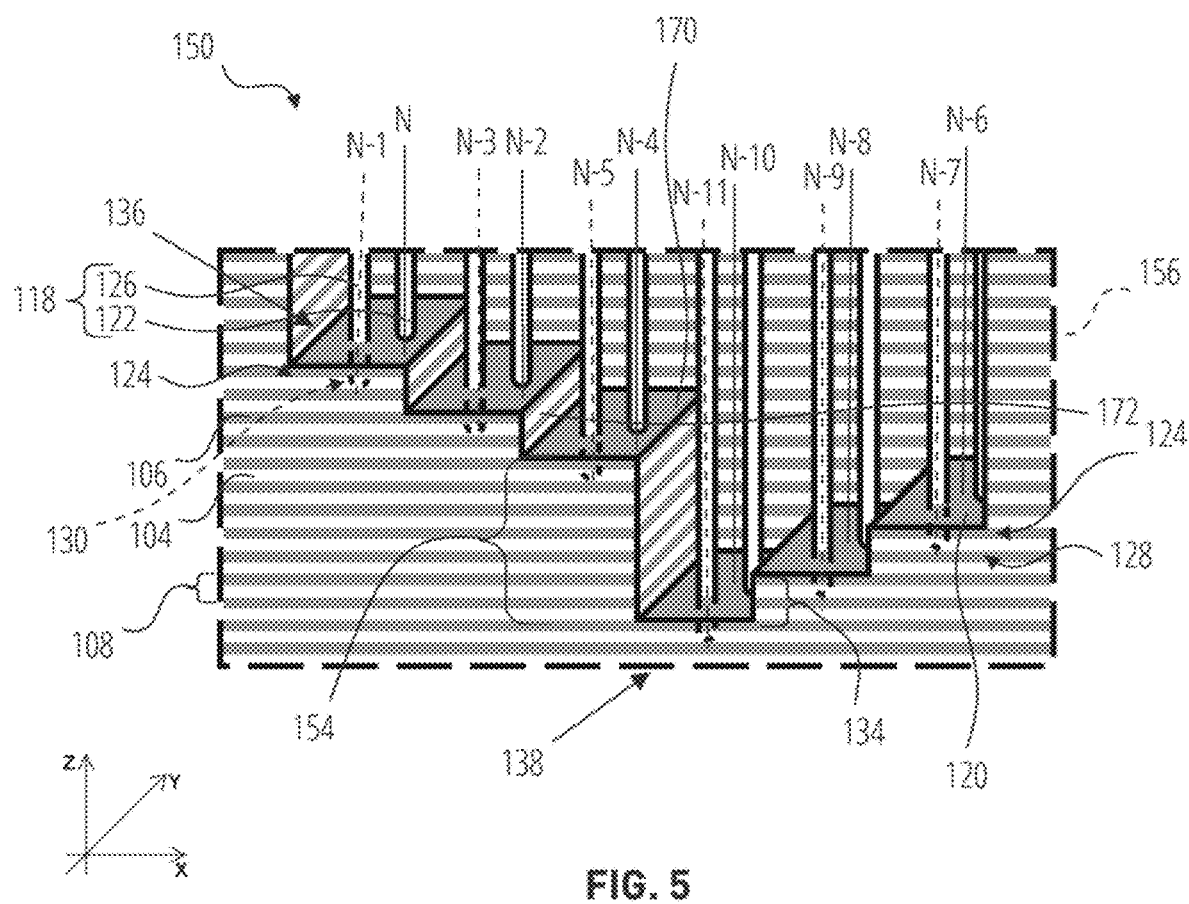
FIG. 5 is an enlarged view of the area of box 156 of FIG. 1, illustrating a single-series stadium that includes both to-step contacts and through-step contacts, according to embodiments of the disclosure.

FIG. 5 is an enlarged view, corresponding to boxes 156 of FIG. 1, showing the staircase profile of, and the associated line contacts 118 of, one of the single-series stadiums 150 of the microelectronic device structure 100 of FIG. 1. This staircase profile and line contacts 118 configuration may be implemented for at least one (e.g., some, half, all) of the stadiums 132 of the series of stadiums 132 of the block 116 (FIG. 1).

The single-series stadium 150 may include a single descending staircase 136 and a single ascending staircase 138 (collectively a single "set" of staircases) that together provide a series of steps 120 with each step 120 occupying a unique tier 108 elevation. The staircases (e.g., the descending staircase 136 and the ascending staircase 138) may be designed and formed substantially similarly to those of the multi-series stadium 144, such as with the steps 120 defined at—and to-step contacts 122 extending to—"even elevations" (e.g., elevations N, N-2, and N-4 (in the descending staircase 136) and N-10, N-8, and N-6 (in the ascending staircase 138)), and such as with covered tiers 128 at—and through-step contacts 126 extending to—"odd elevations" (e.g., N-1, N-3, and N-5 (in the descending staircase 136) and N-11, N-9, and N-7 (in the ascending staircase 138)). However, some or all of the steps 120 of the single-series stadium 150 may be configured to accommodate laterally adjacent line contacts 118 per step 120.

Therefore, the line contacts 118 to the single-series stadium 150 may be substantially aligned in a single series (e.g., a single row) in the X-axis direction, as most clearly illustrated in FIG. 3. However, in other embodiments, one or more of the line contacts 118 may be longitudinally shifted either rearwards or forwards (e.g., closer to one of the bridges 142 (FIG. 3)) while still providing a single series of line contacts 118.

With a single series of line contacts 118, the single-series stadium 150 may be configured to accommodate relatively fewer line contacts 118 than accommodated in the multi-series stadium 144. Therefore, fewer steps 120 may be included in the single-series stadium 150 than in the multi-series stadium 144, and each step 120 of the single-series stadium 150 may be configured to be relatively larger in area than the steps 120 of the multi-series stadium 144. For example, each step 120 in the single-series stadium 150 may be substantially the same length (e.g., Y-axis direction) as the steps 120 in the multi-series stadium 144, such as the length between bridges 142 (FIG. 3), but the steps 120 may be wider (e.g., X-axis direction) than the steps 120 in the multi-series stadium 144. Each step 120 of the single-series stadium 150 may be associated with at least one to-step contact 122 that extends to and physically contacts the step 120 and with at least one through-step contact 126 that extends through the step 120 and physically contacts a next-lowest conductive structure 106 of a covered tier 128.

Because the steps 120 of the single-series stadium 150 may be relatively of greater horizontal area than the steps 120 of the multi-series stadium 144, the steps 120 and staircases (e.g., the descending staircase 136, the ascending staircase 138) of the single-series stadium 150 may be relatively less challenging to fabricate with accuracy and precision. Accordingly, the single-series stadiums 150 may be conducive for those stadiums 132 (FIG. 1) that are to be formed at the lowest tiers 108 of the stack 102, where stadium openings in which fabrication acts are performed are at the relatively highest aspect ratios (e.g., relatively greatest height-to-width ratio of the openings).

Figure 6:
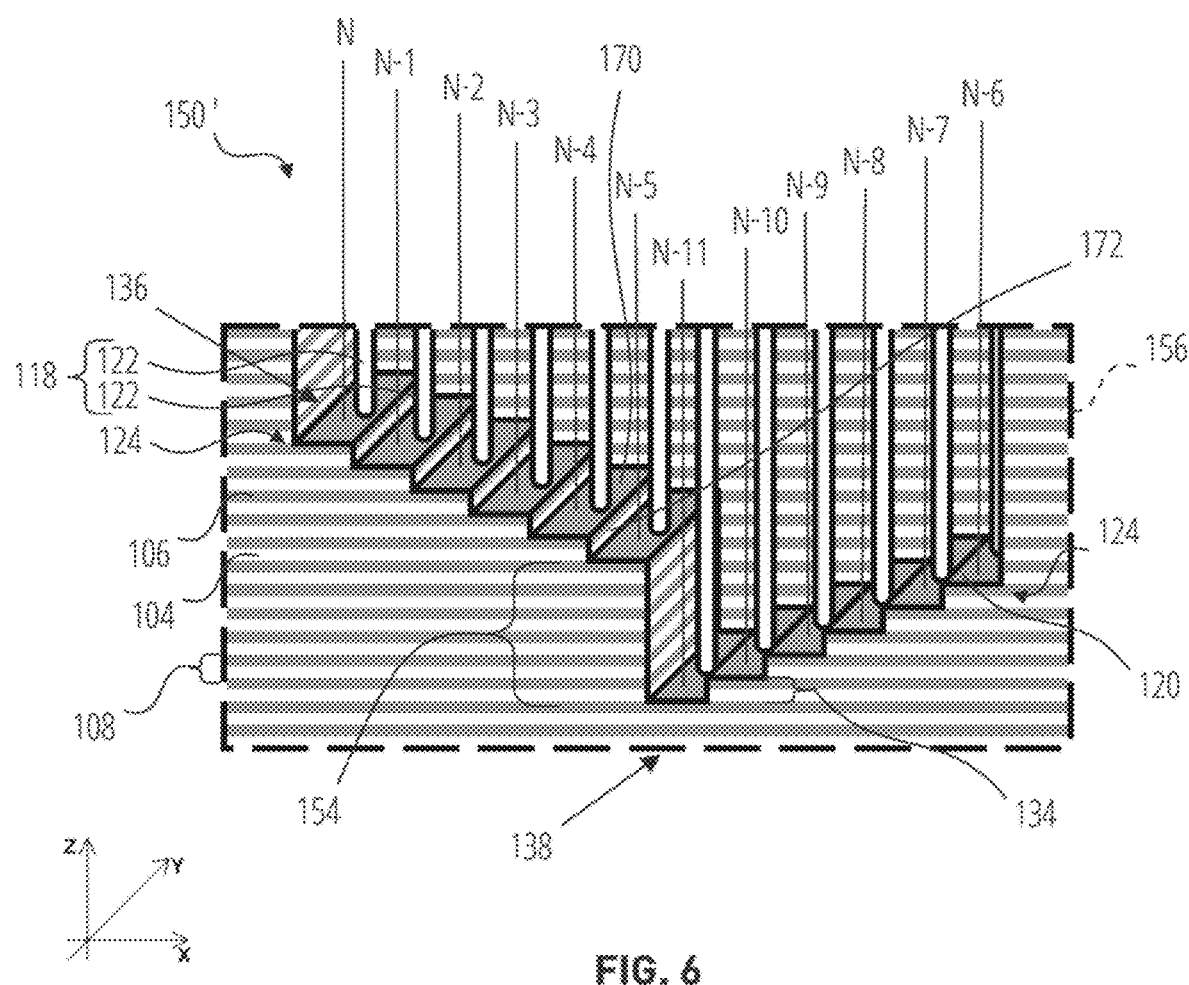
FIG. 6 is an enlarged view of the area of box 156 of FIG. 1, illustrating a single-set stadium that includes all to-step contacts, according to embodiments of the disclosure.

FIG. 6 is an enlarged view, corresponding to boxes 156 of FIG. 1, showing a staircase profile of, and associated line contacts 118 of, a single-series stadium 150' that may be included in the microelectronic device structure 100 of FIG. 1, such as an alternative to, or in addition to, the single-series stadium 150 of FIG. 5. The staircase(s) (e.g., the descending staircase 136 and the ascending staircase 138) of the single-series stadium 150' of FIG. 6 may be configured to accommodate a single to-step contact 122 per step 120, without any through-step contacts 126. To accomplish this, each tier 108 included in the single-series stadium 150' may be a treaded tier 124, the riser height 134 within each staircase (e.g., the descending staircase 136 and the ascending staircase 138) may be one tier 108, and the half-stadium offset 154 may be at least the number of tiers 108 included in the lower of the staircases (e.g., the ascending staircase 138). The treads 170 of the steps 120 may be defined at—and the to-step contacts 122 may extend to and physically land on—elevations N, N-1, N-2, N-3, N-4, and N-5 (in the descending staircase 136) and N-11, N-10, N-9, N-8, N-7, and N-6 (in the ascending staircase 138).

Accordingly, while at least some stadiums 132 (FIG. 1) of the block 116 may include through-step contacts 126 (e.g., configured as the multi-series stadium 144 of FIG. 4 and/or the single-series stadium 150 of FIG. 5), one or more other stadiums 132 may be configured for only to-step contacts 122 (e.g., configured as the single-series stadium 150' of FIG. 6).

Though FIG. 4 illustrates five steps 120 per staircase, FIG. 5 illustrates three steps 120 per staircase, and FIG. 6 illustrates six steps 120 per staircase, the disclosure is not so limited. Any other number (e.g., quantity) of steps 120 may be included in any individual staircase. For example, an individual staircase may include six, seven, eight, or more than eight of the steps. For an individual stadium 132 (FIG. 1) (e.g., multi-series stadium 144 (FIG. 4), single-series stadium 150 (FIG. 5), single-series stadium 150' (FIG. 6)), the number of steps 120 in the descending staircase 136 thereof may or may not be the same as the number of steps 120 in the ascending staircase 138 thereof. In other embodiments, the series of steps 120 of any individual stadium 132 (FIG. 1) (e.g., multi-series stadium 144 (FIG. 4), single-series stadium 150 (FIG. 5), single-series stadium 150' (FIG. 6)) may be provided by a single descending staircase 136 or single ascending staircase 138, rather than each staircase set including at least one descending staircase 136 and at least one ascending staircase 138. In such embodiments, the half-stadium offset 154 may be omitted.

With returned reference to FIG. 1, in some embodiments, the relatively deeper stadiums 132 of the block 116 may be configured as the single-series stadium 150 of FIG. 5 and/or the single-series stadium 150' of FIG. 6. That is, the relatively shallower stadiums 132 of the block 116 may be configured as the multi-series stadium 144 of FIG. 4. It may be relatively more challenging to accurately form and extend, to relatively deeper levels of the stack 102, the staircases of the multi-series stadiums 144 than to accurately form and extend, to the relatively deeper levels of the stack 102, the staircases of the single-series stadiums 150 (FIG. 5). Accordingly, in some embodiments, such as illustrated in FIG. 1, the multi-series stadium 144 architecture is used for relatively shallower (e.g., relatively elevationally higher) stadiums 132 (e.g., those illustrated in first stadium area 158 and second stadium area 160 of FIG. 1) of the block 116, while the single-series stadium 150 (or the single-series stadium 150' of FIG. 6) architecture may be used for relatively deeper (e.g., relatively elevationally lower) stadiums 132 (e.g., those illustrated in third stadium area 162 and fourth stadium area 164 of FIG. 1) of the block 116. In some embodiments, the stadiums 132 in the upper about two-thirds of the stack 102 are multi-series stadiums 144, and the stadiums 132 in the lower about one-third of the stack 102 are single-series stadiums 150 (FIG. 5) or single-series stadiums 150' (FIG. 6).

Though FIG. 1 illustrates the second stadium area 160 as being to the right of the first stadium area 158, the third stadium area 162 as being to the right of the second stadium area 160, and the fourth stadium area 164 as being to the right of the third stadium area 162, the disclosure is not so limited.

There may be one or more additional stadiums 132 disposed between the illustrated stadium areas (between the first stadium area 158 and the second stadium area 160, between the second stadium area 160 and the third stadium area 162, between the third stadium area 162 and the fourth stadium area 164), such as in non-illustrated portions generally represented by intermediate regions 166. Additionally or alternatively, one or more additional stadiums 132 may be disposed laterally adjacent to the first stadium area 158 and/or the fourth stadium area 164. Any such additional stadiums 132, whether interspersed with the stadiums 132 illustrated in FIG. 1 or adjacent to the stadiums 132 illustrated in FIG. 1, may be structured as the multi-series stadium 144 (FIG. 4), the single-series stadium 150 (FIG. 5), the single-series stadium 150' (FIG. 6), or as differently-structured stadiums and either with or without through-step contacts 126. Any such additional stadiums 132 may also be within the elevations of the stack 102 as illustrated in FIG. 1 or within other elevations of the stack 102 not illustrated in FIG. 1, such as in higher-still elevations of the stack 102 formed over the illustrated tiers 108, or such as in lower-still elevations of the stack 102 formed between the illustrated tiers 108 and the base structure 112.

In some embodiments, the lateral order (e.g., lateral arrangement) of the first stadium area 158, the second stadium area 160, the third stadium area 162, and the fourth stadium area 164 is other than as illustrated. For example, relatively deeper stadiums 132 (third stadium area 162 and fourth stadium area 164) may be to the left side of relatively shallower stadiums 132 (first stadium area 158 and second stadium area 160); and/or one or more relatively deeper stadiums 132 may be laterally between relatively shallower stadiums 132, and/or vice versa.

Figure 7:
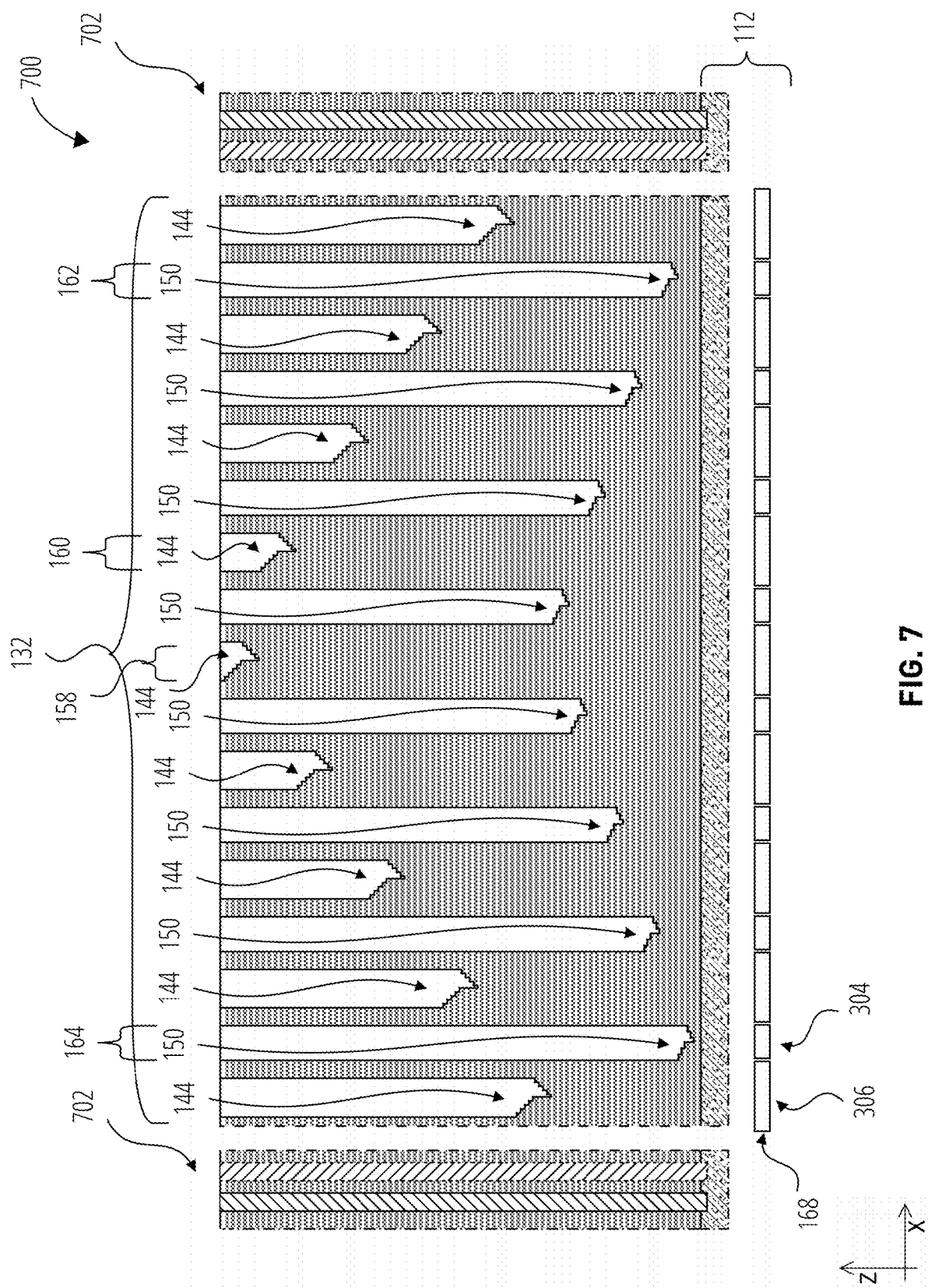
FIG. 7 is a schematic, cross-sectional, elevational front elevational view of a microelectronic device structure that includes a series of stadiums that may include the stadiums illustrated in FIG. 1, including at least one multi-series stadium (e.g., of FIG. 4) and at least one single-series stadium (e.g., of FIG. 5 and/or of FIG. 6), in accordance with embodiments of the disclosure.
Figure 8:
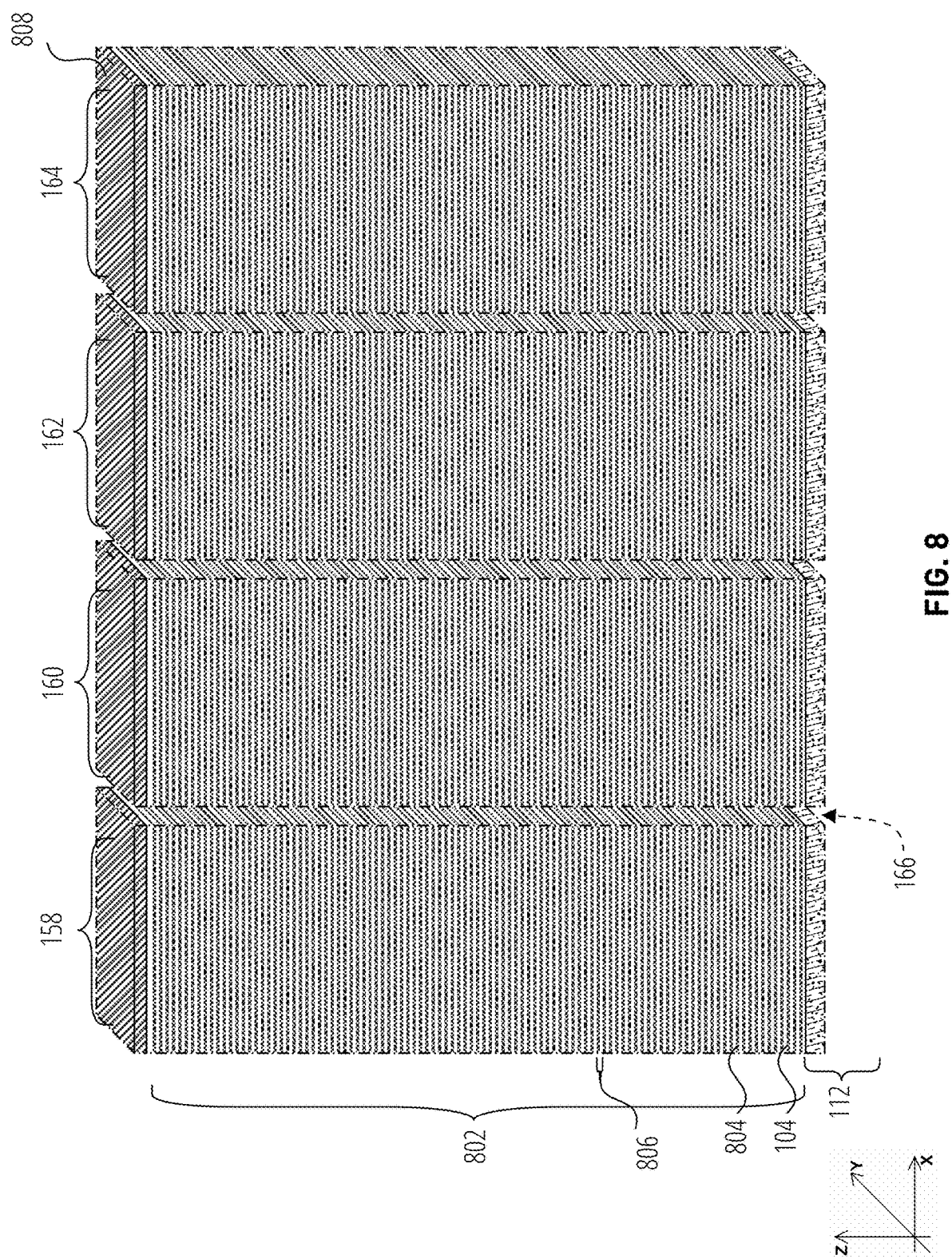
FIG. 8 through FIG. 29 are schematic, cross-sectional, perspective views of various stages of processing to fabricate the structure of FIG. 28 and/or the structure of FIG. 29, either or both of which structures may be part(s) of a microelectronic device structure in accordance with embodiments of the disclosure, such as any of the aforementioned microelectronic device structures of FIG. 1 and FIG. 3.

In some embodiments, such as that illustrated in FIG. 7, a microelectronic device structure 700—which may include the stadiums 132 of the microelectronic device structure 100 of FIG. 1—may be fabricated and structured so that the deeper stadiums 132 of the single-series stadium 150 (FIG. 5) or of the single-series stadium 150' (FIG. 6) architecture alternate, across the width of the block 116 (FIG. 1), with the shallower stadiums 132 of the multi-series stadium 144 (FIG. 4) architecture. Accordingly, the stadiums 132 may be substantially symmetrically distributed across the width of the series of stadiums 132 (e.g., across the width of the block 116 (FIG. 1)) and between array portions 702 disposed to the lateral sides of the stadiums 132 series. The array portions 702 may include the aforementioned array(s) of pillars (e.g., including channel material and memory material) that extend through the stack 102 and effectuate the formation of strings of memory cells. In some embodiments, non-functional (e.g., so-called "dummy") pillars are also included in the array portions 702. For example, dummy pillars may be horizontally between the functional pillars (e.g., forming the strings of memory cells) and the stadiums 132.

The microelectronic device structure 100 may also include string drivers 168 (e.g., access line drivers, word line drivers) configured to selectively supply access signals, such as programming signals (e.g., programming voltages) to the conductive structures 106 (e.g., to access lines, also known as "word lines") at particular levels of the stack 102 so as to access (e.g., program) the memory cell(s) (e.g., in the array portions 702 (FIG. 7)) that are operatively associated with respective conductive structures 106. There may be one string driver 168 coupled to one respective conductive structure 106 (e.g., access line), such that the microelectronic device structure 100 may include one string driver 168 for each respective conductive structure 106 to which a line contact 118 (FIG. 1) extends.

The string drivers 168 operatively associated with the conductive structures 106 of a particular block 116 (FIG. 1) may be disposed below the stack 102 (FIG. 1) of the block 116, such as in or under the base structure 112, as schematically illustrated in FIG. 7 (and FIG. 1). In other embodiments, one or more of the string drivers 168 are disposed above the stack 102 (FIG. 1) of the block 116 (FIG. 1), and/or within other areas of the microelectronic device structure 100 (FIG. 1).

Because the multi-series stadiums 144 accommodate relatively more line contacts 118 than the single-series stadiums 150 (or the single-series stadium 150' (FIG. 6)), there may be relatively more string drivers 168 operatively associated with individual multi-series stadiums 144 than with individual single-series stadiums 150.

In embodiments in which the stadiums 132 are arranged to laterally intersperse the multi-series stadiums 144 with the single-series stadiums 150 (or single-series stadium 150' (FIG. 6)), string drivers 168 may be efficiently positioned so that string drivers 304 operatively associated with the single-series stadiums 150 (or the single-series stadiums 150' (FIG. 6)) are interspersed with string drivers 306 operatively associated with the multi-series stadiums 144.

With returned reference to FIG. 3, a series of string drivers 168 is illustrated with electrical connections to corresponding line contacts 118 leading to the stadiums 132. The string drivers 168 of FIG. 3 are illustrated as outside of horizontal areas of the blocks 116 for ease of illustration only. The string drivers 168 may be disposed at least partially within horizontal areas of the blocks 116, and they may be positioned vertically underneath the blocks 116, vertically above the blocks 116, or some combination thereof. The string drivers 168 (e.g., the string drivers 306 for the multi-series stadiums 144; the string drivers 304 for the single-series stadiums 150 (or single-series stadium 150' (FIG. 6))) may be arranged in one or more series (e.g., rows).

Accordingly disclosed is a microelectronic device comprising a tiered stack. The tiered stack comprises a vertically alternating sequence of insulative structures and conductive structures arranged in tiers. A stadium within the tiered stack comprises a staircase comprising steps at ends of some of the tiers. The steps each comprise a tread provided by an upper surface portion of one of the conductive structures of the some of the tiers. Conductive contact structures extend to one of the steps and comprise a first conductive contact structure and a second conductive contact structure. The first conductive contact structure terminates at the tread of the one of the steps. The second conductive contact structure extends through the tread of the one of the steps.

Also disclosed is a microelectronic device comprising a stack structure comprising a vertically alternating sequence of insulative structures and conductive structures arranged in tiers. A series of stadiums is within the stack structure. Each of at least some of the stadiums comprises at least one staircase defined in a group of the tiers. The group of the tiers comprises treaded tiers and covered tiers. The conductive structures of the treaded tiers provide treads of steps of the at least one staircase. The conductive structures of the covered tiers are each directly vertically below one of the treaded tiers. At least one conductive contact structure extends to one of the conductive structures providing one of the treads. At least one other conductive contact structure extends through one of the treaded tiers to one of the conductive structures of the covered tiers.

Figure 2:
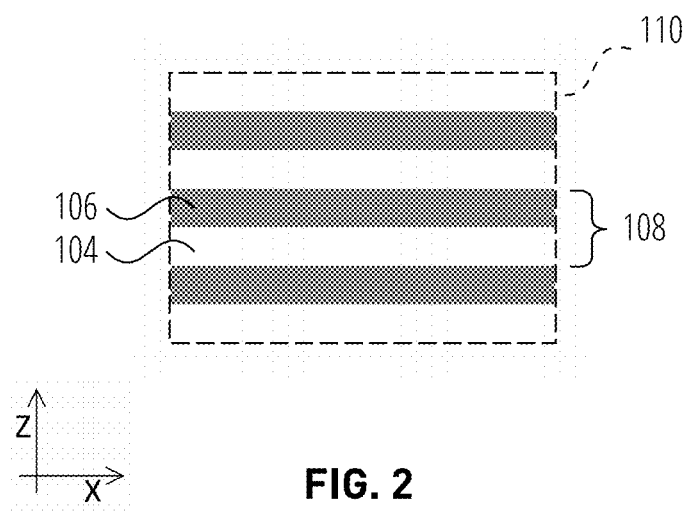
FIG. 2 is an enlarged view of the area of box 110 of FIG. 1.

With reference to FIG. 8 through FIG. 29, illustrated are various stages of forming a microelectronic device, such as one including the microelectronic device structure 100 of FIG. 1 and FIG. 3 and/or the microelectronic device structure 700 of FIG. 7, any of which may include the structures of FIG. 2, FIG. 4, FIG. 5, and/or FIG. 6.

A stack 802 (otherwise referred to herein as a "stack structure" or "tiered stack") is formed on the base structure 112, including in areas (e.g., the first stadium area 158, the second stadium area 160, the third stadium area 162, and the fourth stadium area 164 previously described with reference to FIG. 1) in which the stadiums 132 (FIG. 1) will be formed.

In some embodiments, the stack 802 is formed to include a vertically alternating sequence of the insulative structures 104 and sacrificial structures 804 arranged in tiers 806. The sacrificial structures 804 may eventually be replaced with, or otherwise converted into, the conductive structures 106 (e.g., FIG. 1). In other embodiments, the stack 802 may be formed to include the conductive structures 106 instead of the sacrificial structures 804, even without replacement or conversion, such that the stack 802 may have substantially the materials of the stack 102 of FIG. 1. Accordingly, the stack 802 is formed to include the insulative structures 104 and "other structures," which other structures may be either the sacrificial structures 804, in embodiments including subsequent replacement or conversion to the conductive structures 106, or the conductive structures 106, in embodiments not including subsequent replacement or conversion.

To form the stack 802, formation (e.g., deposition) of the insulative structures 104 may be alternated with formation (e.g., deposition) of the other structures (e.g., the sacrificial structures 804). In some embodiments, the stack 802 is formed, at this stage, to include as many tiers 806 with the sacrificial structures 804 as there will be tiers 108 (FIG. 1) with conductive structures 106 (FIG. 1) in the final microelectronic device structure (e.g., the microelectronic device structure 100 of FIG. 1 and/or the microelectronic device structure 700 of FIG. 7).

One or more masks 808 (e.g., hardmasks) may also be included on (e.g., above) the stack 802 and utilized in subsequent material-removal (e.g., etching, patterning) processes.

Figure 9:
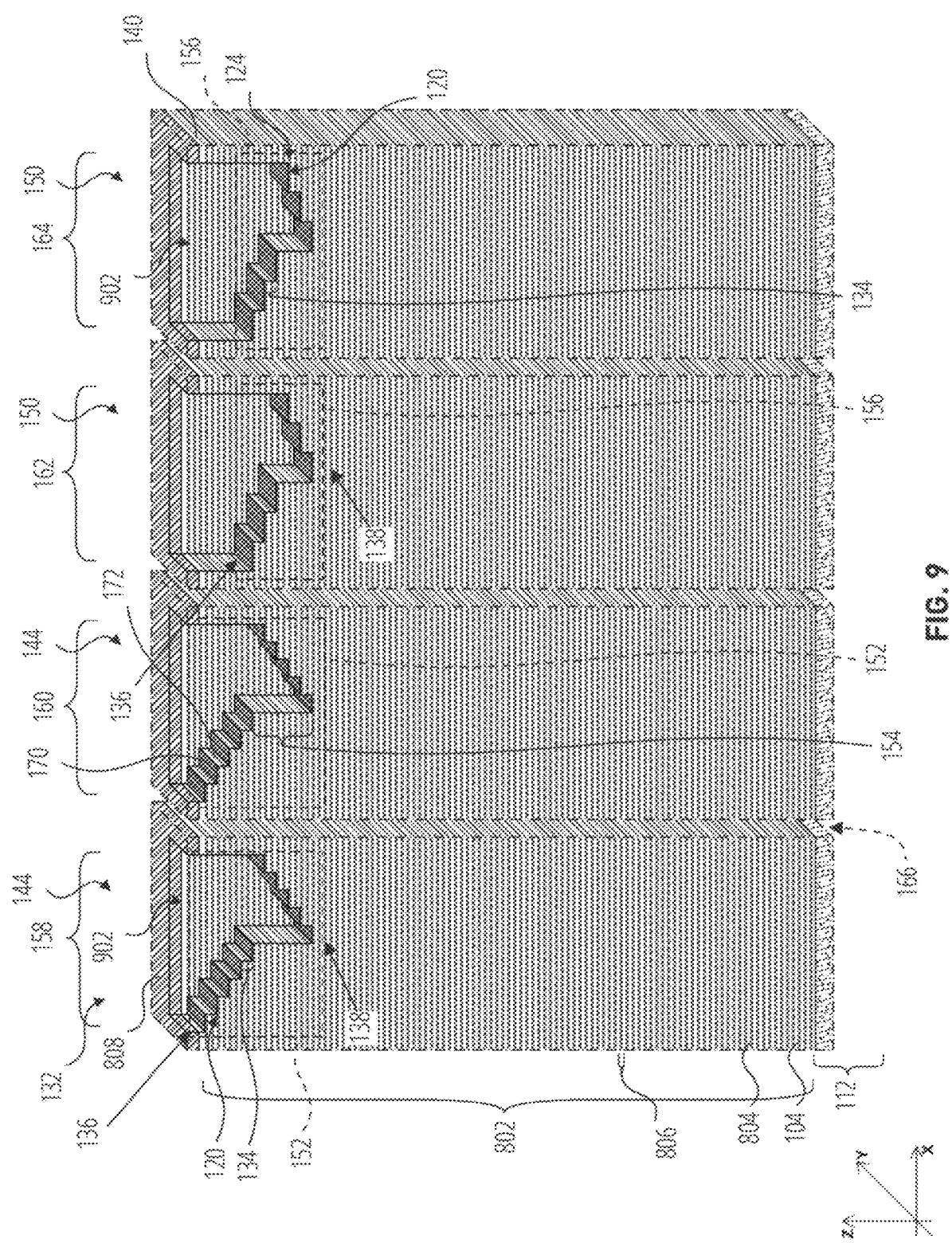

With reference to FIG. 9, the stack 802 (and the mask 808) may be patterned—in a series of material-removal (etching) and mask 808 trimming stages—to form, in substantially the same uppermost group of tier 108 elevations, the staircase profiles of each of the stadiums 132 (e.g., the staircase profile of the multi-series stadiums 144 and the single-series stadiums 150 (and/or single-series stadiums 150' (FIG. 6))) in the respective footprint (e.g., horizontal) areas (e.g., the first stadium area 158, the second stadium area 160, the third stadium area 162, the fourth stadium area 164). Areas of the stack 802 for the crests 140 and the bridges 142 (FIG. 1) may not be etched so that these portions of the stack 802 retain the full, initial height of the stack 802.

For example, the descending staircase 136 and the ascending staircase 138 of each set of staircases may be initially formed as two opposing, mirrored staircases, such as by a sequence of material-removal (e.g., etching) acts by which the mask 808 is patterned to define, for each such pair of staircases, an opening of a first width (e.g., a width of about two steps 120) that is then patterned into the stack 102 the depth of the riser height 134 (e.g., two tiers 806 deep). Then, the mask 808 may be trimmed to expand the opening to a second width (e.g., a width of about four steps 120) that is then patterned into the stack 102 the depth of the riser height 134 (e.g., two tiers 806 deep), further lowering the first opening to two times the riser height 134 deep. Then, the mask 808 may be trimmed to expand the opening to a third width (e.g., a width of about sixth steps 120), which third-width opening is then patterned the riser height 134, further lowering the first opening to a depth of three times the riser height 134 and further lowering the second opening to a depth of two times the riser height 134. This may be repeated until completing the profiles of the initial descending staircase 136 and ascending staircase 138 that are opposing and mirrored. Then, a lateral half of each stadium 132 may be covered (e.g., filled with sacrificial material(s) and/or re-masked) and one of the two staircases may be patterned into the stack 102 the depth of the half-stadium offset 154 to vertically offset the lower of the two staircases (e.g., to lower the ascending staircase 138) from the other (e.g., the descending staircase 136). The half-stadium offset 154 may complete the formation of the profiles of the stadiums 132 (e.g., the multi-series stadiums 144, the single-series stadiums 150 (and/or the single-series stadiums 150' (FIG. 6))) through substantially the same uppermost elevations of the stack 102 and with the staircases (e.g., the descending staircases 136, the ascending staircases 138) at the base of initial stadium openings 902.

As used herein, the term "stadium opening" (e.g., as in the initial stadium openings 902) means and includes an opening that has, along the width (X-axis dimension) of its base, the profiles of the set of staircases (the descending staircase 136 and the ascending staircase 138). Accordingly, the initial stadium openings 902 expose surfaces (e.g., step 120 treads 170) of the sacrificial structures 804 at different tier 806 elevations throughout the height of the staircases.

At this stage, the shallowest (e.g., vertically highest) of the multi-series stadiums 144 may already be at its final depth in the stack 802 and so the depth extension to form the half-stadium offset 154 may complete the formation of that multi-series stadium 144, e.g., in the first stadium area 158. Contrarily, the others of the multi-series stadiums 144 may not yet be at their final depths in the stack 802. Also, at this stage, the staircase profiles for the single-series stadiums 150 (and/or single-series stadiums 150' (FIG. 6)) may not yet be at their final depths, such as in embodiments in which the single-series stadiums 150 (or single-series stadiums 150' (FIG. 6)) are reserved for the deepest (e.g., vertically lowest) of the stadiums 132.

Figure 10:
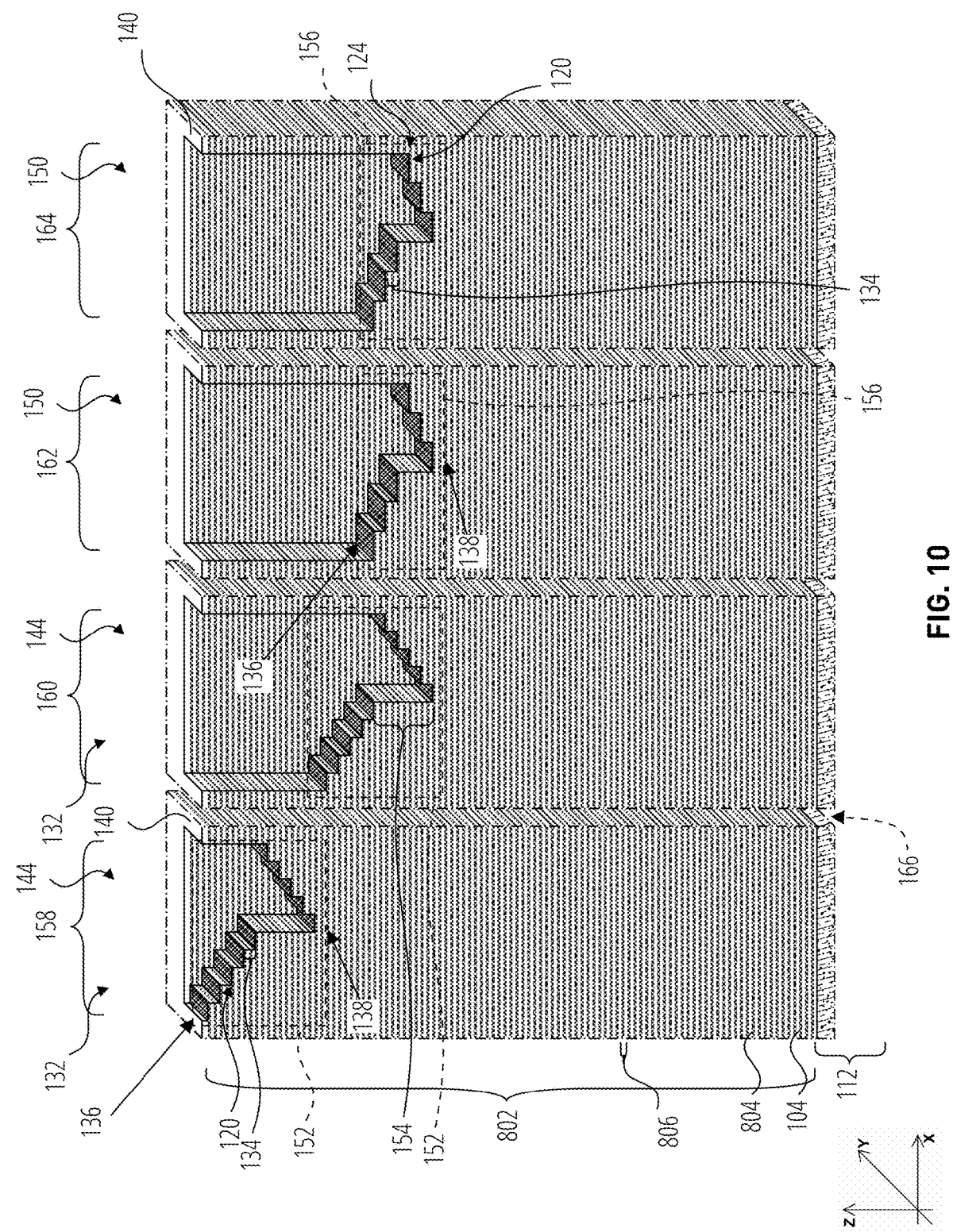

As illustrated in FIG. 10, the staircase profile of the second stadium area 160 may be extended to its final depth, to form the multi-series stadium 144 in the second stadium area 160 of FIG. 1. Concurrently, the staircase profiles in the third stadium area 162 and the fourth stadium area 164 may be extended downward a substantially equal number of tiers. During this stage, the already-completed stadium 132 in the first stadium area 158 may not be exposed (e.g., may be covered by fill material and/or the mask 808 (FIG. 9)). Accordingly, though not illustrated in FIG. 9, the mask 808 from the stage of FIG. 9 may not be completely removed and/or may be at least partially reformed and/or re-patterned prior to the stage illustrated in FIG. 10.

Figure 11:
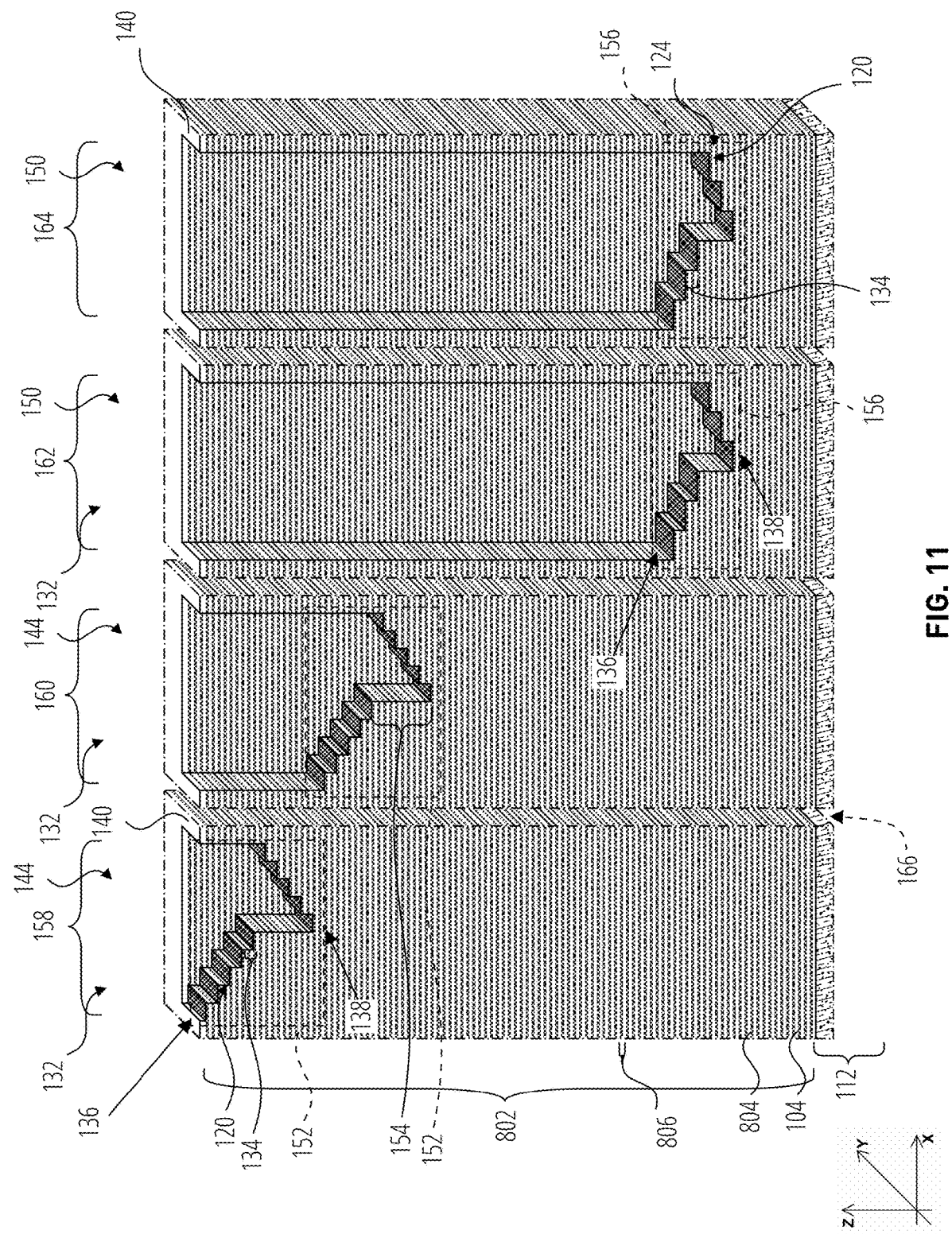

Thereafter, the staircase profile extensions may be continued downward in a sequence of depth-extension stages, for the not-yet-at-final-depth stadiums 132 (in the third stadium area 162 and the fourth stadium area 164) to lower the staircase profiles of the remaining stadiums 132 to their final elevations. For example, the staircases of the single-series stadiums 150 (or single-series stadiums 150' (FIG. 6)) in the third stadium area 162 and the fourth stadium area 164 may be concurrently extended to the final elevation of the single-series stadium 150, as illustrated in FIG. 11 (e.g., while the multi-series stadiums 144 in the first stadium area 158 and the second stadium area 160 are filled and/or otherwise covered).

Figure 12:
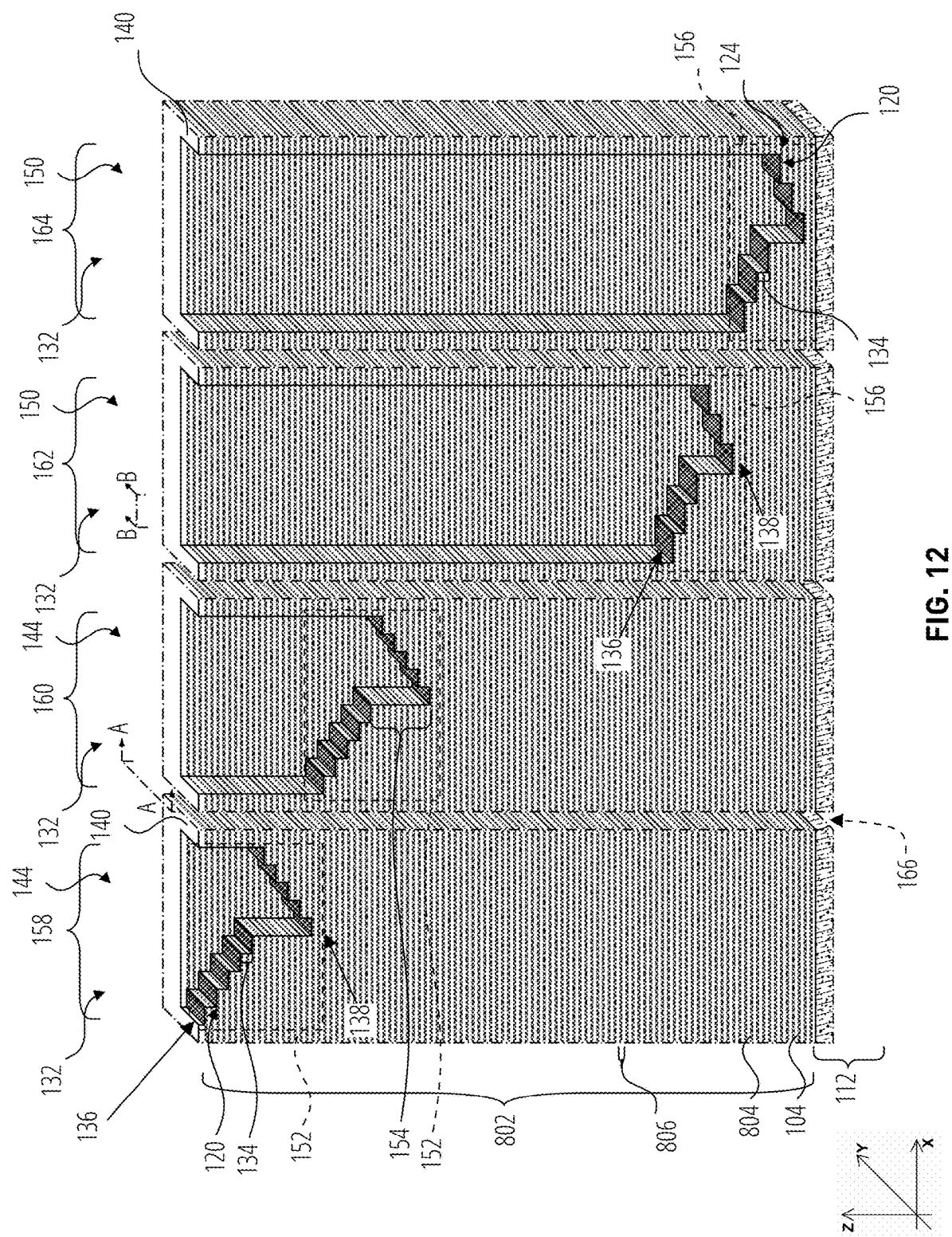

Then, the single-series stadium 150 in the fourth stadium area 164 may be extended to its final elevation, as illustrated in FIG. 12 (e.g., while the other stadiums 132, already at their final depths, are filled and/or otherwise covered).

Figure 13:
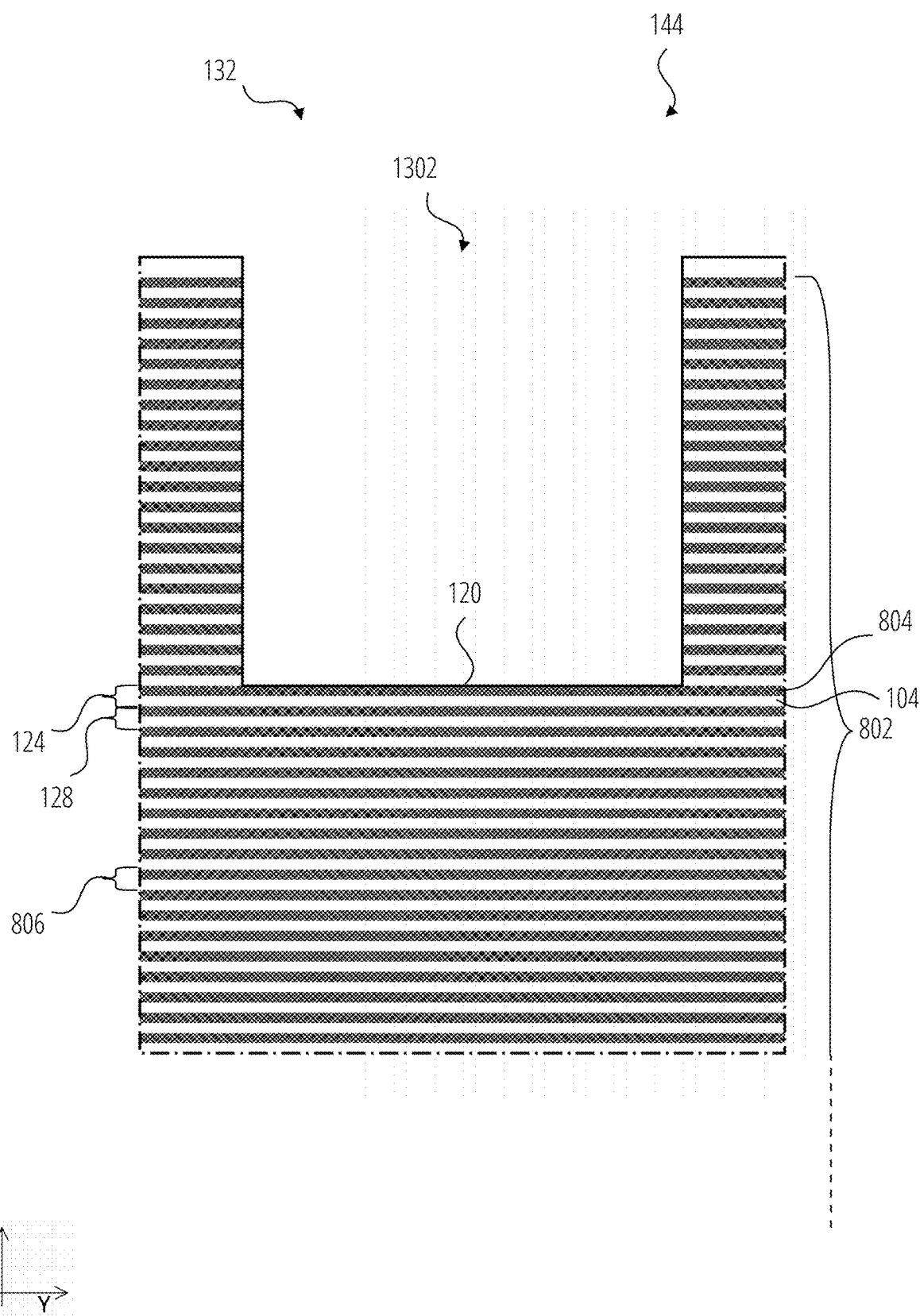

FIG. 13 illustrates a view along section line A-A of FIG. 12 of at least an uppermost portion of the stack 802, showing one of the completed steps 120 at the base of one of the stadium openings 1302 (e.g., an uppermost step of the descending staircase 136 of the multi-series stadium 144 in the second stadium area 160 of FIG. 12). At this stage (e.g., completion of the stage of FIG. 12), each step 120 exposes an upper surface area of one of the sacrificial structures 804, namely, the sacrificial structure 804 that is within the treaded tier 124.

Figure 14:
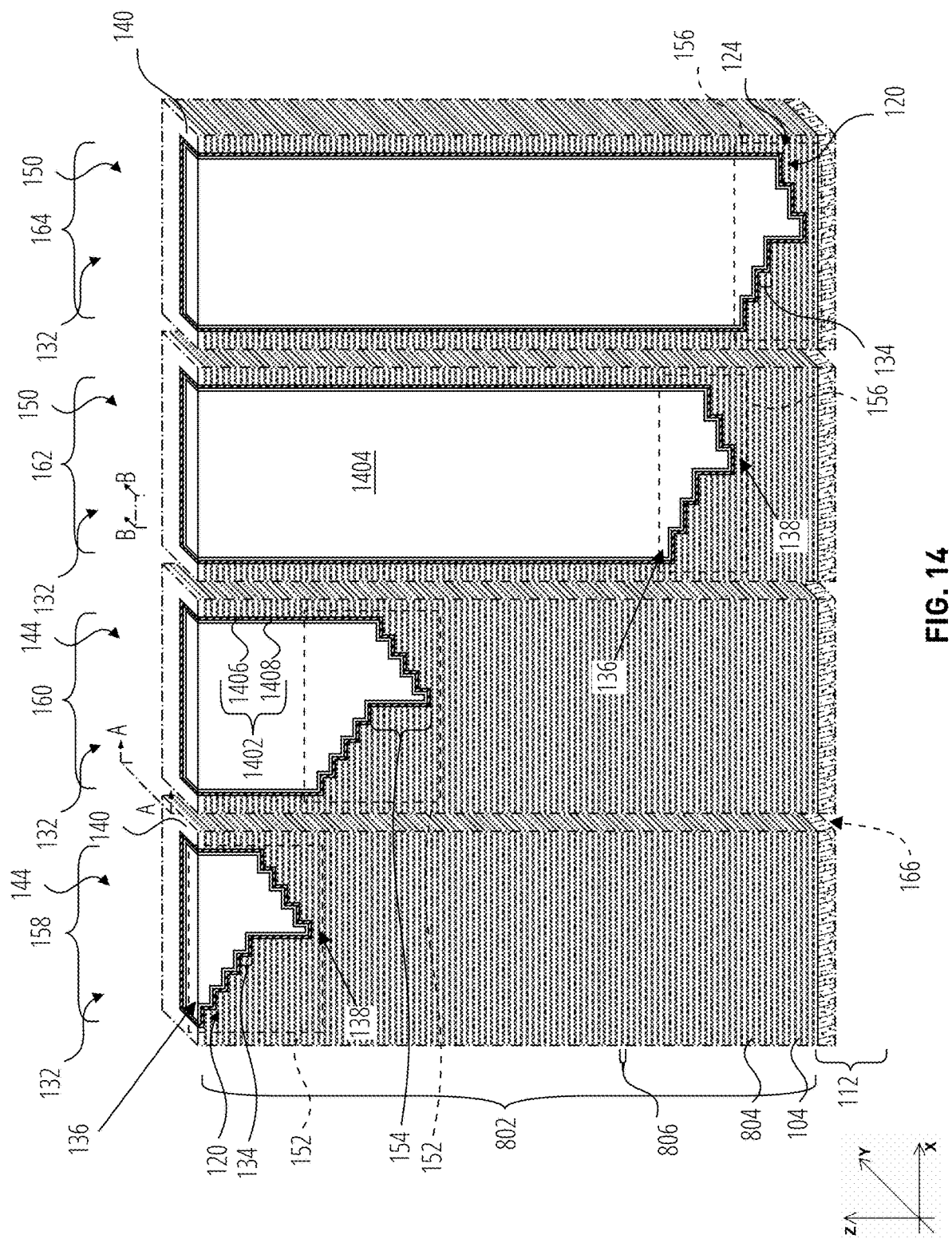

With reference to FIG. 14, at least one dielectric liner(s) 1402 may be formed (e.g., conformally deposited) in the stadium openings 1302 (FIG. 13) to substantially line the surfaces of the tiers 806 exposed in the stadium openings 1302 (FIG. 13). One or more insulative fill material(s) 1404 (e.g., dielectric material(s)) may be formed (e.g., deposited) in the stadium openings 1302 (FIG. 13), on the dielectric liner(s) 1402 to substantially fill the remaining space above each of the completed stadiums 132.

Figure 15:
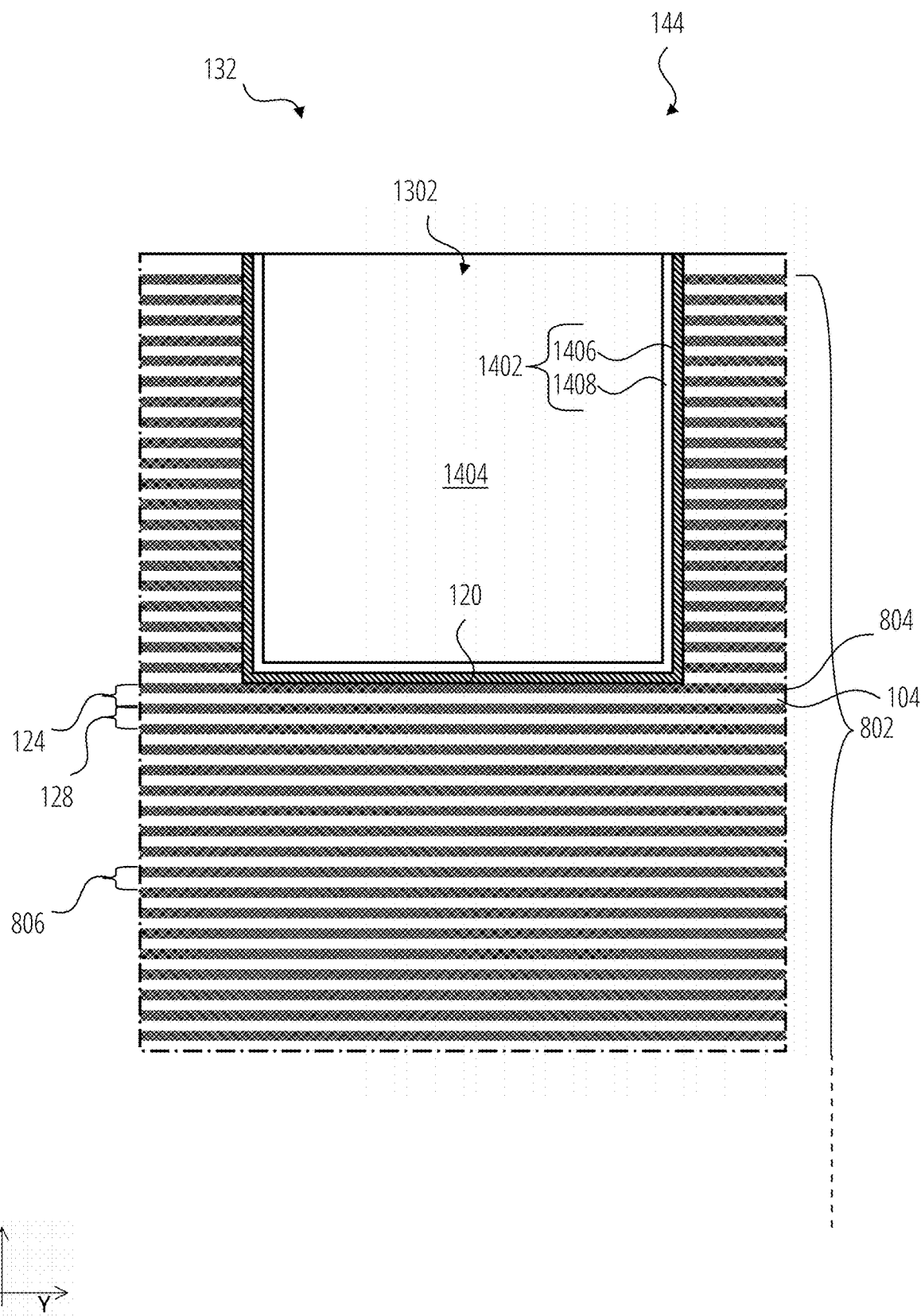

FIG. 15 illustrates a view along section line A-A of FIG. 14 to more clearly show the dielectric liner(s) 1402. In some embodiments, the dielectric liner(s) 1402 may include a dielectric liner 1406 directly on the sidewalls and horizontal surfaces of the tiers 806 (e.g., directly on the staircases and their steps 120 that define the stadium openings 1302) and an additional dielectric liner 1408 directly on the dielectric liner 1406.

The material of the dielectric liner 1406, formed directly on the exposed surfaces of the tiers 806, may be formed of and include an insulative material, such as a dielectric oxide material (e.g., silicon dioxide) that is selectively removable relative to the material of the sacrificial structures 804 of the tiers 806.

The material of the additional dielectric liner 1408 may be formed of and include another insulative material, such as a dielectric nitride material (e.g., silicon nitride) or a silicon material (e.g., polysilicon), relative to which the insulative fill materials 1404 may be selectively removed.

Figure 16:
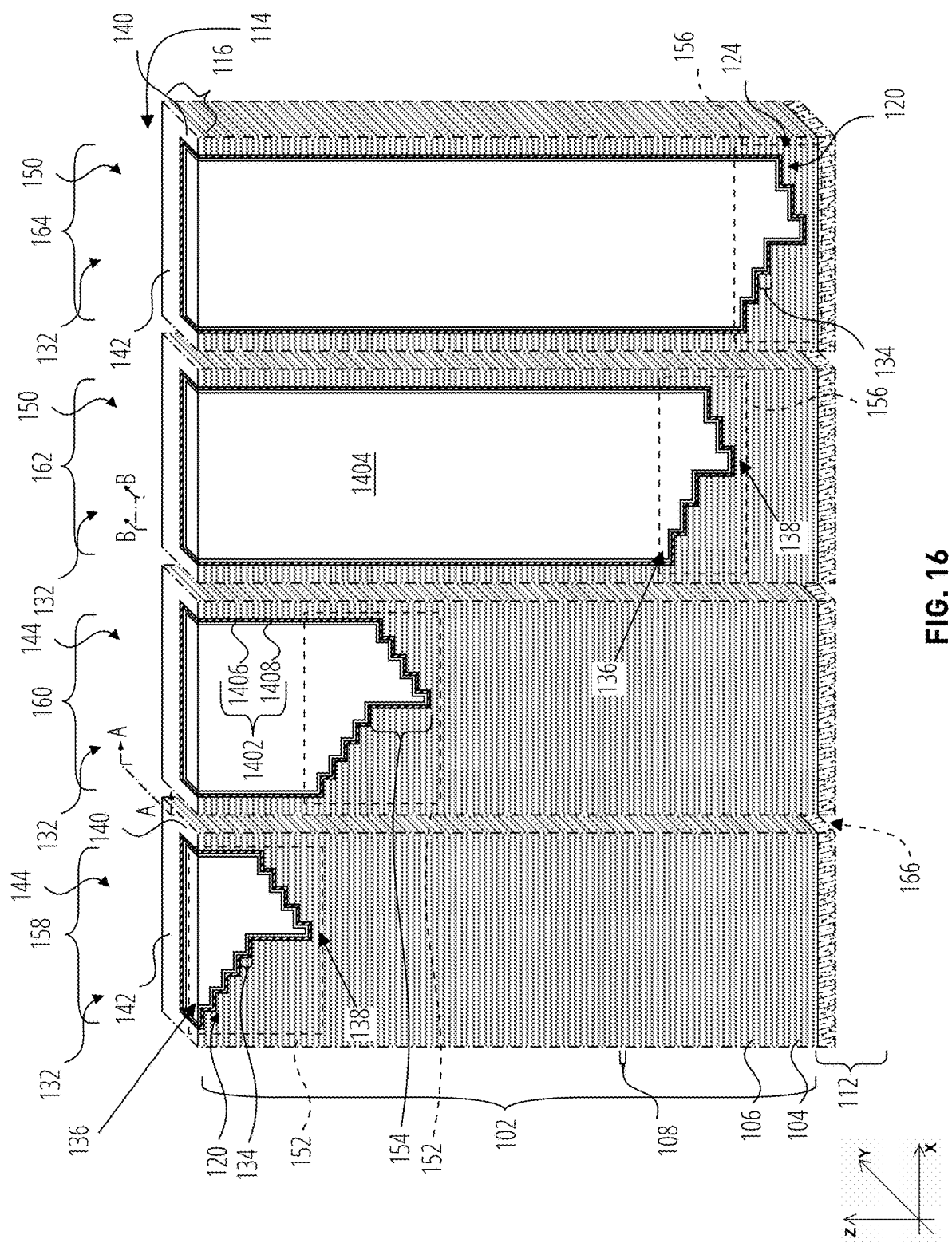
Figure 17:
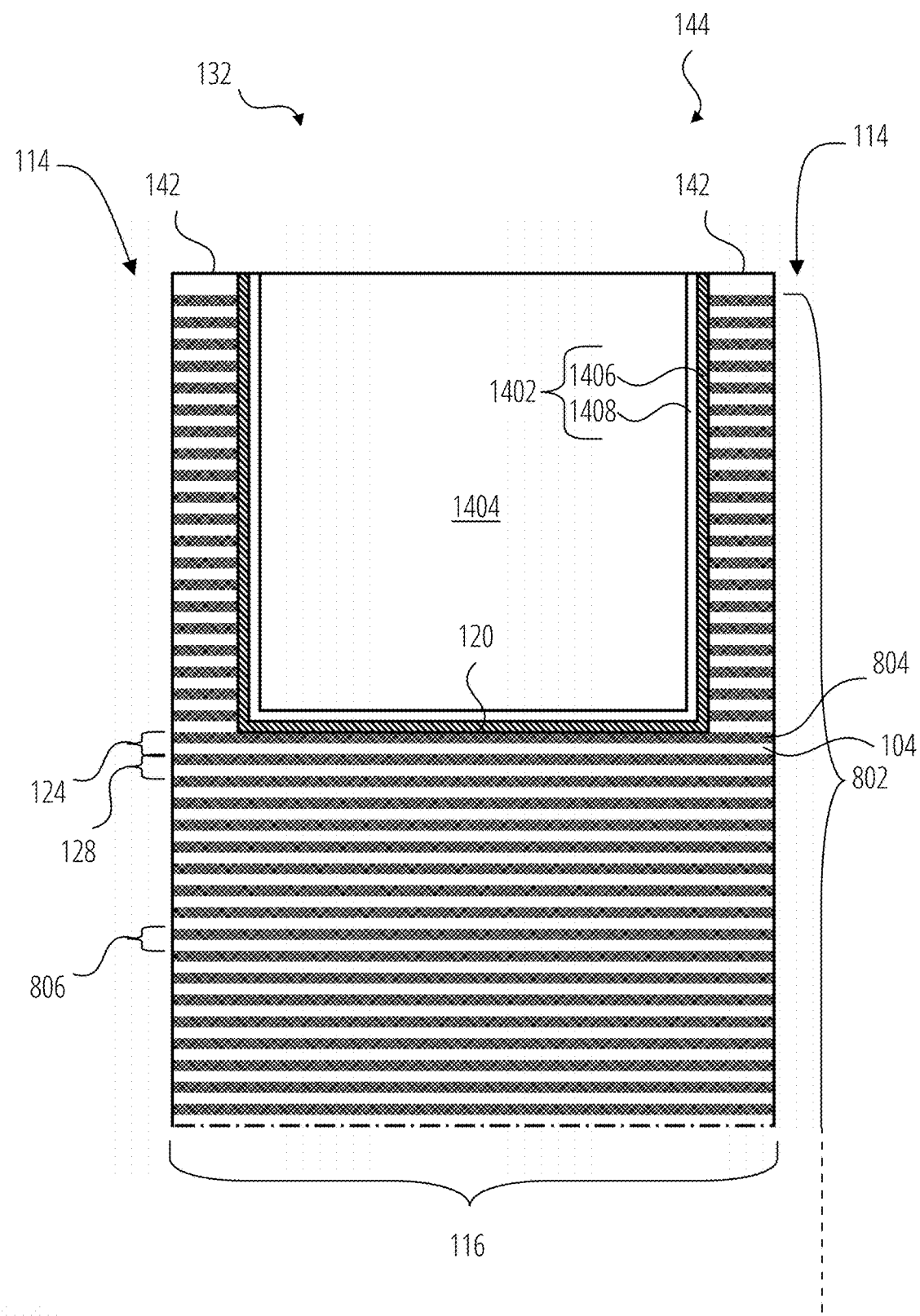
Figure 18:
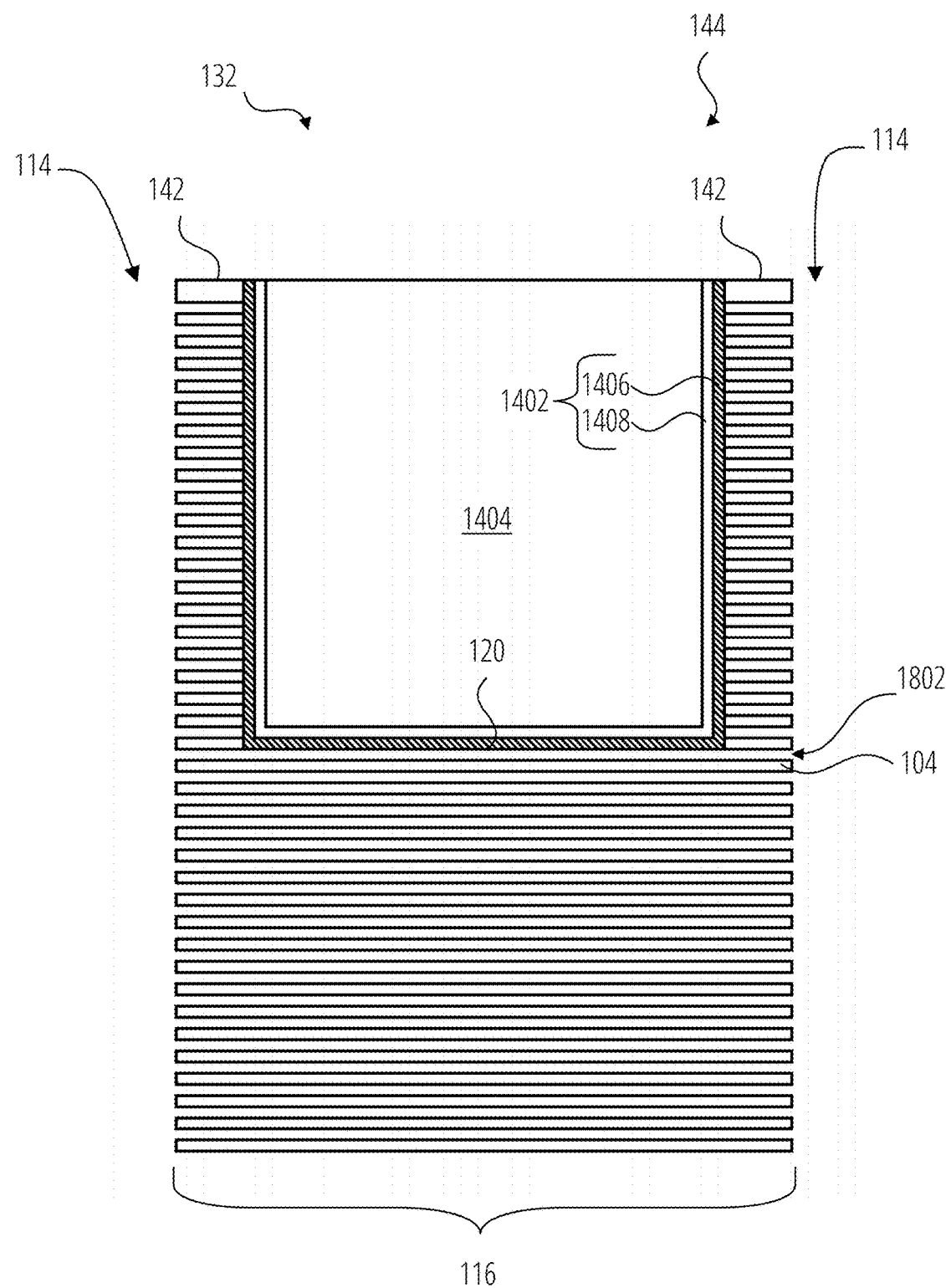

With reference to FIG. 16 and FIG. 17 (which is a view along section line A-A of FIG. 16), the slits 114 may be formed (e.g., etched) through a whole height of the stack 802 (FIG. 14 and FIG. 15) to divide the stack 802 into the blocks 116. Forming the slits 114 also defines the bridges 142 along at least one rear or front side of the stadiums 132.

In embodiments in which the stack 802 (FIG. 12) was formed to include sacrificial structures 804 (FIG. 12) that are not yet configured as the conductive structures 106, the sacrificial structures 804 may be substantially removed (e.g., exhumed)—by way of the slits 114—without substantially removing the insulative structures 104 or the dielectric liner 1406, leaving a void 1802 (FIG. 18) where each sacrificial structure 804 had been.

Figure 19:
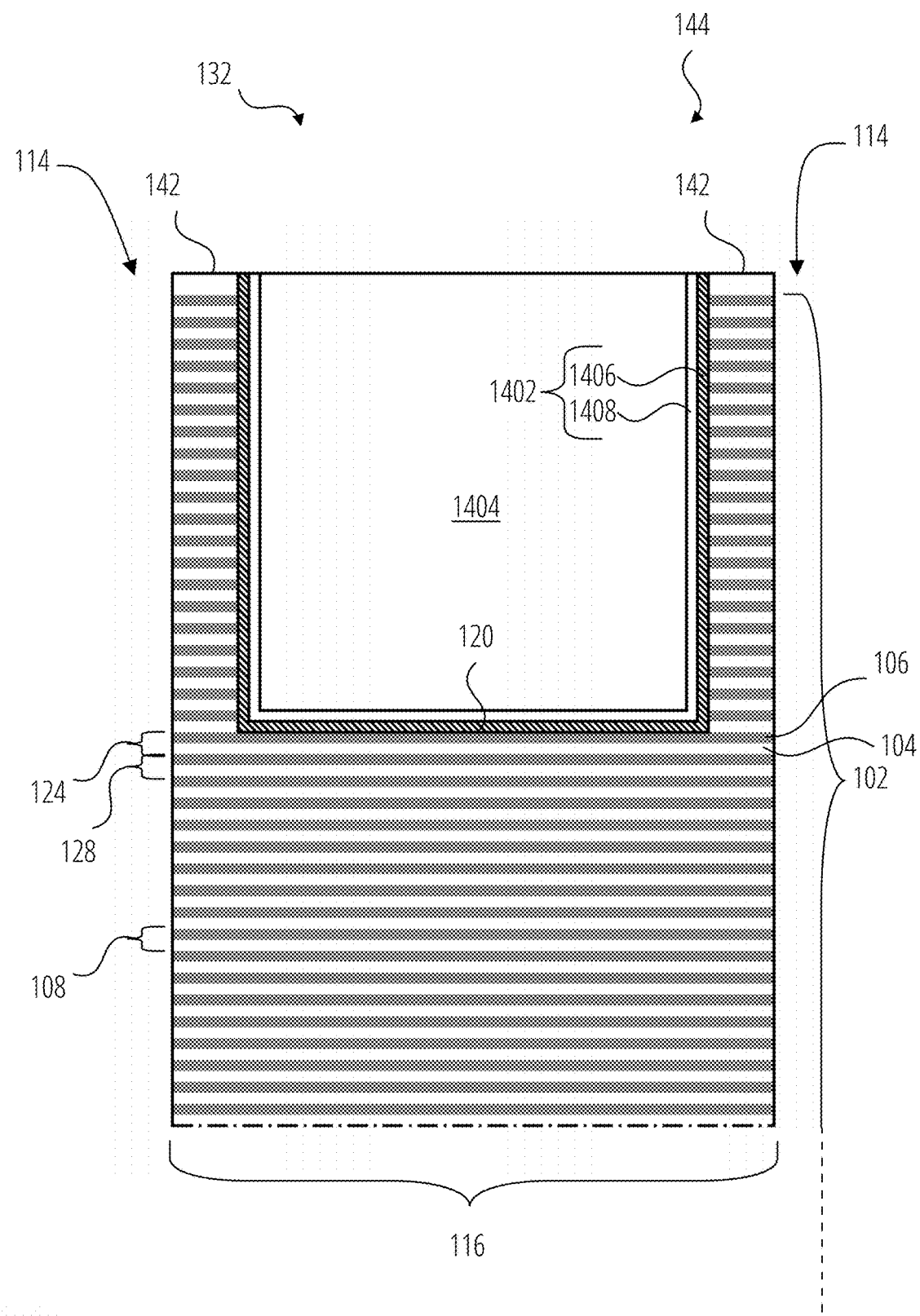

With reference to FIG. 19, the conductive material(s) of the conductive structures 106 may then be formed in the voids 1802 (FIG. 18) to complete the formation of the stack 102.

In other embodiments, the sacrificial structures 804 of FIG. 16 and FIG. 17 are not substantially removed (such that the stage of FIG. 18 may be omitted), but are chemically converted to form the conductive material(s) of the conductive structure 106 to complete the formation of the stack 102.

By the replacement or conversion process, the stadiums 132 then include the steps 120 exposing areas of the conductive structures 106 of the treaded tiers 124.

The non-conductive material(s) 302 (FIG. 3) may be formed (e.g., deposited) to fill the slits 114, to form slit structures as illustrated in FIG. 3.

Figure 20:
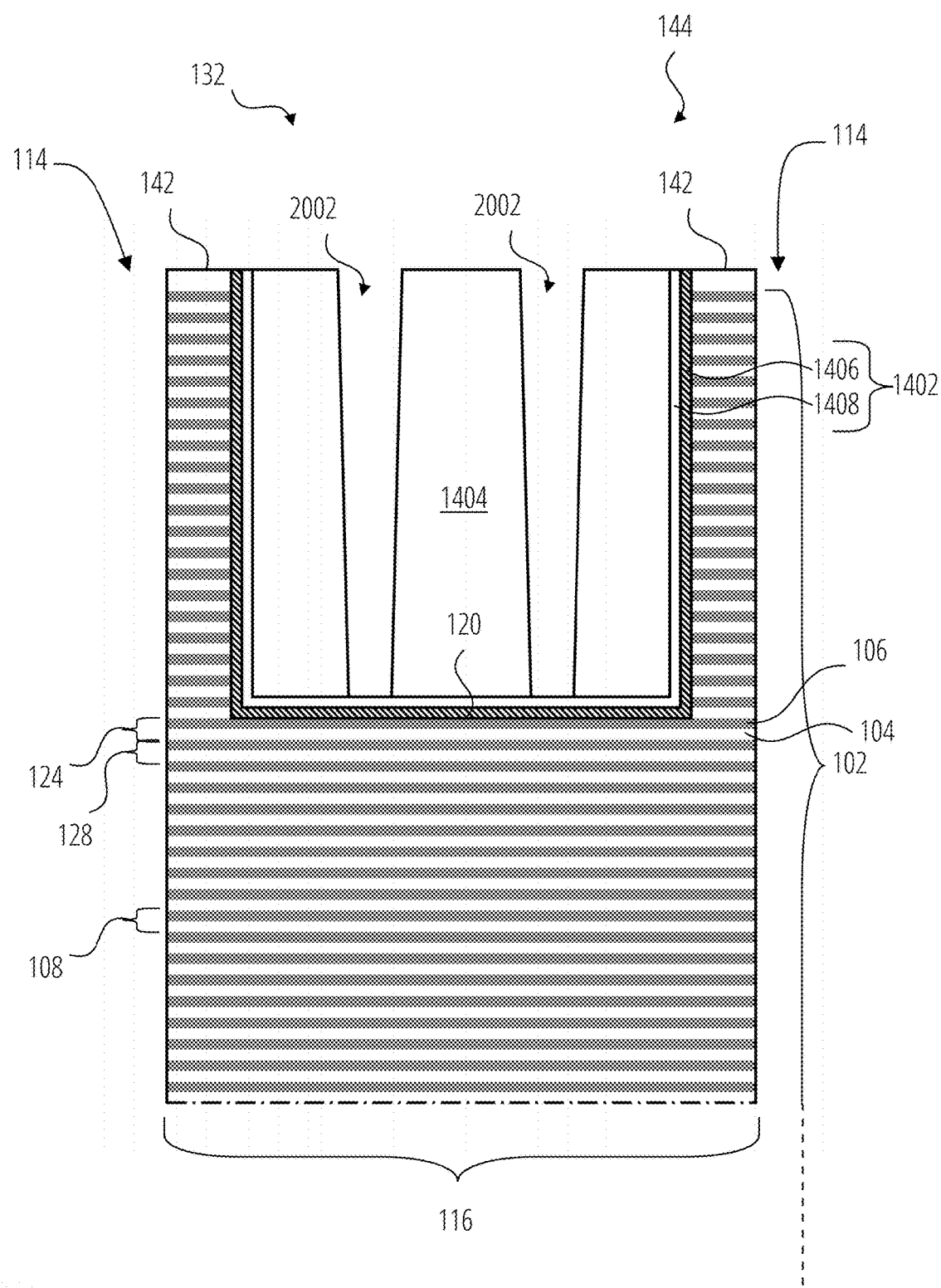

With reference to FIG. 20, initial contact openings 2002—one for each line contact 118 (FIG. 1) to be formed—may be formed (e.g., etched) through at least the insulative fill material(s) 1404. The dielectric liner(s) 1402 may function as "etch stop" materials for this process, and the initial contact openings 2002 may terminate on or in any of the dielectric liner(s) 1402.

Figure 21:
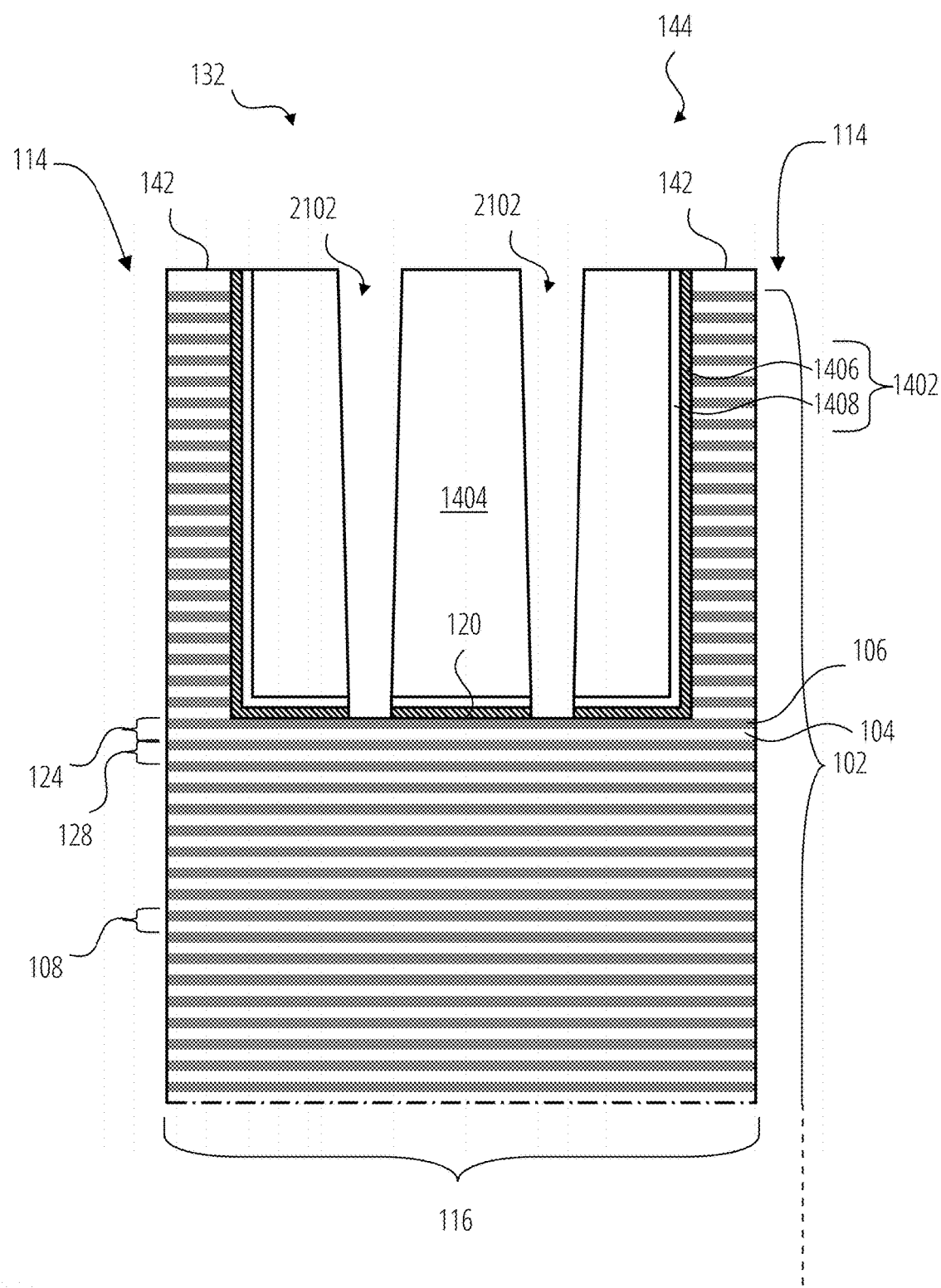

In embodiments in which the initial contact openings 2002 terminate on or in the dielectric liner(s) 1402, the material(s) of the dielectric liner(s) 1402 may then be etched to extend the initial contact openings 2002 to form contact openings 2102, as illustrated in FIG. 21, that terminate on or in the conductive structure 106 of the treaded tier 124.

Figure 22:
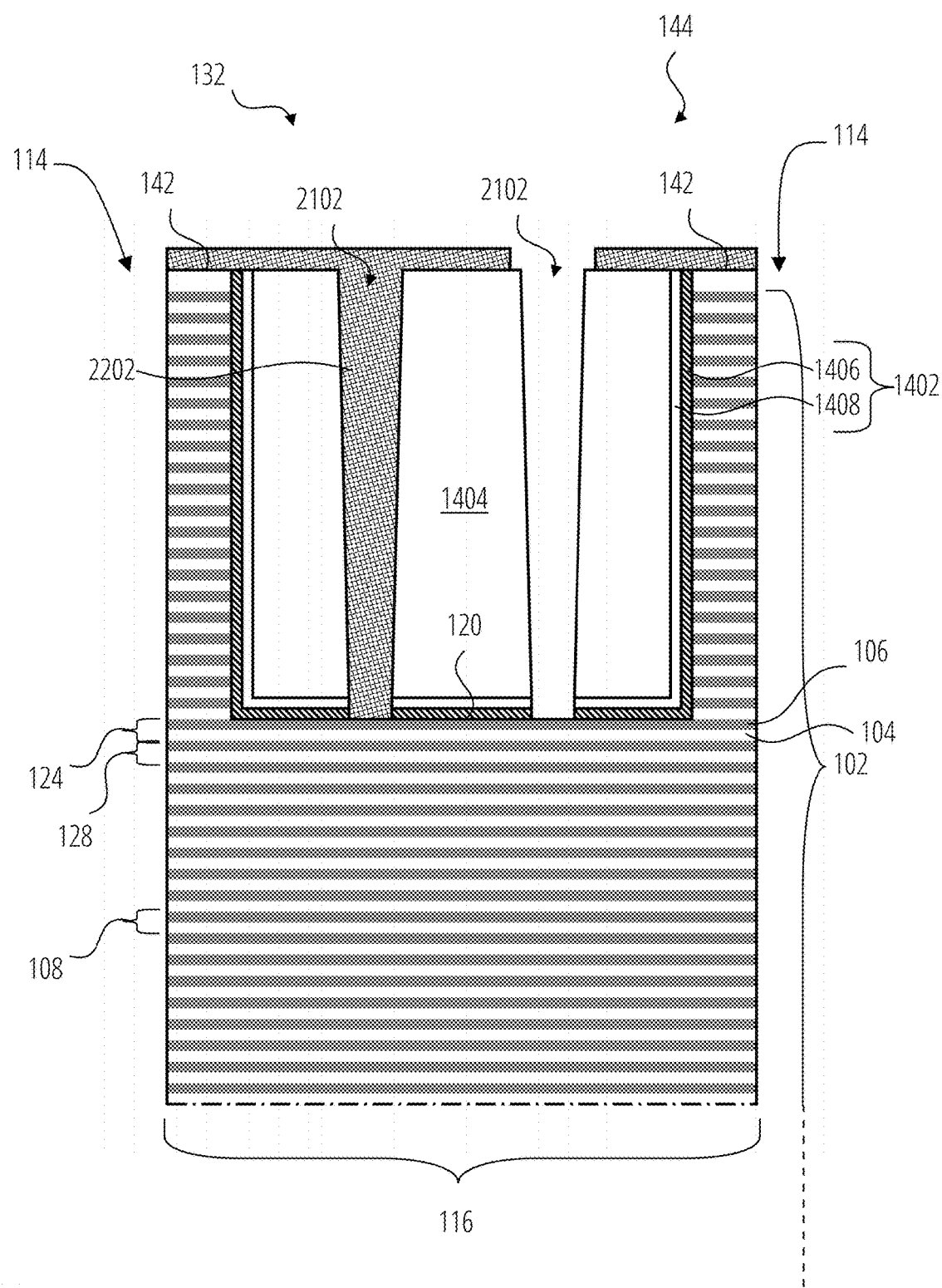

With reference to FIG. 22, one or more sacrificial fill material(s) 2202 may be formed on or over the contact openings 2102 where the to-step contacts 122 (FIG. 1) are to be formed, leaving exposed other contact openings 2102 where the through-step contacts 126 (FIG. 1) are to be formed.

In some embodiments, the sacrificial fill material(s) 2202 may be formed of and include a negative tone resist material. Such sacrificial fill material(s) 2202 may be formed to initially substantially fill all contact openings 2102, selectively exposed at least in the areas for the to-step contacts 122 (FIG. 1), and the non-exposed areas removed to re-open the contact openings 2102 for the through-step contacts 126 (FIG. 1).

In other embodiments, the sacrificial fill material(s) 2202 may be formed of and include a positive tone resist material, and the select exposure thereof may be of those areas corresponding to the contact openings 2102 for the through-step contacts 126 before those contact openings 2102 are re-opened.

In still other embodiments, the sacrificial fill material(s) 2202 may be formed of and include a non-conformal material, such as a carbon-based mask material, a silicon-based mask material, and the sacrificial fill material(s) 2202 may be formed (or formed and patterned) to be present substantially only over the contact openings 2102 for the to-step contacts 122 (FIG. 1).

Figure 23:
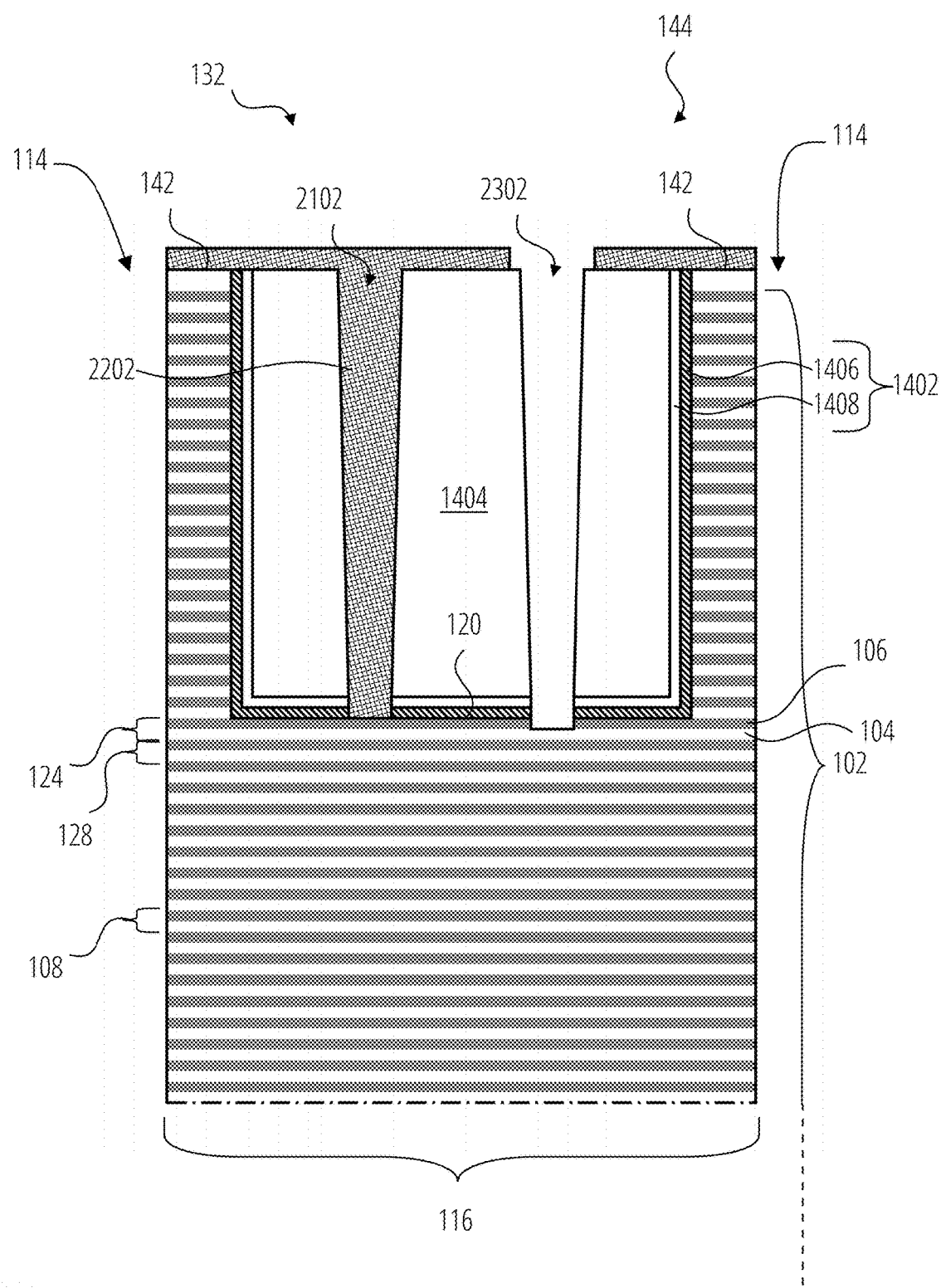

With the contact openings 2102 for the through-step contacts 126 exposed, the exposed portion of the conductive structure 106 of the treaded tier 124 may be removed (e.g., etched), as illustrated in FIG. 23, to form a half-tier extended contact opening 2302 for each through-step contact 126 (FIG. 1) to be formed.

This process may involve a metal-etching process that is selective to the conductive material(s) of the conductive structure 106 relative to the insulative fill material(s) 1404 and the insulative structure 104 of the treaded tier 124.

Figure 24:
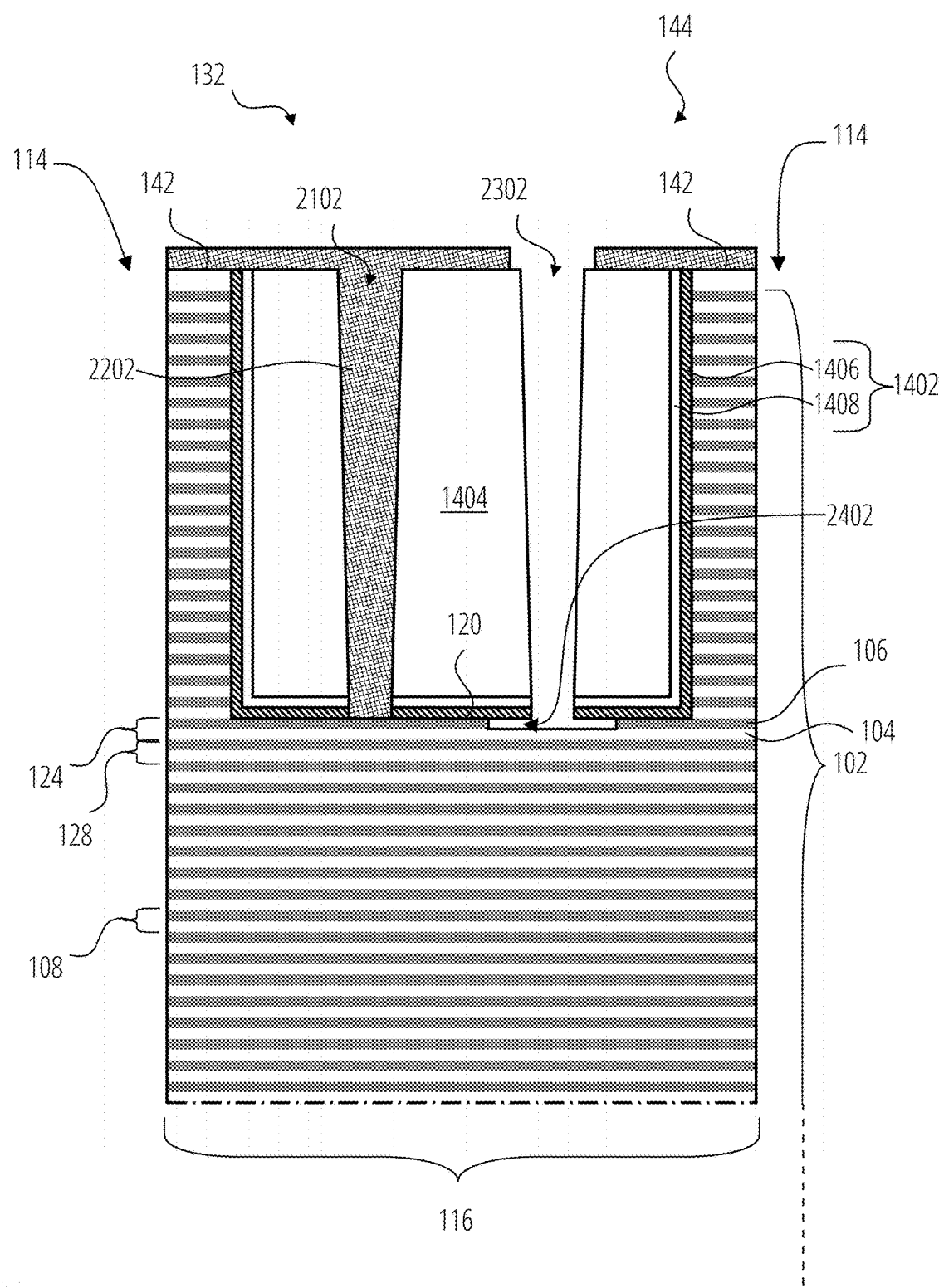

In some embodiments, to broaden the lower end of the half-tier extended contact opening 2302—to broaden the critical dimension of the half-tier extended contact opening 2302 where it is otherwise narrowest—the conductive structure 106 may be laterally recessed (e.g., by a continued or additional meta-etching process) to form a lateral recess 2402 around the base of the half-tier extended contact opening 2302, as illustrated in FIG. 24.

Figure 25:
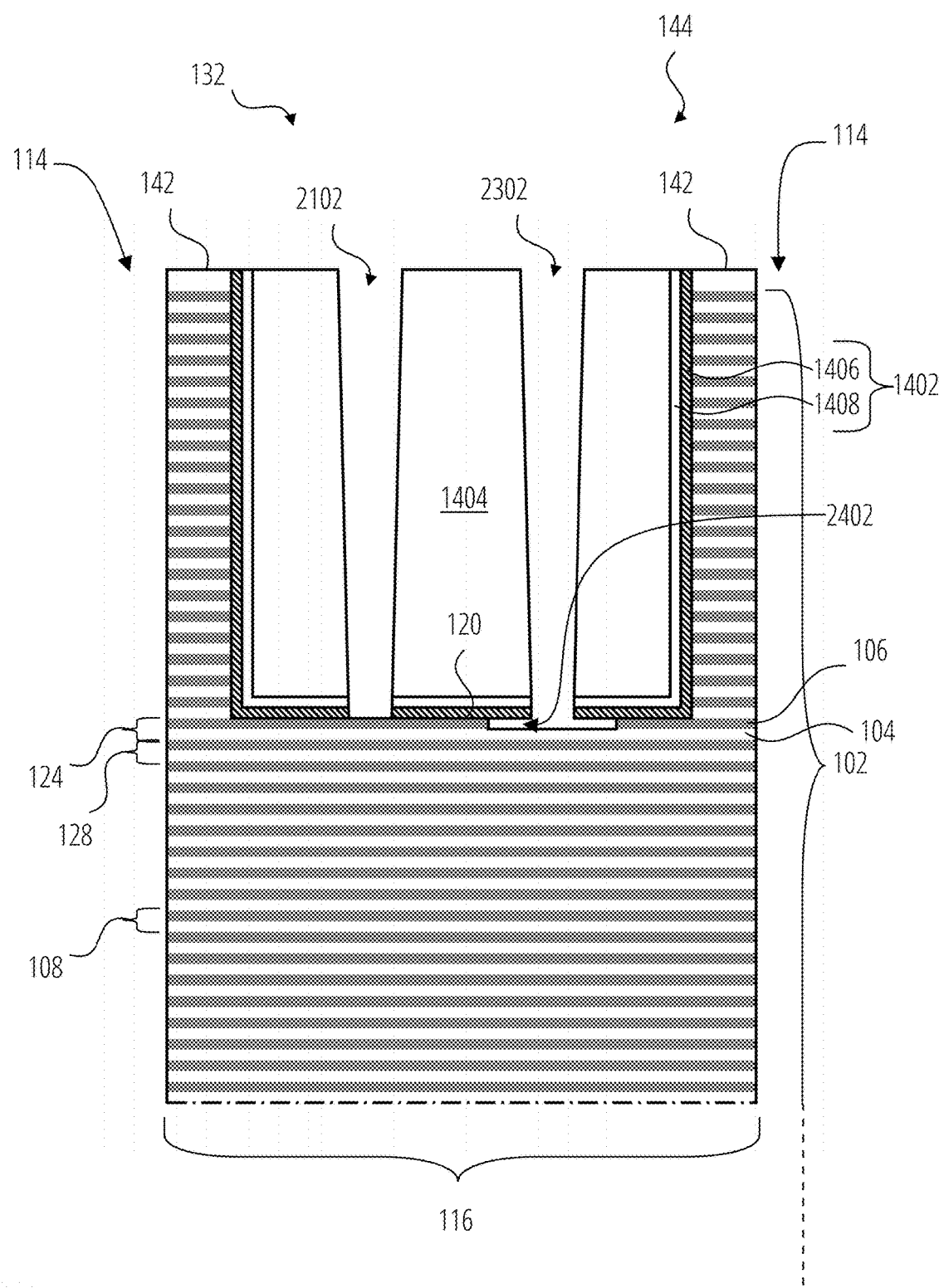

The sacrificial fill material(s) 2202 may then be removed (e.g., exhumed) from the other contact openings 2102 (as illustrated in FIG. 25), to re-expose the portion of the conductive structure 106 of the treaded tier 124 in the contact openings 2102 for the to-step contacts 122 (FIG. 1).

Figure 26:
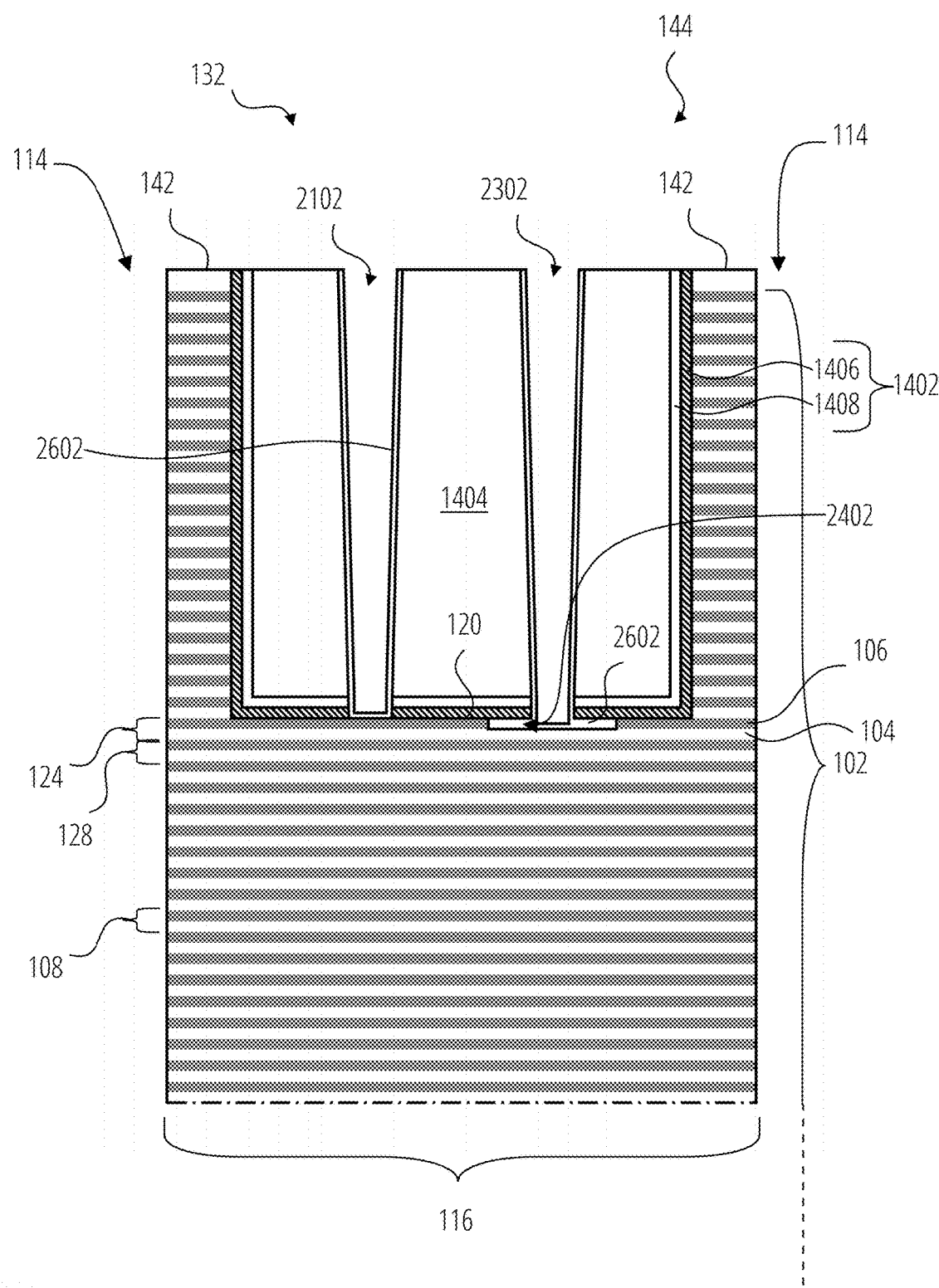

With reference to FIG. 26, at least one contact liner 2602 may be formed (e.g., conformally deposited) in each of the contact openings 2102 (for the to-step contacts 122 (FIG. 1)) and in each of the half-tier extended contact openings 2302 (for the through-step contacts 126 (FIG. 1)). The contact liner 2602 may be formed of and include one or more insulative material(s), such as any of the insulative material(s) discussed above for other features.

The contact liner 2602 may at least partially fill the lateral recesses 2402, as well.

Figure 27:
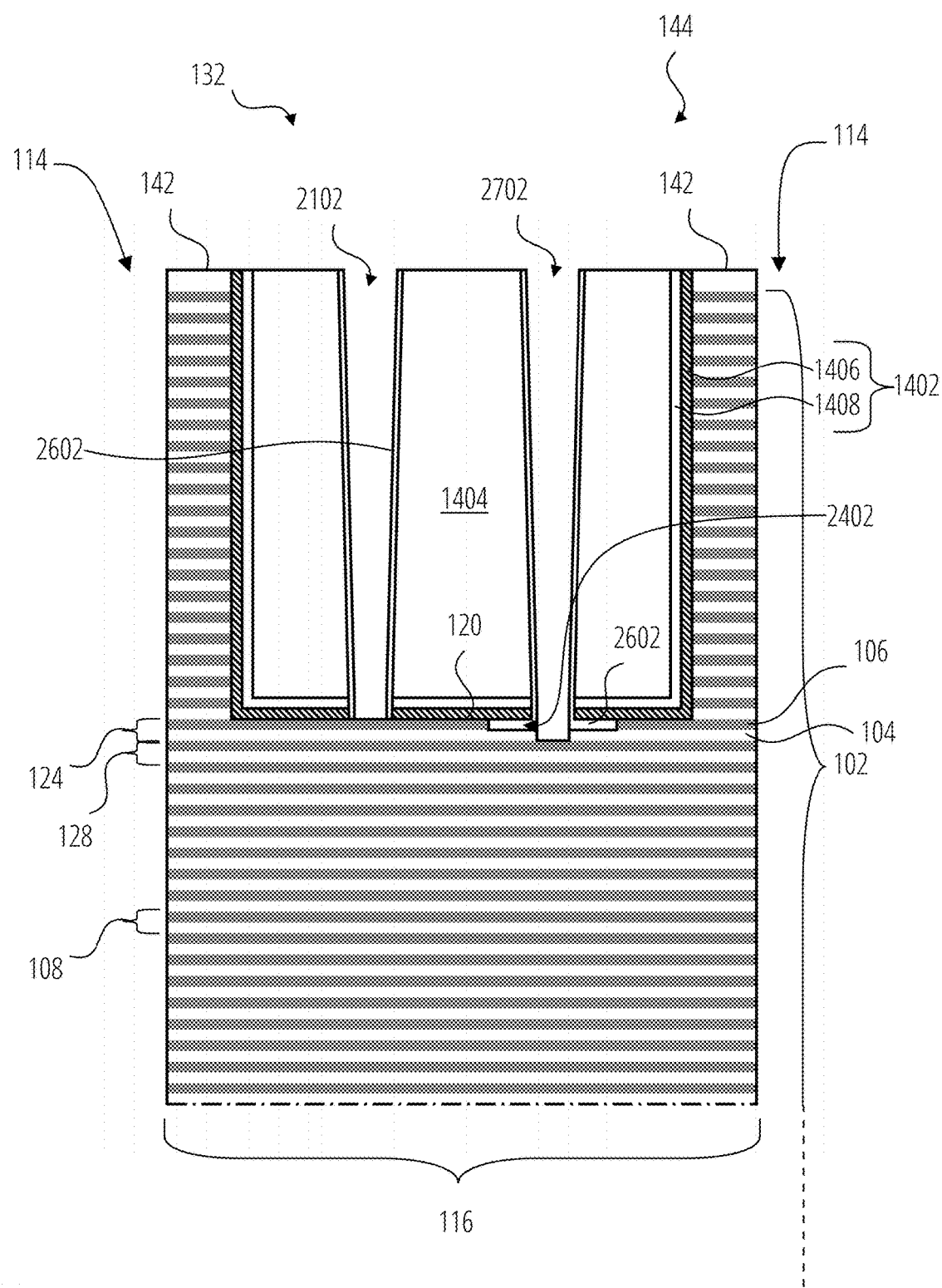

With reference to FIG. 27, the contact liner 2602 may be partially etched (e.g., "punched") at the base of each contact openings 2102 to re-expose a portion of the conductive structure 106 of the treaded tier 124. Before, during, or afterwards, the contact liner 2602 and the insulative structure 104 of the treaded tier 124—at the base of each half-tier extended contact opening 2302 (FIG. 26)—may also be etched (e.g., "punched") to form an extended contact opening 2702 that exposes a portion of the conductive structure 106 of the covered tier 128.

Figure 28:
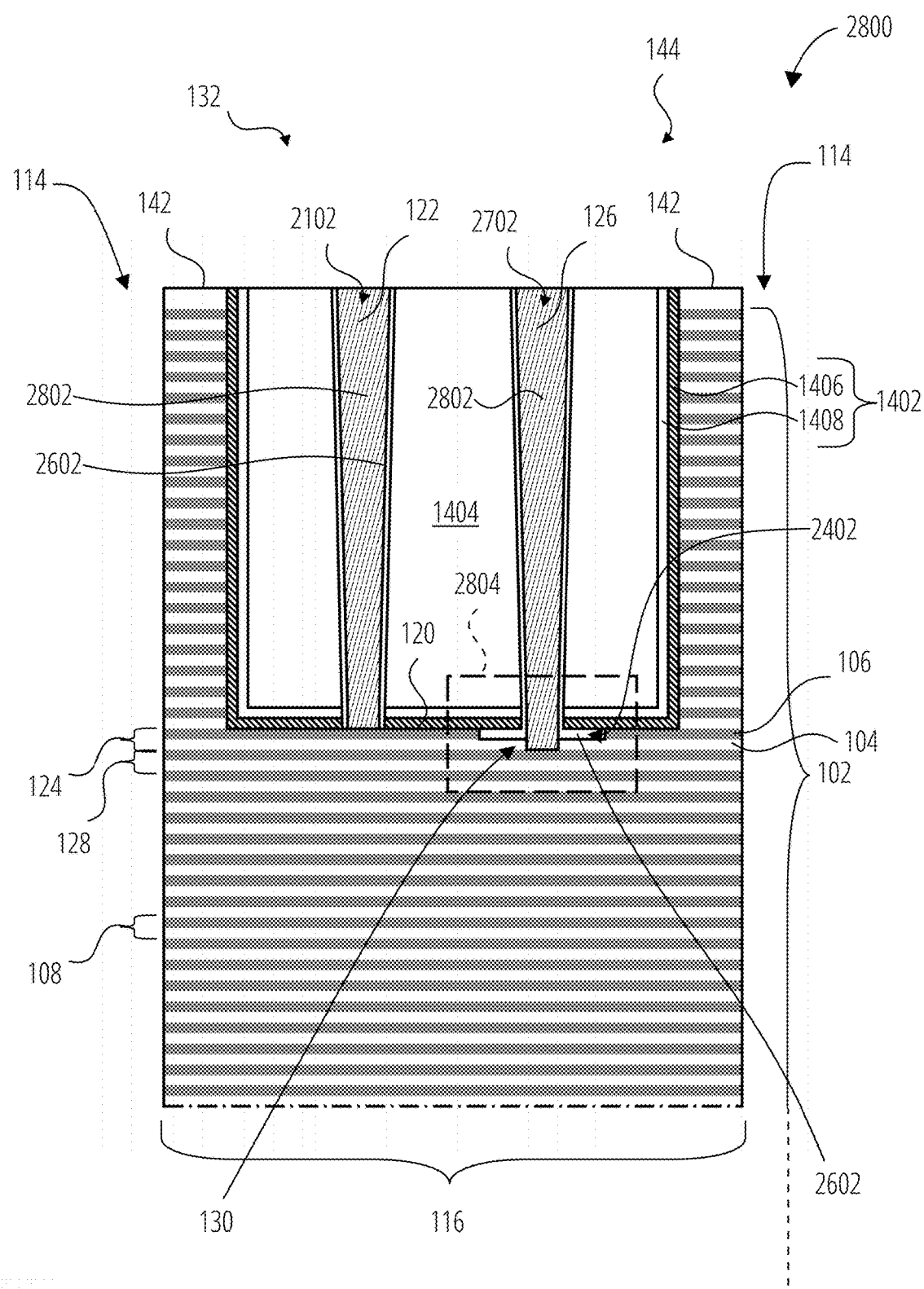

With reference to FIG. 28, conductive material(s) 2802 of the line contacts 118 (FIG. 1) may then be formed (e.g., deposited) in the contact openings 2102 and the extended contact openings 2702 to complete the formation of the to-step contacts 122 and the through-step contacts 126.

By this method, the conductive material(s) 2802 of the through-step contacts 126 extend through the dielectric liner(s) 1402, past a laterally-recessed conductive structure 106 of the treaded tier 124, through the insulative structure 104 of the treaded tier 124, and to or into the conductive structure 106 of the covered tier 128.

While FIG. 28 illustrates a structure 2800 with the to-step contact 122 and the through-step contact 126 associated with one step 120 of one of the multi-series stadiums 144, forming the to-step contacts 122 and the through-step contacts 126 for the single-series stadiums 150 (FIG. 5) may be substantially the same as described above, but adjusted to correspond to the arrangement of the line contacts 118. For example, rather than forming, for a given step 120, the to-step contact 122 longitudinally adjacent the through-step contact 126, the to-step contact 122 may be formed laterally adjacent the through-step contact 126, to form a structure 2900 such as that of FIG. 29 for the steps 120 of the single-series stadiums 150 (FIG. 5). The view of FIG. 29 is taken along section line B-B of FIG. 1 and FIG. 3.

Figure 29:
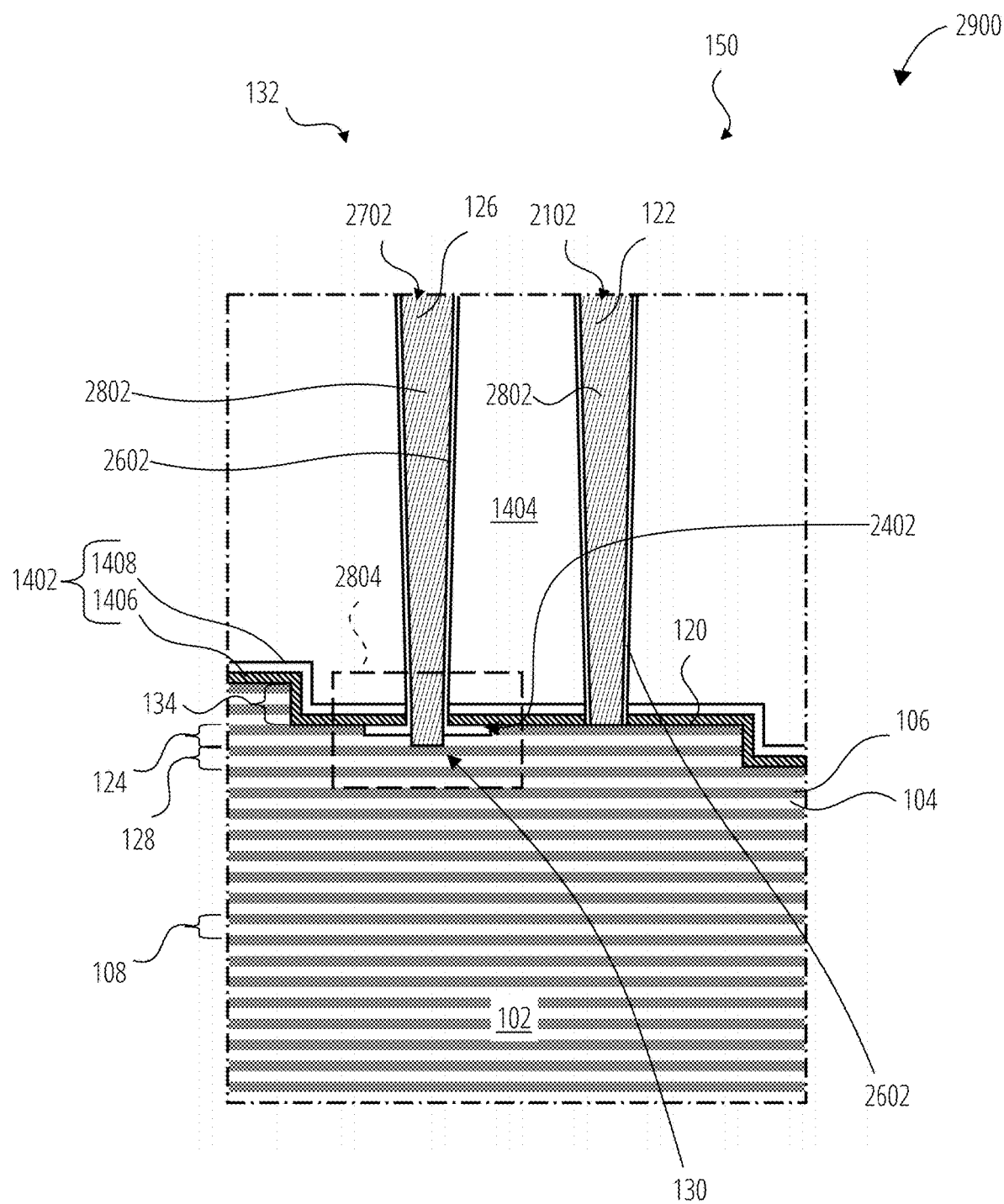
Figure 30A:
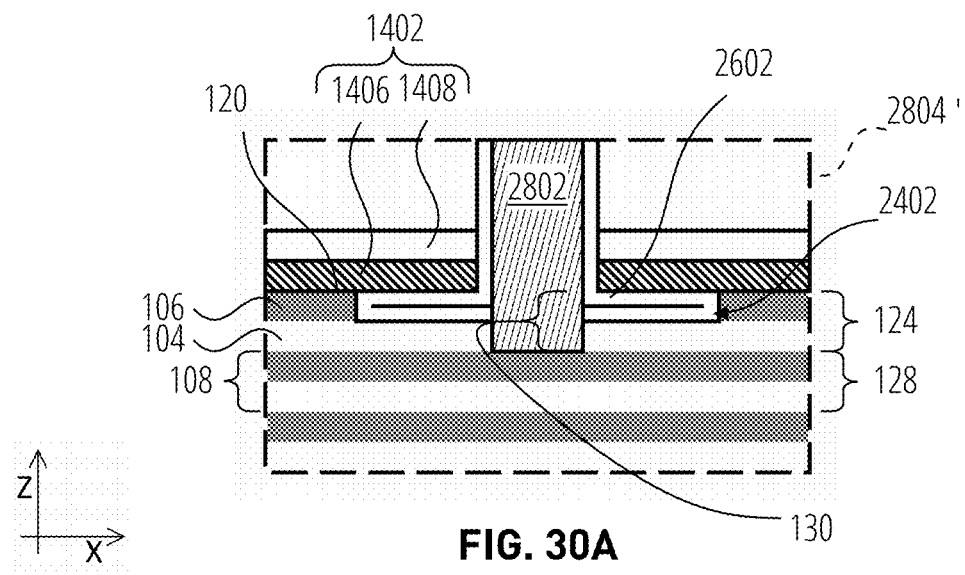
FIG. 30A is an enlarged view of the area of box 2804 of FIG. 28 and/or FIG. 29, illustrating an extension portion of a through-step contact formed adjacent a lateral recess into a conductive structure, according to embodiments of the disclosure.
Figure 30B:
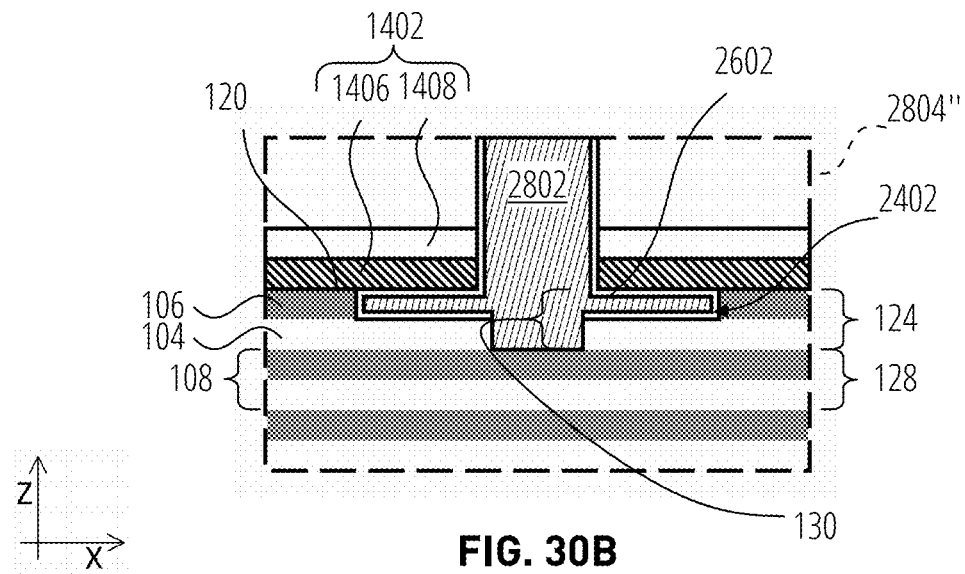
FIG. 30B is an enlarged view of the area of box 2804 of FIG. 28 and/or FIG. 29, illustrating an extension portion of a through-step contact formed adjacent a lateral recess into a conductive structure, according to embodiments of the disclosure wherein conductive material(s) of the through-step contact extend laterally into the adjacent lateral recess.
Figure 30C:
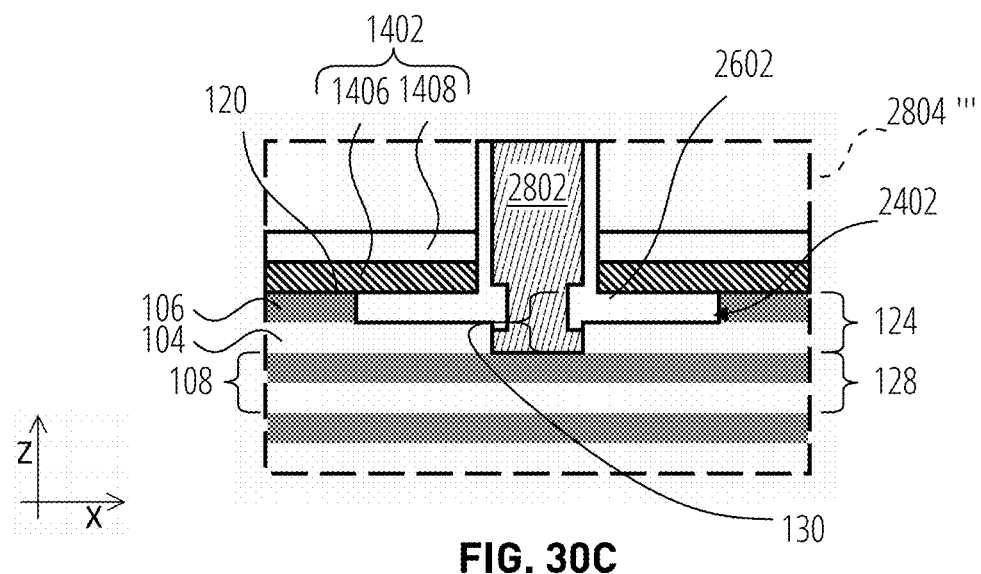
FIG. 30C is an enlarged view of the area of box 2804 of FIG. 28 and/or FIG. 29, illustrating an extension portion of a through-step contact formed adjacent a lateral recess into a conductive structure, according to embodiments of the disclosure wherein contact liner material protrudes from the lateral recess.

While FIG. 28 and FIG. 29 illustrate the contact liner 2602 substantially filling the lateral recess 2402, and the conductive material(s) 2802 extending with consistent taper throughout the height of the to-step contact 122 and the through-step contact 126, including through the elevation of the conductive structure 106 of the treaded tier 124, the disclosure is not so limited. FIG. 30A, FIG. 30B, and FIG. 30C illustrate alternative embodiments for the configuration of the contact liner 2602 and the conductive material(s) 2802 in and around the lateral recess 2402, and these illustrations may represent the structure in box 2804 of either or both FIG. 28 and FIG. 29.

In some embodiments, and as illustrated in box 2804' of FIG. 30A, the contact liner 2602 may substantially fill the lateral recess 2402 in more than one film of material, which may or may not leave a seam extending into the lateral recess 2402.

In some embodiments, and as illustrated in box 2804" of FIG. 30B, the contact liner 2602 may not substantially fill the lateral recess 2402, and the conductive material(s) 2802 may laterally extend into the lateral recess 2402.

In some embodiments, and as illustrated in box 2804''' of FIG. 30C, the contact liner 2602 may overfill the lateral recess 2402 and protrude laterally into the area of the conductive material(s) 2802.

The method illustrated in FIG. 8 through FIG. 29 forms the structure 2800 of FIG. 28 (for the multi-series stadium 144) and/or the structure 2900 of FIG. 29 (for the single-series stadium 150) with both the to-step contacts 122 and the through-step contacts 126 encircled by a respective contact liner 2602. The contact liner 2602 of the to-step contacts 122 may extend through the insulative fill material(s) 1404 and the dielectric liner(s) 1402 (e.g., the additional dielectric liner 1408 and the dielectric liner 1406) to the upper surface of the step 120 (e.g., the upper surface of the conductive structure 106 of the treaded tier 124). The contact liner 2602 of the through-step contacts 126 may extend through the insulative fill material(s) 1404 and the dielectric liner(s) 1402, and into the elevations of the conductive structure 106 of the treaded tier 124, at which elevations the contact liner 2602 may extend laterally outward (e.g., into the lateral recess 2402 formed in the conductive structure 106 of the treaded tier 124). The contact liner 2602 may not extend through or into the insulative structure 104 of the treaded tier 124.

The contact liner 2602 physically and electrically isolates the conductive material(s) 2802 of the through-step contacts 126 from the conductive structure 106 of the step 120 (e.g., of the treaded tier 124) through which the through-step contact 126 extends.

By forming the through-step contacts 126 by etching through the treaded tier 124, the through-step contacts 126 may be substantially self-aligned with their respective conductive structure 106 of the target covered tier 128. That is, provided the opening for the extension 130 is formed in the appropriate step 120, the through-step contact 126 is assured of vertical alignment with its target conductive structure 106 (e.g., of the covered tier 128). Accordingly, forming the through-step contacts 126 in this manner may avoid or lessen concerns of contact-to-conductive-structure misalignment.

Moreover, provided the extension 130 of the through-step contact 126 does not extend beyond the covered tier 128, shorting between the through-step contact 126 and the non-target, lower conductive structures 106 of the stack 102 may be avoided. Accordingly, while FIG. 28 and FIG. 29 illustrate the through-step contact 126 as extended only to the conductive structure 106 of the covered tier 128, in other embodiments, the through-step contact 126 extends into or even through that conductive structure 106 and still achieves physical and electrical contact between the conductive material(s) 2802 of the through-step contact 126 and the conductive structure 106 of the covered tier 128. In some such embodiments, the through-step contact 126 may extend partially into the insulative structure 104 of the covered tier 128.

In other embodiments, a method of forming a microelectronic device—such as one including the microelectronic device structure 100 of FIG. 1 and FIG. 3 and/or the microelectronic device structure 700 of FIG. 7, and of which may include the structures of FIG. 2, FIG. 4, FIG. 5, and/or FIG. 6—may include forming the contact liner 2602 on the through-step contacts 126 but not on the to-step contacts 122. Various stages of such a method are illustrated in FIG. 31 through FIG. 34, in conjunction with the stages illustrated in FIG. 8 through FIG. 23, discussed above.

Figure 31:
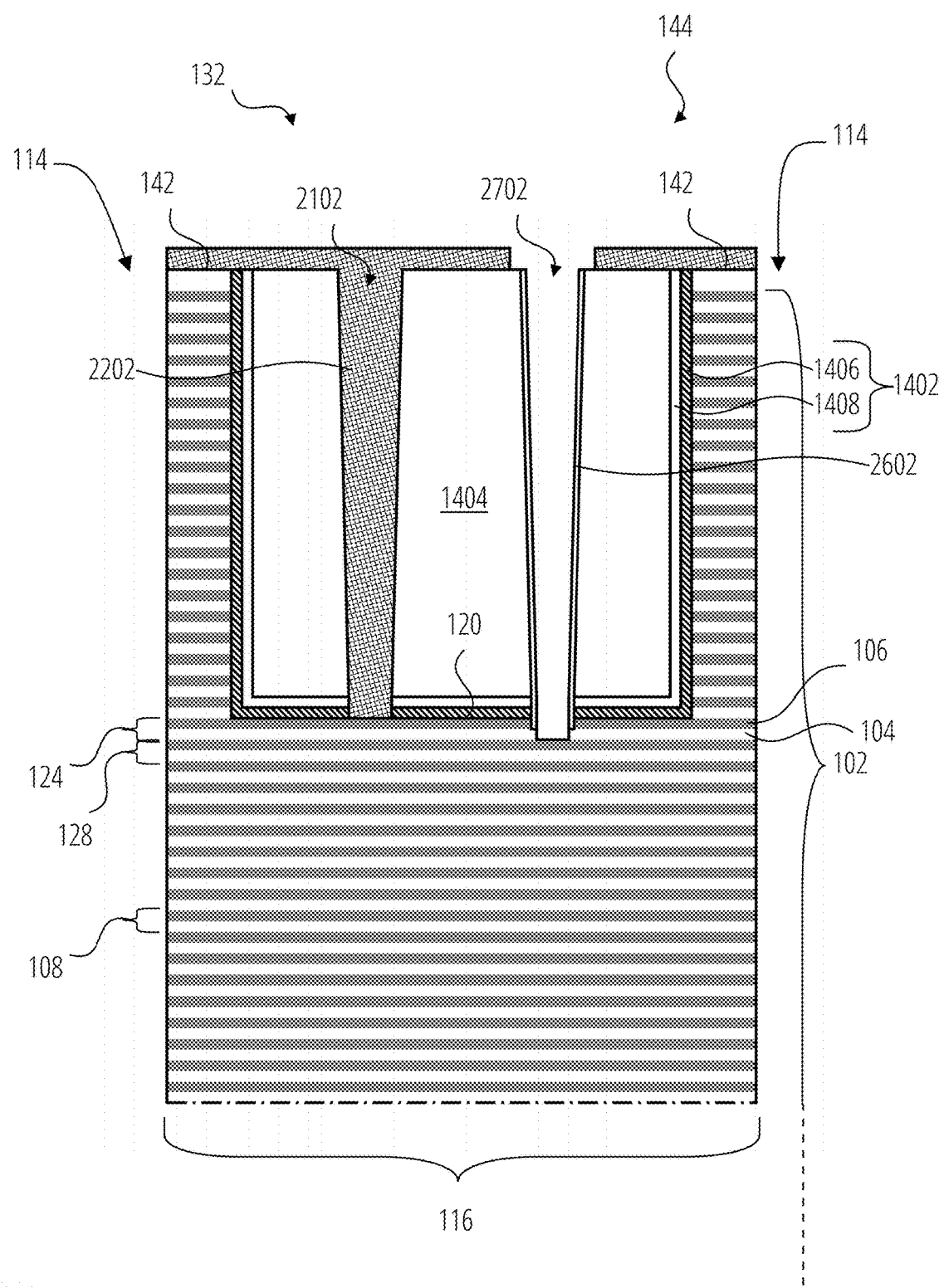
FIG. 31 through FIG. 34, along with FIG. 8 through FIG. 23, are schematic, cross-sectional, perspective views of various stages of processing (wherein the stage of FIG. 31 follows that of FIG. 23) to fabricate the structure of FIG. 33 and/or the structure of FIG. 34, either or both of which structures may be part(s) of a microelectronic device structure in accordance with embodiments of the disclosure, such as any of the aforementioned microelectronic device structures of FIG. 1 and FIG. 3.

The stage illustrated in FIG. 31 may follow that illustrated in FIG. 23. After forming the half-tier extended contact openings 2302 for the through-step contacts 126, as illustrated in FIG. 23 and described above, the contact liner 2602 may be formed in the half-tier extended contact openings 2302 (FIG. 23) for the through-step contacts 126 (FIG. 1). When forming the contact liners 2602, the contact openings 2102 for the to-step contacts 122 (FIG. 1) may not yet be exposed; therefore, the contact liner 2602 may not be formed in those contact openings 2102.

The base of the contact liners 2602 and the vertically adjacent portion of the insulative structure 104 of the treaded tier 124 may be removed (e.g., etched) to form extended contact openings 2702 as illustrated in FIG. 31.

Figure 32:
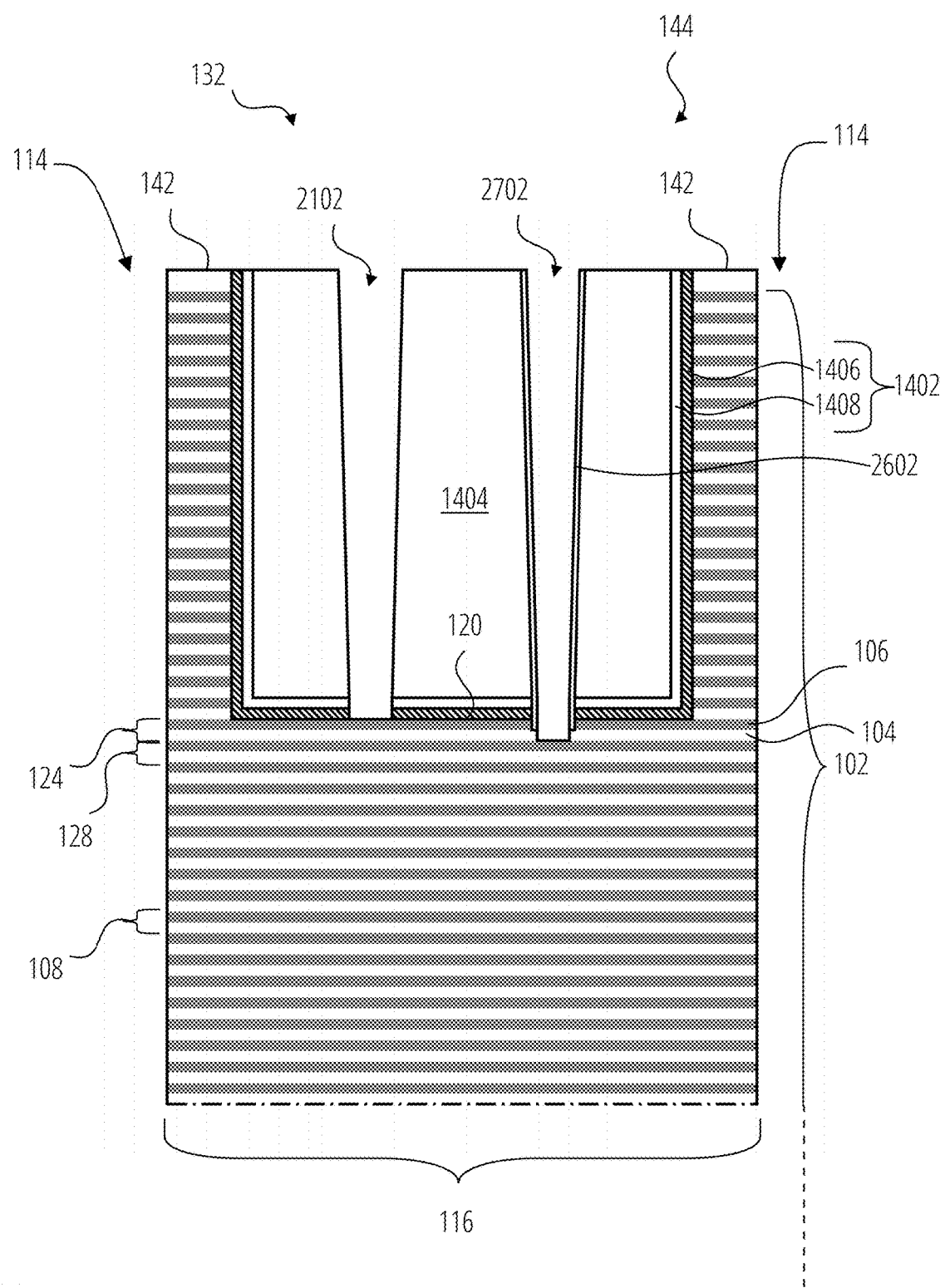

After forming the contact liner 2602, the sacrificial fill material(s) 2202 may be removed (e.g., exhumed), to re-expose the contact openings 2102 for the to-step contacts 122, as illustrated in FIG. 32.

Figure 33:
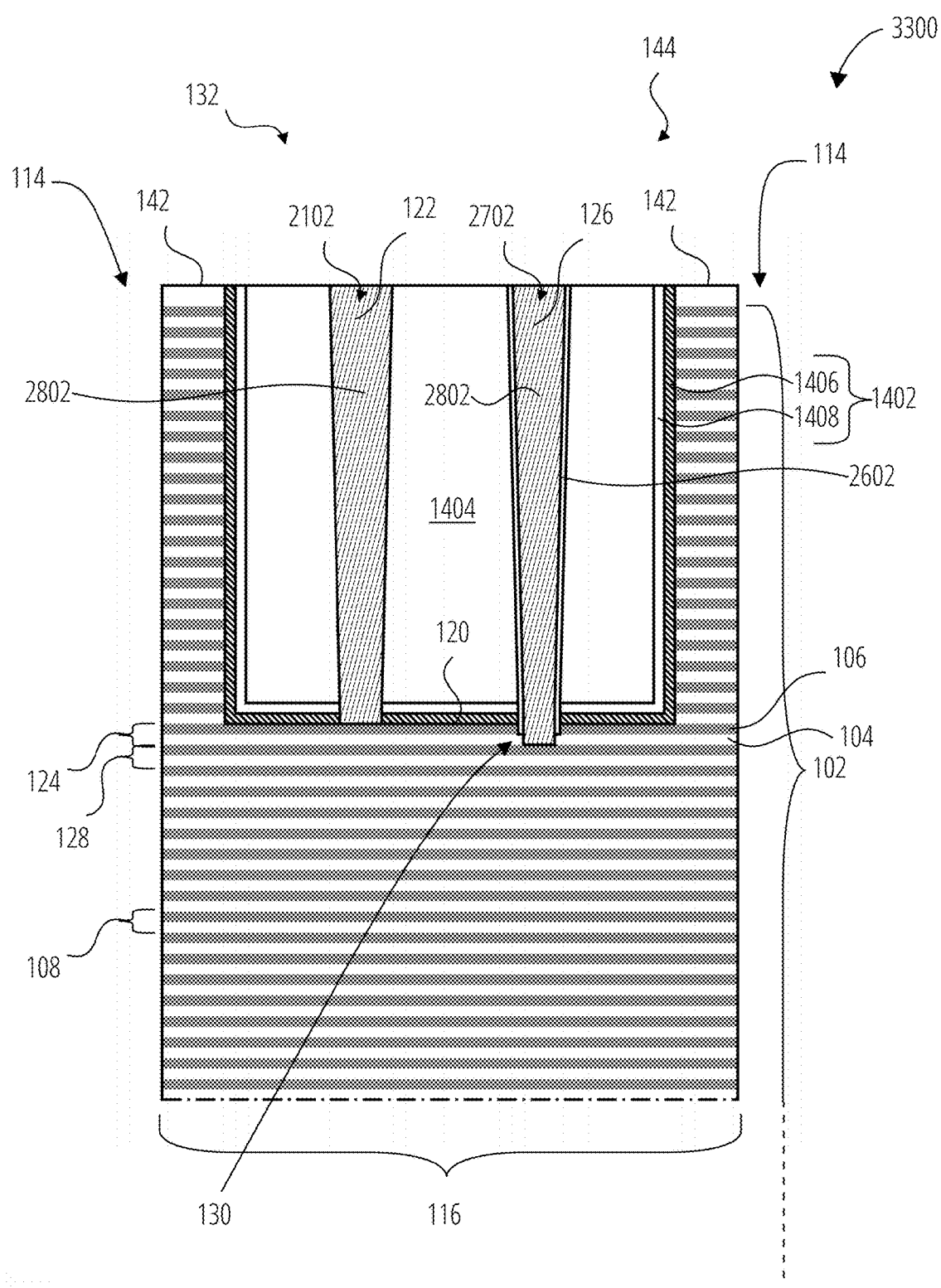
Figure 34:
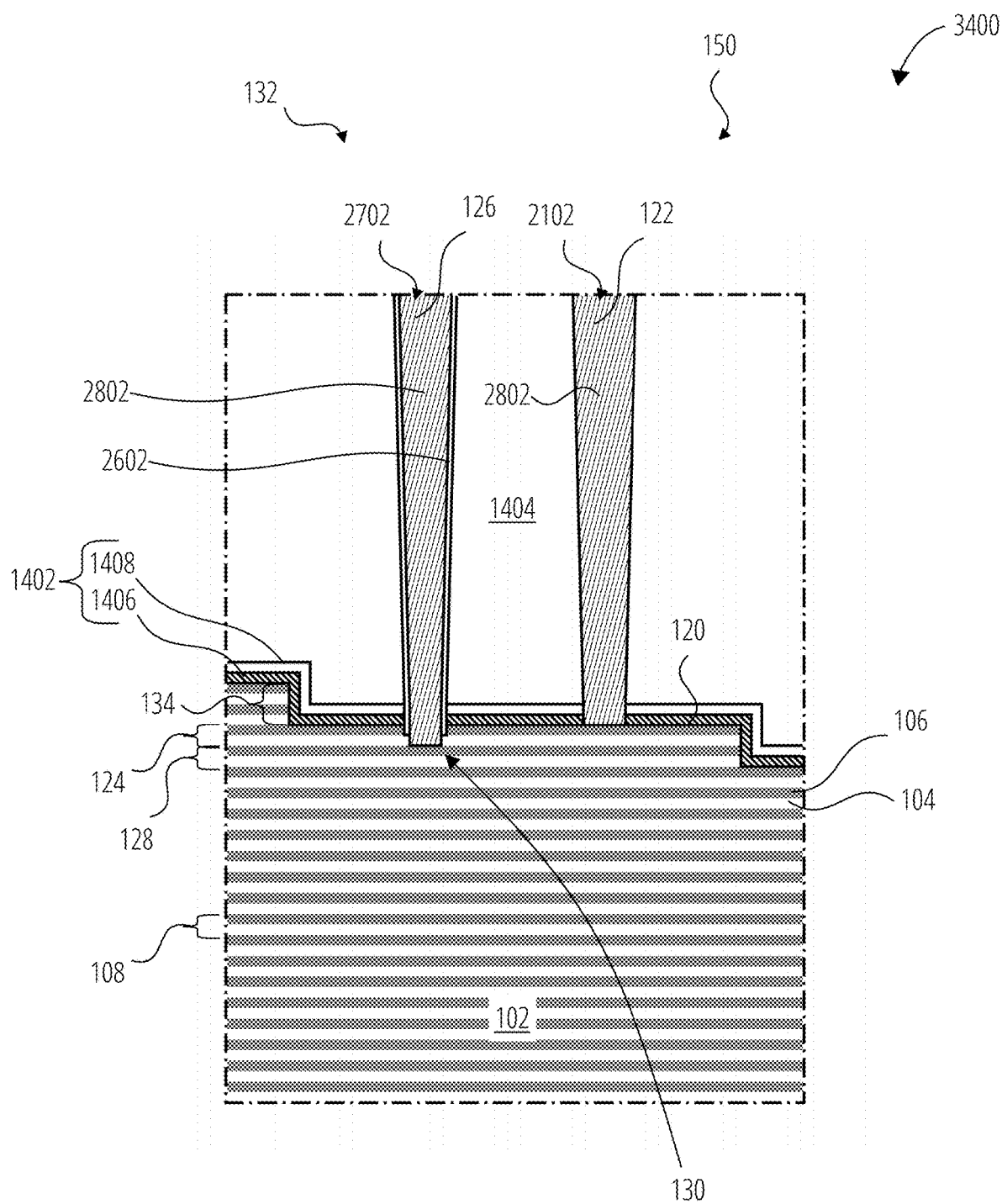

With reference to FIG. 33 and FIG. 34, the conductive material(s) 2802 may then be formed (e.g., deposited) to complete the to-step contacts 122 and the through-step contacts 126 of structures 3300 for the steps 120 of the multi-series stadium 144 and/or of structures 3400 for the steps 120 of the single-series stadiums 150. In the resulting structures 3300 and 3400, the contact liner 2602 substantially encircles the through-step contact 126 and spaces the conductive material(s) 2802 of the through-step contact 126 from the insulative fill material(s) 1404, the dielectric liner(s) 1402, and the conductive structure 106 of the treaded tier 124 (e.g., the step 120). The contact liner 2602 may not extend through the insulative structure 104 of the treaded tier 124. Also in such structures 3300 and 3400, the conductive material(s) 2802 of the to-step contact 122 extends directly through the insulative fill material(s) 1404 and the dielectric liner(s) 1402.

In some embodiments, a method of forming a microelectronic device—such as one including the microelectronic device structure 100 of FIG. 1 and FIG. 3 and/or the microelectronic device structure 700 of FIG. 7, and of which may include the structures of FIG. 2, FIG. 4, FIG. 5, and/or FIG. 6—may include forming the contact liner 2602 for both the through-step contacts 126 and the to-step contacts 122, but without laterally recessing the conductive structure 106 of the treaded tier 124 (e.g., of the step 120). Various stages of such a method are illustrated in FIG. 35 through FIG. 39, in conjunction with the stages illustrated in FIG. 8 through FIG. 23, discussed above.

Figure 35:
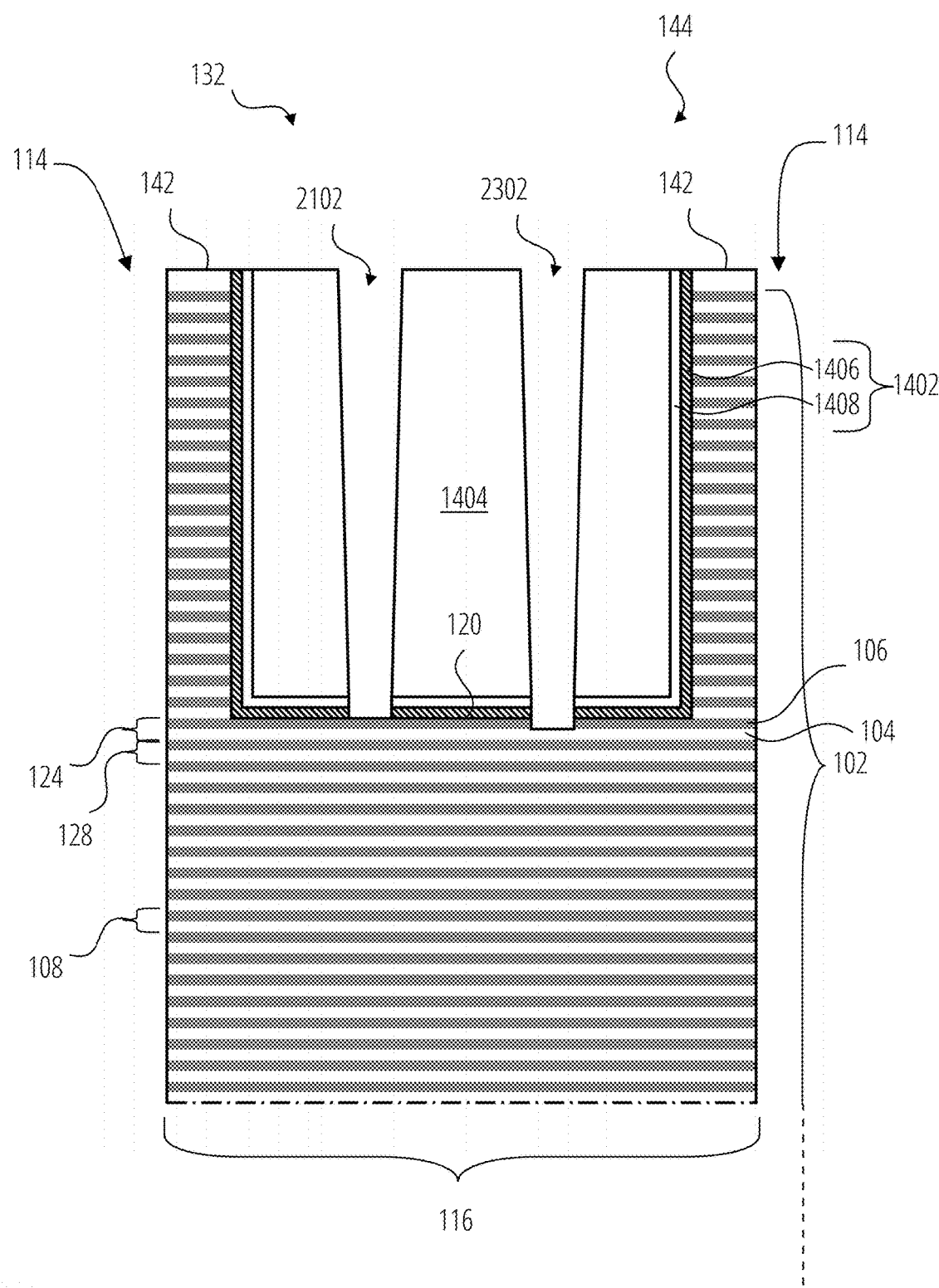
FIG. 35 through FIG. 39, along with FIG. 8 through FIG. 23, are schematic, cross-sectional, perspective views of various stages of processing (wherein the stage of FIG. 35 follows that of FIG. 23) to fabricate the structure of FIG. 38 and/or the structure of FIG. 39, either or both of which structures may be part(s) of a microelectronic device structure in accordance with embodiments of the disclosure, such as any of the aforementioned microelectronic device structures of FIG. 1 and FIG. 3.

The stage illustrated in FIG. 35 may follow that illustrated in FIG. 23. After forming the half-tier extended contact openings 2302 for the through-step contacts 126, as illustrated in FIG. 23 and described above, the sacrificial fill material(s) 2202 may be removed (e.g., exhumed) to re-expose the contact openings 2102 for the to-step contacts 122 (FIG. 1), as illustrated in FIG. 35.

Figure 36:
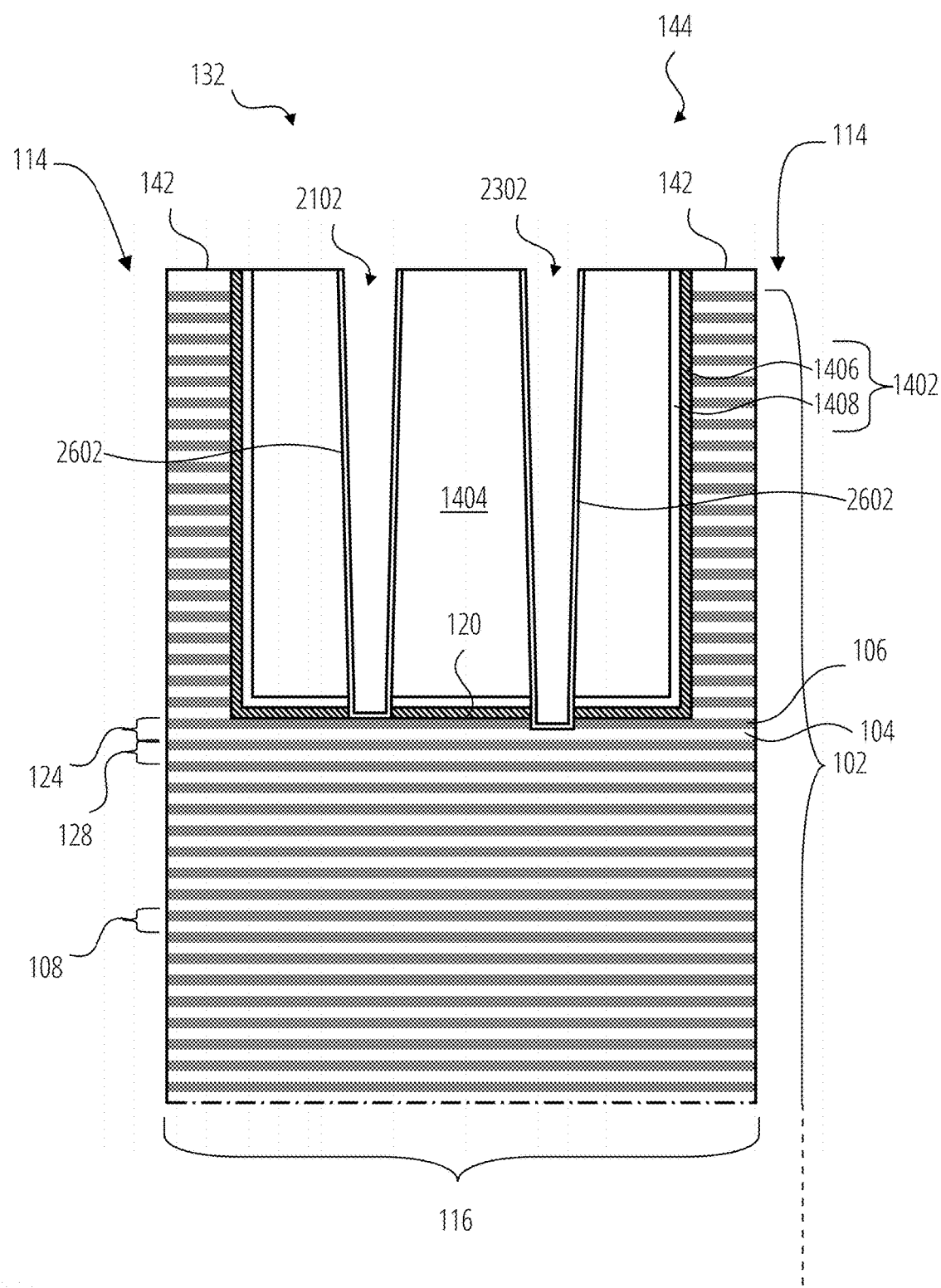

With reference to FIG. 36, the contact liner 2602 may be formed in both the contact openings 2102 for the to-step contacts 122 (FIG. 1) and in the half-tier extended contact openings 2302 for the through-step contacts 126 (FIG. 1).

Figure 37:
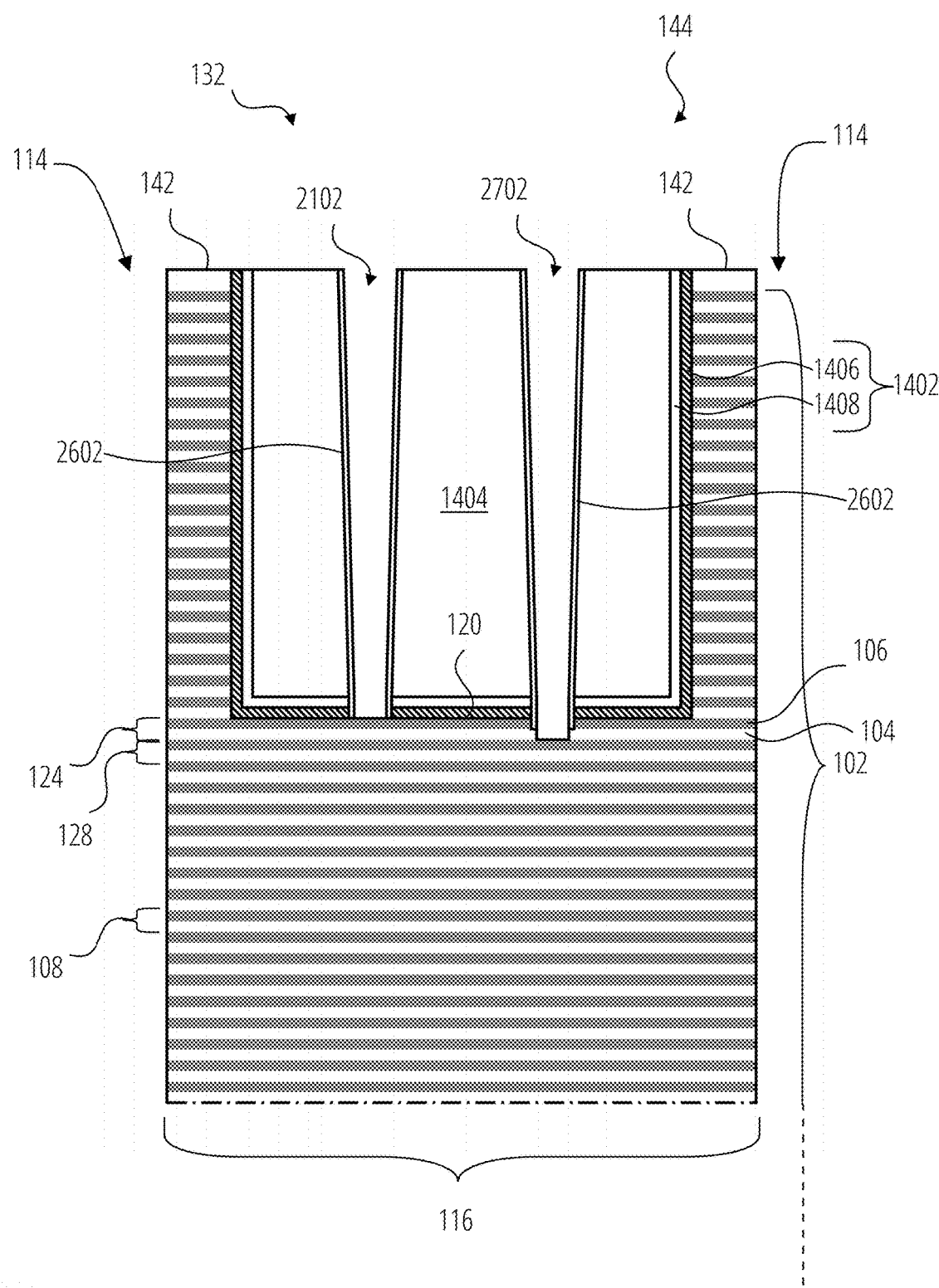

The base of the contact liners 2602 may be removed (e.g., etched) at the base of both the contact openings 2102 and the half-tier extended contact openings 2302, and the vertically adjacent portion of the insulative structure 104 of the treaded tier 124 may be removed (e.g., etched) from the base of the half-tier extended contact openings 2302 to form, as illustrated in FIG. 37, the extended contact openings 2702. Both the etching of the base portions of the contact liners 2602 and the vertically adjacent portion of the insulative structure 104 for the through-step contacts 126 (FIG. 1) may be a process involving removal of substantially insulative (e.g., oxide) material, which may be accomplished selective relative to the conductive structure 106. Therefore, the contact openings 2102 may not be extended downward, into the conductive structure 106 of the treaded tier 124 while the extended contact openings 2702 are formed through the insulative structure 104 of the treaded tier 124.

Figure 38:
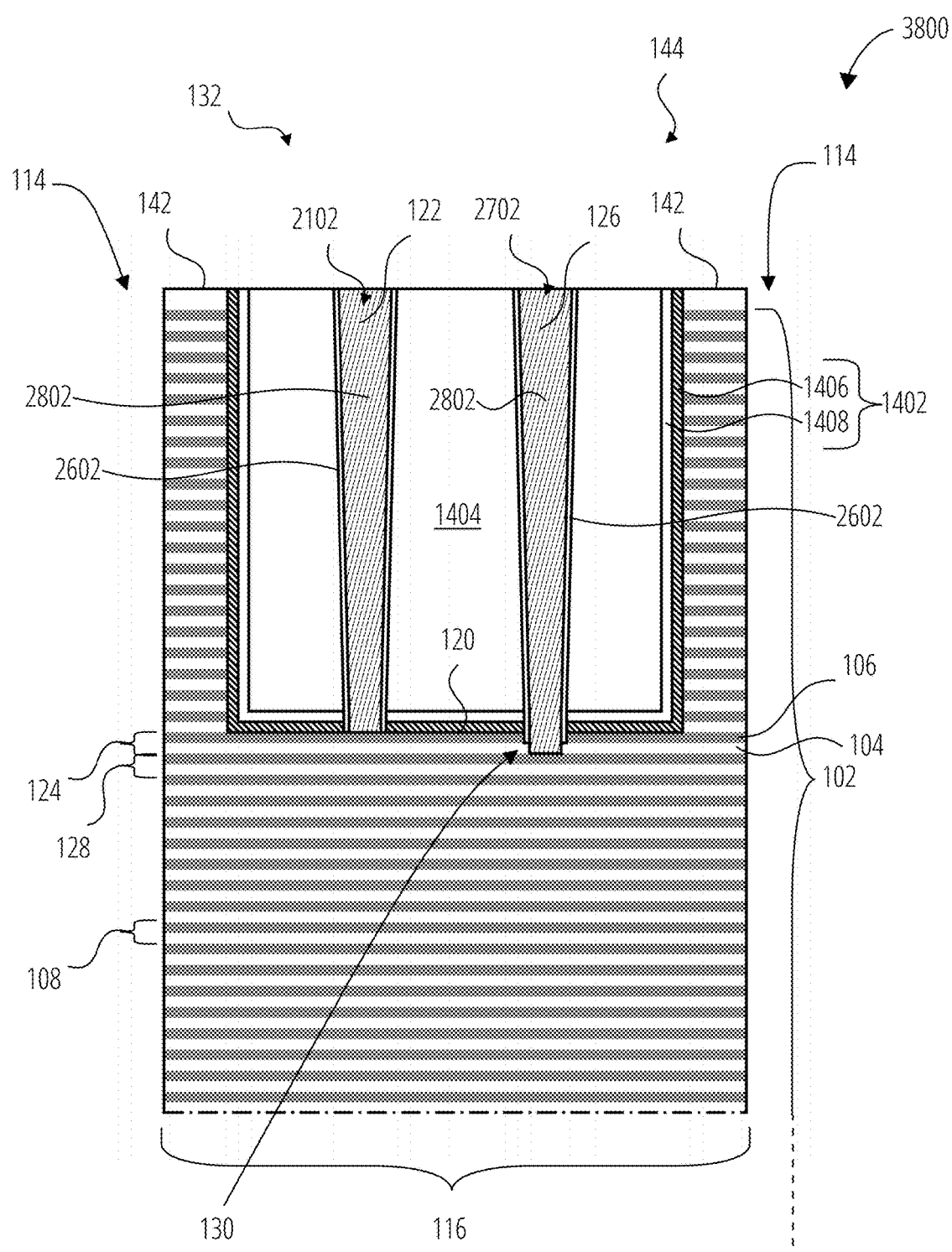
Figure 39:
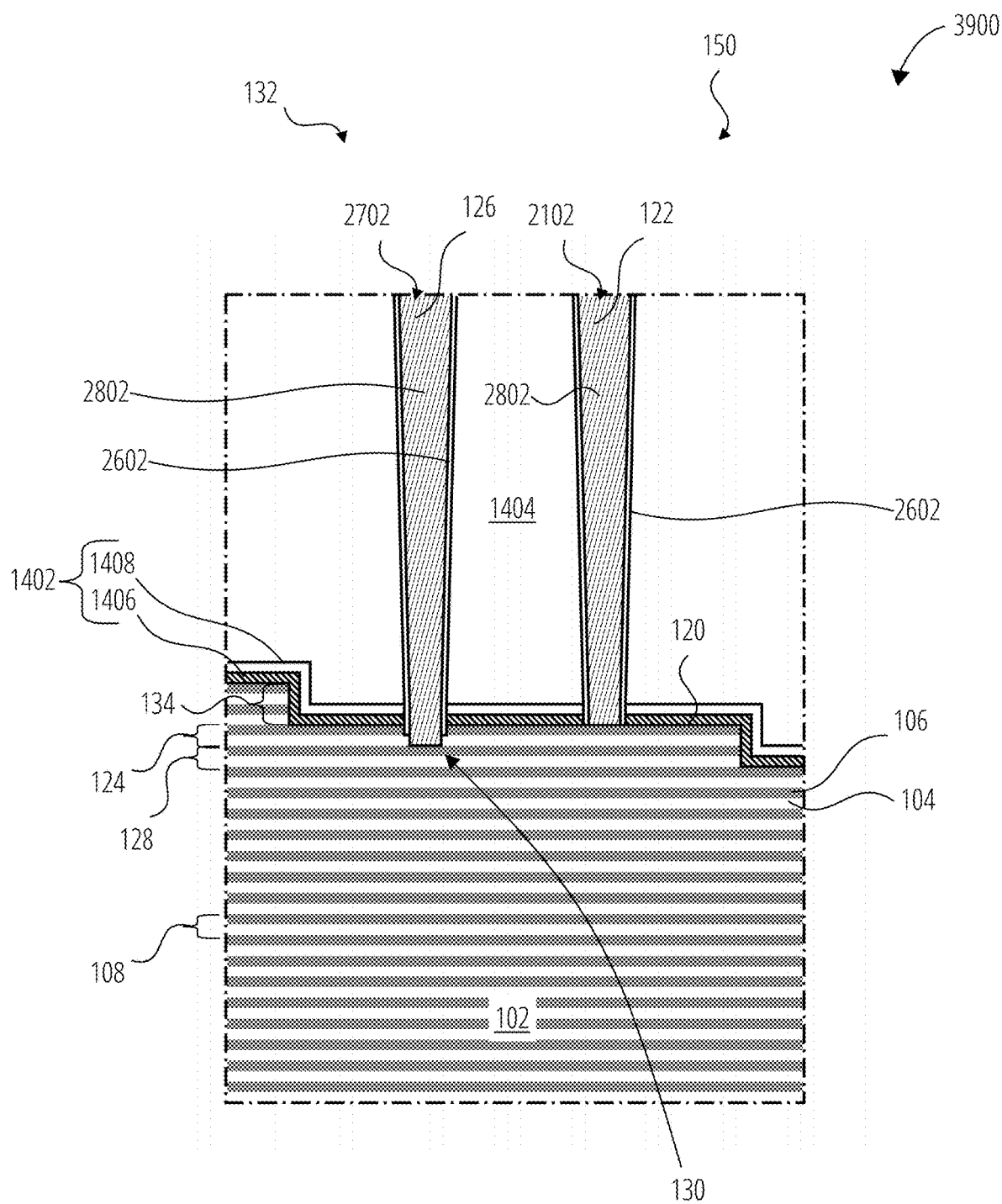

With reference to FIG. 38 and FIG. 39, the conductive material(s) 2802 may then be formed (e.g., deposited) to complete the to-step contacts 122 and the through-step contacts 126 of structures 3300 for the steps 120 of the multi-series stadium 144 and/or of structures 3400 for the steps 120 of the single-series stadiums 150. In the resulting structures 3800 and 3900, the contact liner 2602 substantially encircles the to-step contacts 122 and the through-step contact 126 and spaces the conductive material(s) 2802 thereof from the insulative fill material(s) 1404 and the dielectric liner(s) 1402. For the through-step contacts 126, the contact liner 2602 also encircles the through-step contact 126 in the elevation of the conductive structure 106 of the treaded tier 124 (e.g., of the step 120) and physically separates and electrically isolates the through-step contact 126 from the conductive structure 106 of the step 120. The contact liner 2602 may not extend through the insulative structure 104 of the 124.

In some embodiments, a method of forming a microelectronic device—such as one including the microelectronic device structure 100 of FIG. 1 and FIG. 3 and/or the microelectronic device structure 700 of FIG. 7, and of which may include the structures of FIG. 2, FIG. 4, FIG. 5, and/or FIG. 6—may include forming the contact openings, and extending the contact openings for the through-step contacts 126, at a stage that is before forming the slits 114 (FIG. 1) and before replacing or converting the sacrificial structures 804 (FIG. 8) with the conductive structures 106 (FIG. 1). Various stages of such a method are illustrated in FIG. 40 through FIG. 49, in conjunction with the stages illustrated in FIG. 8 through FIG. 15, discussed above.

Figure 40:
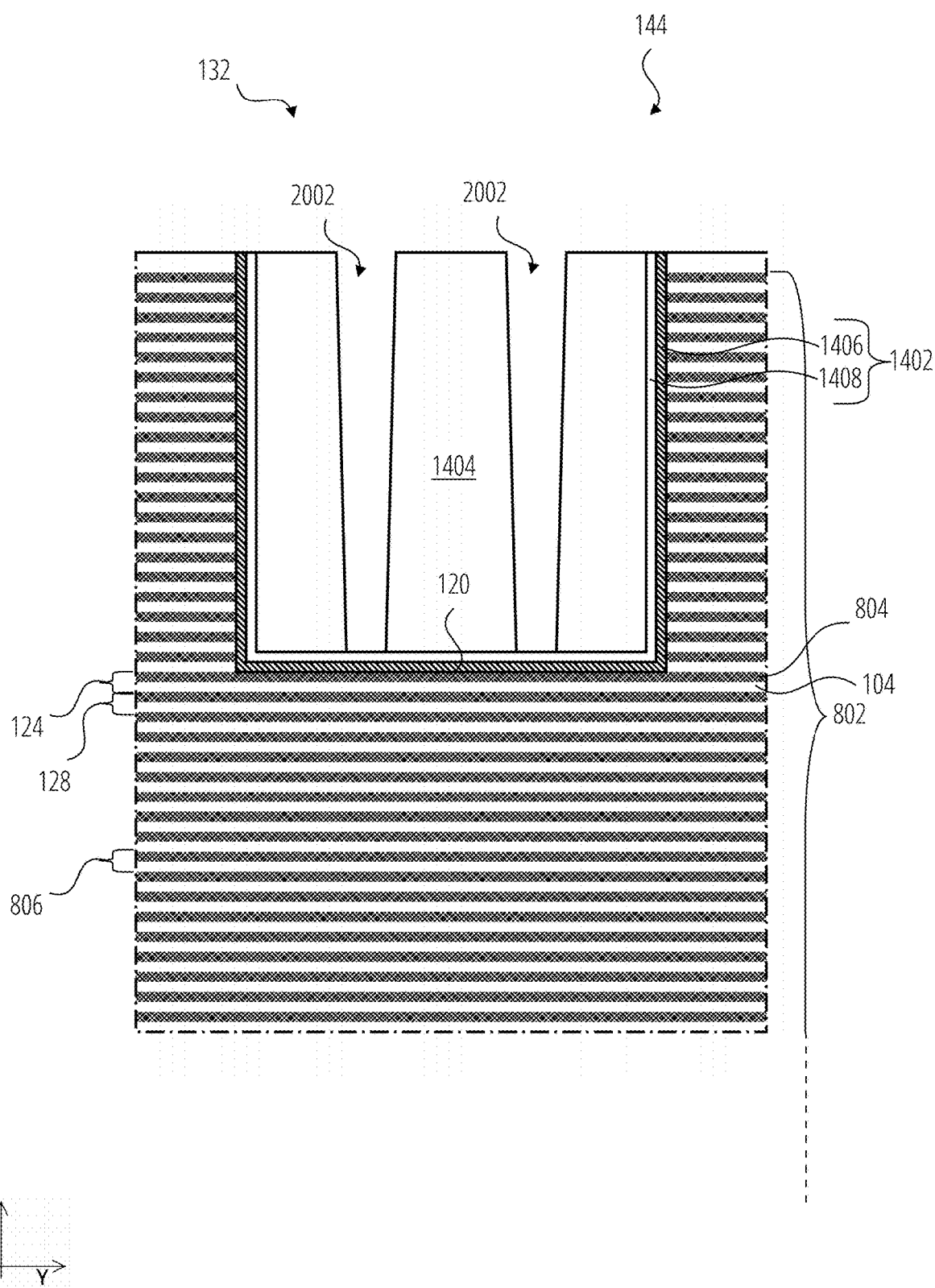
FIG. 40 through FIG. 49, along with FIG. 8 through FIG. 15, are schematic, cross-sectional, perspective views of various stages of processing (wherein the stage of FIG. 40 follows that of FIG. 15) to fabricate the structure of FIG. 48 and/or the structure of FIG. 49, either or both of which structures may be part(s) of a microelectronic device structure in accordance with embodiments of the disclosure, such as any of the aforementioned microelectronic device structures of FIG. 1 and FIG. 3.

The stage illustrated in FIG. 40 may follow that illustrated in FIG. 15. After forming the dielectric liner(s) 1402 and the insulative fill material(s) 1404 in the stadium openings 1302 (FIG. 15), and without yet removing or converting the sacrificial structures 804, the initial contact openings 2002 may be formed for each of the to-step contacts 122 (FIG. 1) and the through-step contacts 126 (FIG. 1).

Figure 41:
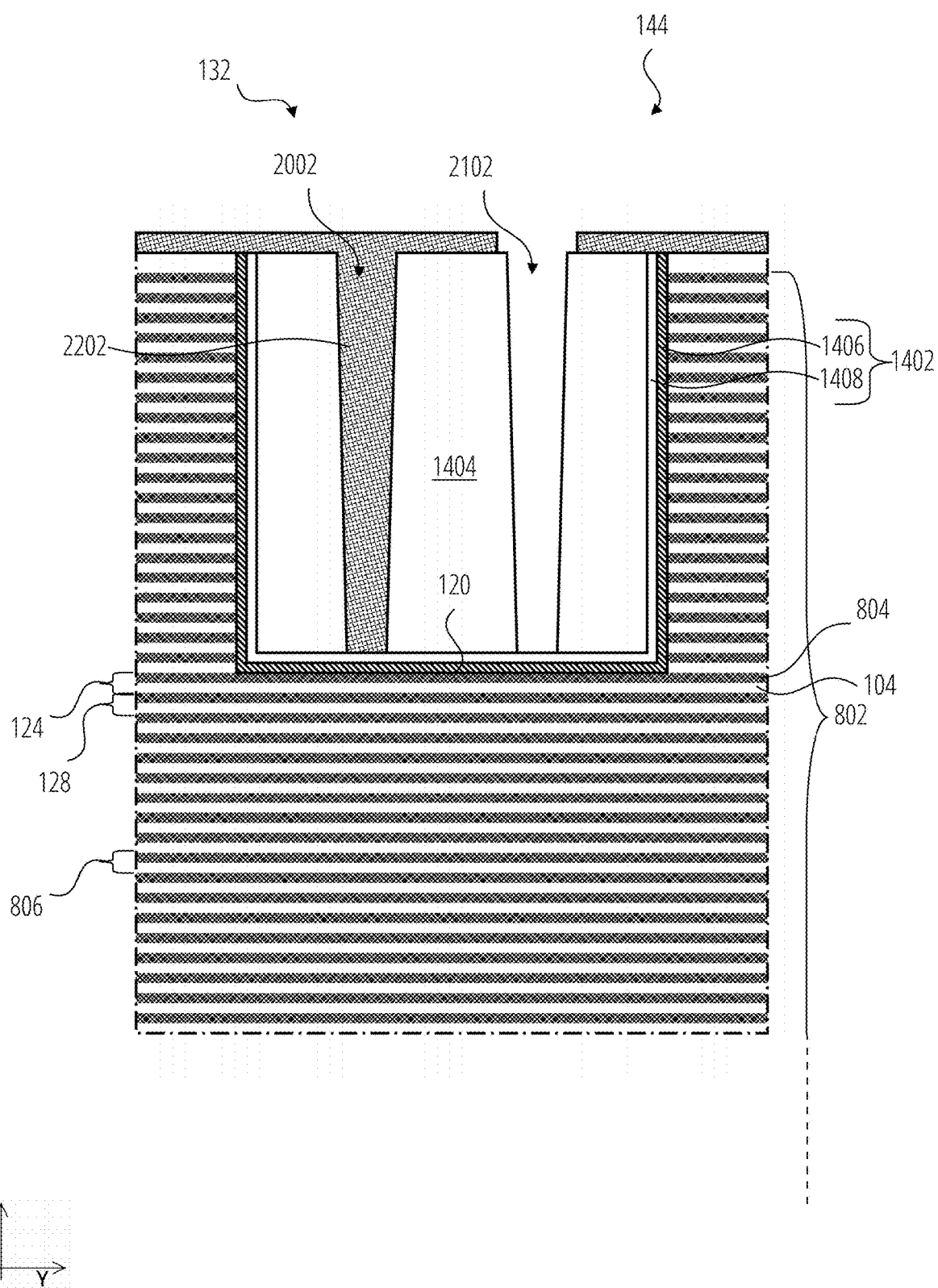

With reference to FIG. 41, the sacrificial fill material(s) 2202 may be formed to substantially fill, partially fill, or at least cover the initial contact openings 2002 for the to-step contacts 122. The initial contact openings 2002 for the through-step contacts 126 may not be filled (or may be filled and then re-emptied) to expose the dielectric liner(s) 1402 at the base of the initial contact openings 2002 for the through-step contacts 126.

Figure 42:
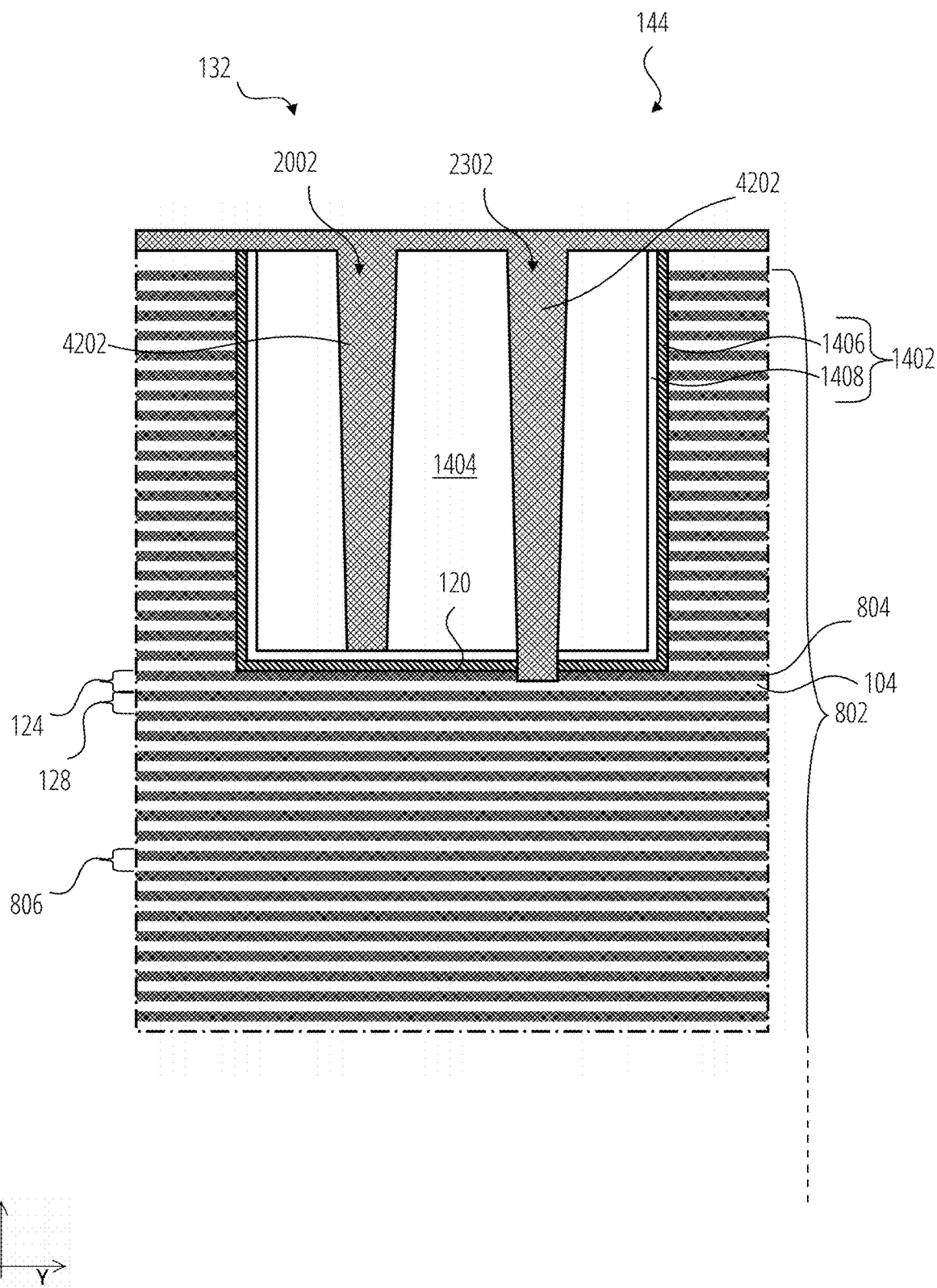

The exposed portions of the dielectric liner(s) 1402 may then be removed (e.g., etched), and the then-exposed portion of the conductive structure 106 of the treaded tier 124 may also be removed (e.g., etched) to form the half-tier extended contact openings 2302 for the through-step contacts 126 (FIG. 1), as illustrated in FIG. 42.

Additional sacrificial fill material(s) 4202 may be formed to fill the half-tier extended contact openings 2302. In some embodiments, the sacrificial fill material(s) 2202 (FIG. 41) may be removed (e.g., exhumed) to re-open the initial contact openings 2002 for the to-step contacts 122 (FIG. 1) before the additional sacrificial fill material(s) 4202 are formed (e.g., deposited) to substantially fill both the initial contact openings 2002 for the to-step contacts 122 (FIG. 1) and the half-tier extended contact openings 2302 for the through-step contacts 126 (FIG. 1).

The additional sacrificial fill material(s) 4202 may be formed of and include a material that is electively removable relative to material of the sacrificial structures 804 of the stack 802 and relative to the insulative material(s) of the insulative structures 104, the insulative fill material(s) 1404, and the dielectric liner(s) 1402. For example, in embodiments in which the sacrificial structure 804 and the dielectric liner 1406 comprises nitride material(s) and in which the insulative structures 104, insulative fill material(s) 1404, and additional dielectric liner 1408 comprise oxide material(s), the additional sacrificial fill material(s) 4202 may be formed of and include polysilicon (e.g., doped polysilicon, such as a P-doped polysilicon).

Figure 43:
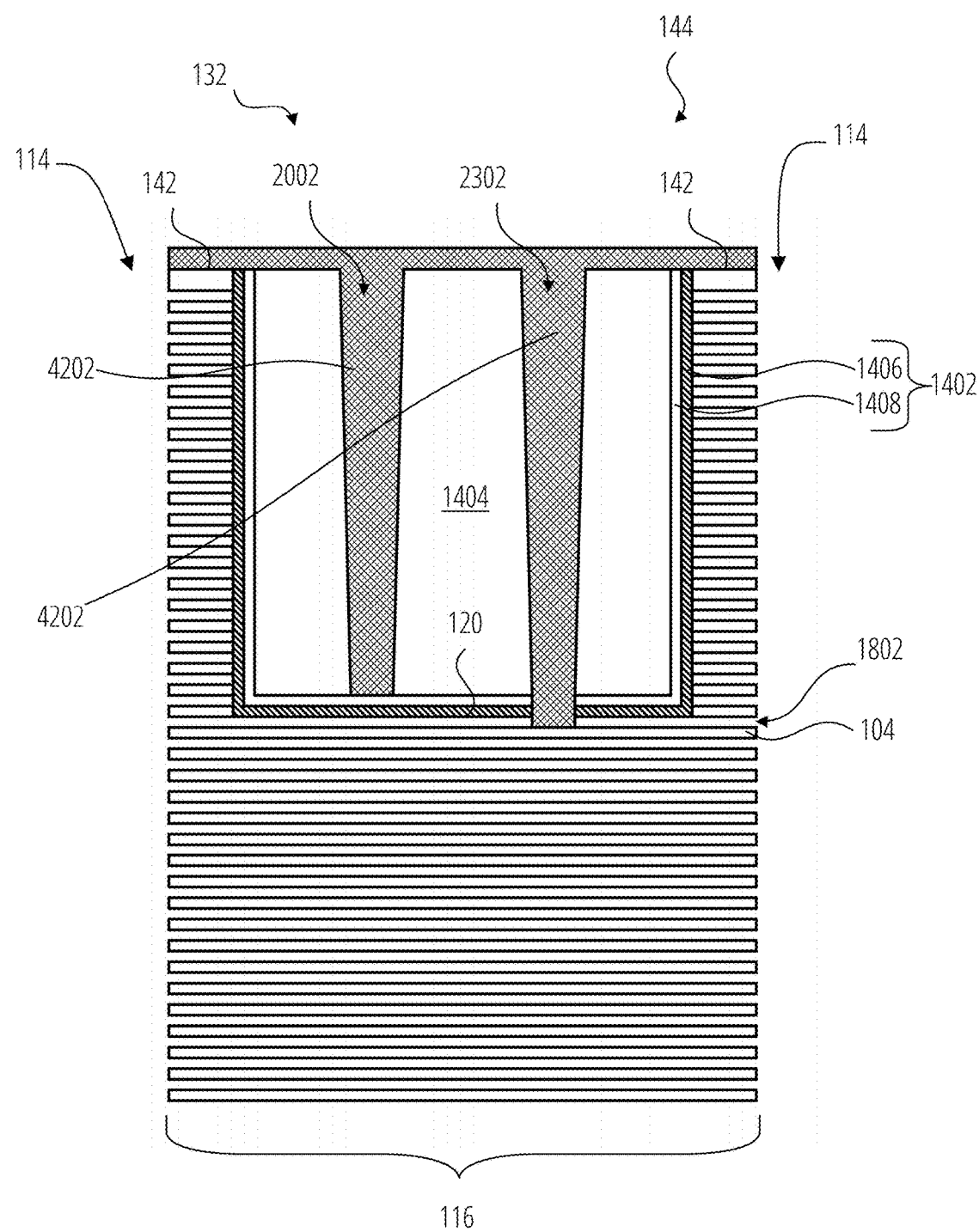
Figure 44:
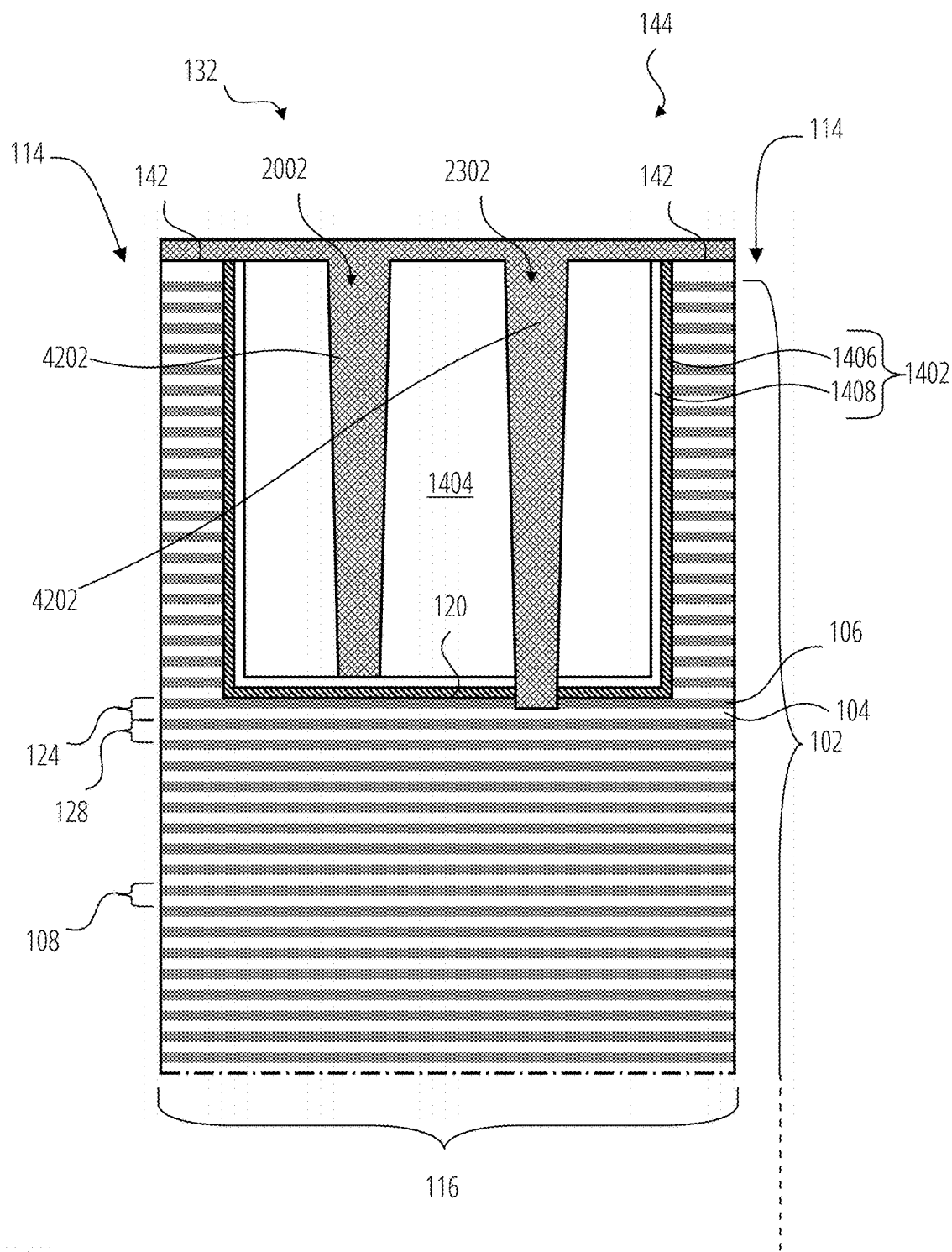

With reference to FIG. 43 and FIG. 44, the slits 114 may then be formed and the sacrificial structures 804 (FIG. 42) removed (e.g., exhumed)(as illustrated in FIG. 43) and replaced with or otherwise converted to the conductive structures 106 (as illustrated in FIG. 44) in a manner substantially similar to that described above with regard to FIG. 16 through FIG. 19.

By this method, the removal of the sacrificial structures 804 (FIG. 42) forms voids 1802 that expose at least a lower sidewall portion of the additional sacrificial fill material(s) 4202 in the half-tier extended contact openings 2302 for the through-step contacts 126. The composition of the additional sacrificial fill material(s) 4202 may be selected to facilitate the selective removal of the sacrificial structures 804 (FIG. 42) without substantially removing the additional sacrificial fill material(s) 4202.

Figure 45:
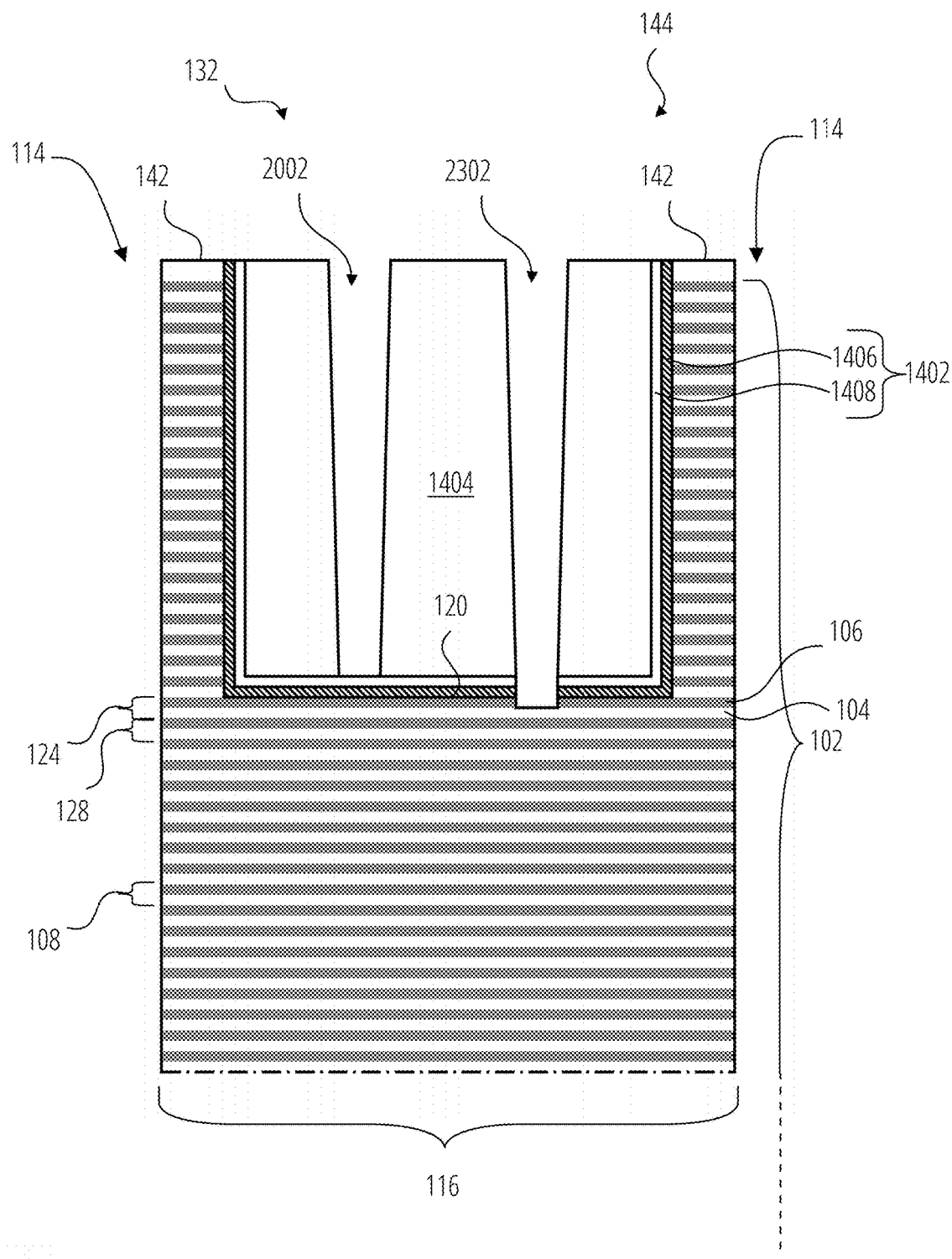

The additional sacrificial fill material(s) 4202 may then be removed (e.g., exhumed) to re-open the initial contact openings 2002 for the to-step contacts 122 (FIG. 1) and to re-open the half-tier extended contact openings 2302 for the through-step contacts 126 (FIG. 1), as illustrated in FIG. 45.

Figure 46:
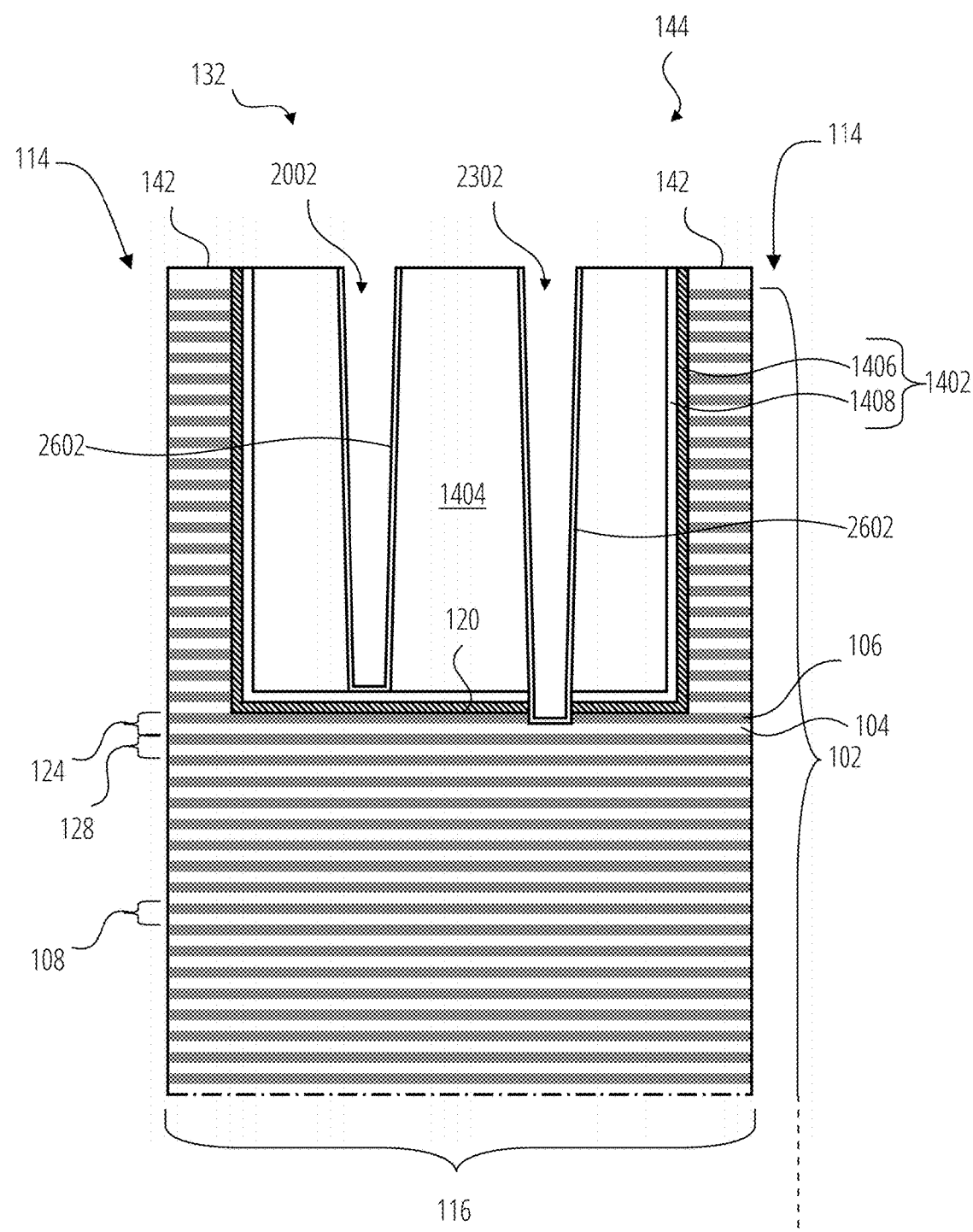

In some embodiments, the contact liner 2602 may then be formed in the initial contact openings 2002 for the to-step contacts 122 (FIG. 1) and in the half-tier extended contact openings 2302 for the through-step contacts 126 (FIG. 1), as illustrated in FIG. 46.

Figure 47:
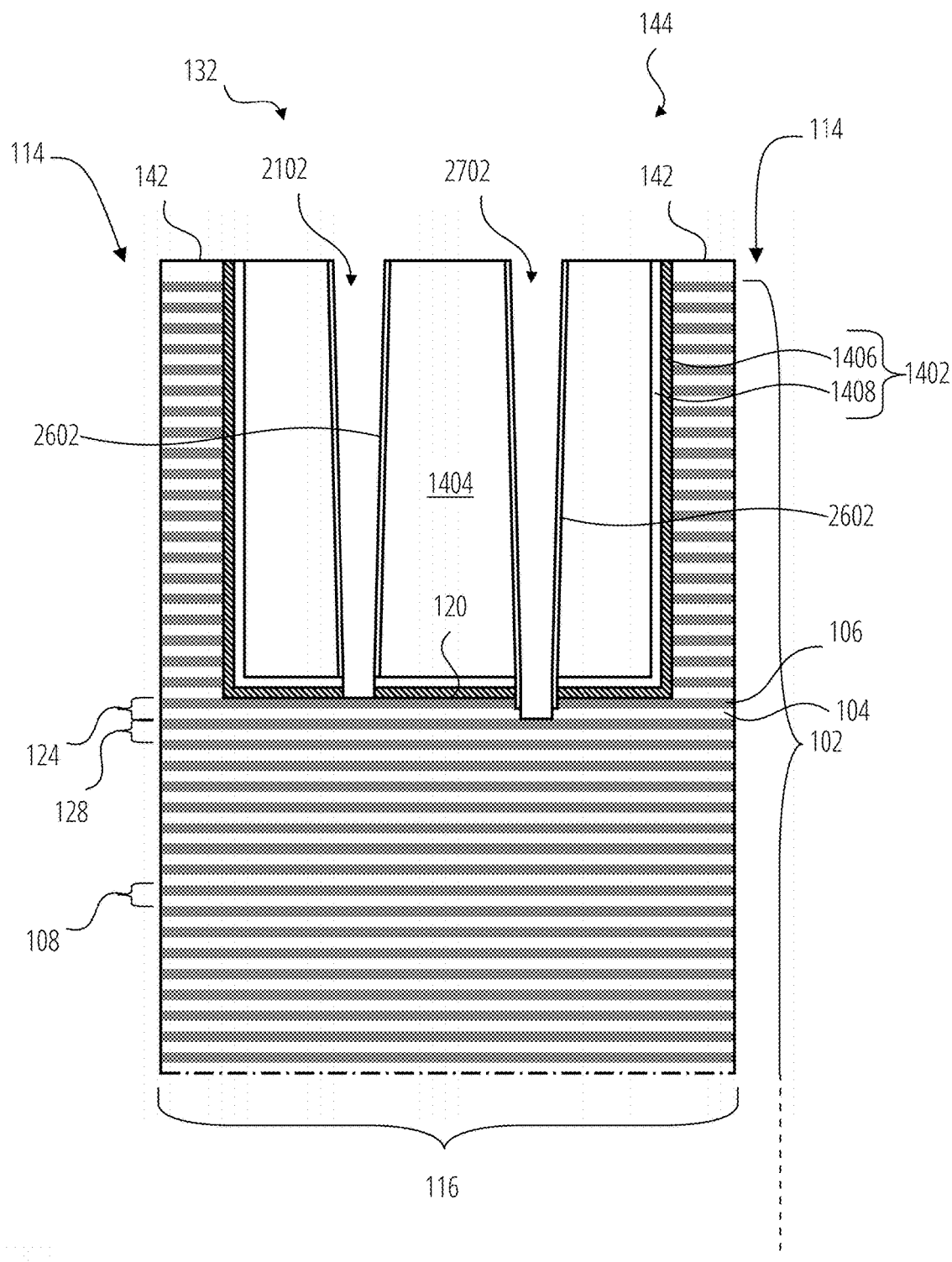

With reference to FIG. 47, the base portions of the contact liner 2602 may be removed (e.g., etched). Concurrently or subsequently, the vertically adjacent portions of the dielectric liner(s) 1402 (if still present) may be removed from the base of the initial contact openings 2002 (FIG. 46) to form the contact openings 2102 for the to-step contacts 122 (FIG. 1). Before, during, or after forming the contact openings 2102, the portions of the insulative structure 104 of the treaded tier 124 may be removed (e.g., etched) from the base of the half-tier extended contact openings 2302 (FIG. 46) to form the extended contact openings 2702 for the through-step contacts 126 (FIG. 1).

Figure 48:
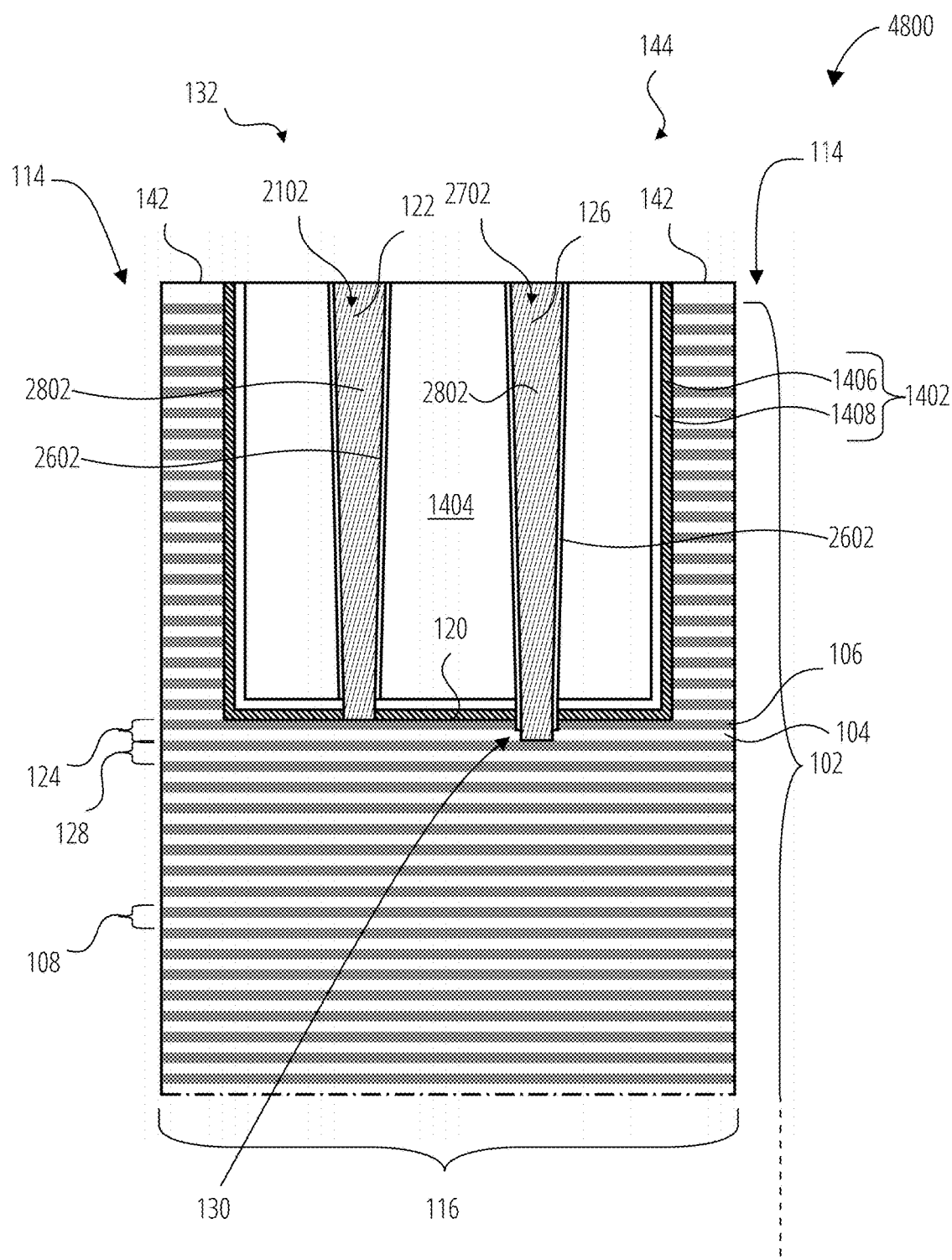
Figure 49:
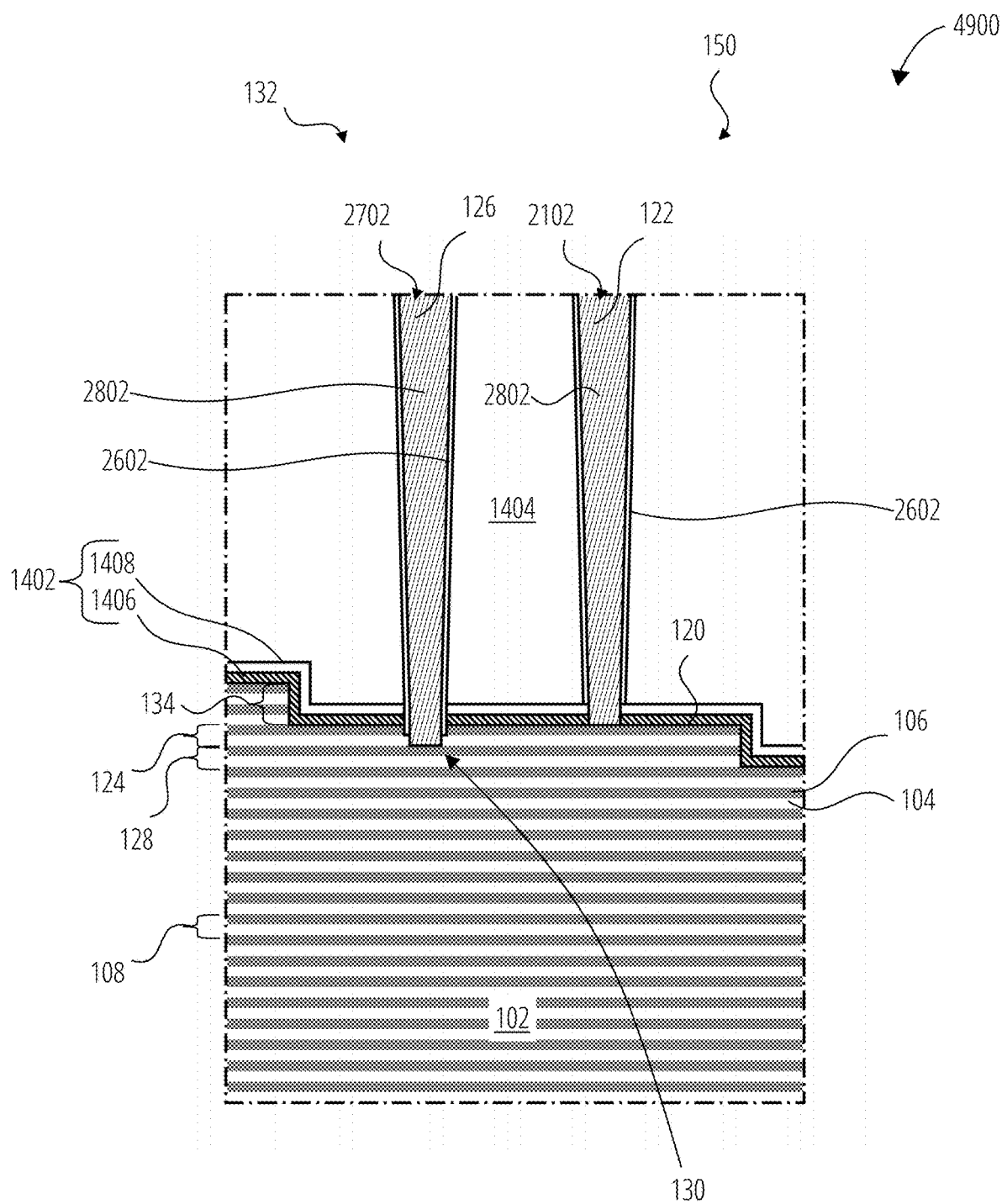

With reference to FIG. 48 and FIG. 49, the conductive material(s) 2802 may then be formed (e.g., deposited) to complete the to-step contacts 122 and the through-step contacts 126 of structures 4800 for the steps 120 of the multi-series stadium 144 and/or of structures 4900 for the steps 120 of the single-series stadiums 150. In the resulting structures 4800 and 4900, the contact liner 2602 substantially encircles the to-step contacts 122 and the through-step contact 126 and spaces the conductive material(s) 2802 thereof from the insulative fill material(s) 1404. The contact liner 2602 also spaces the through-step contacts 126 from the dielectric liner(s) 1402 and the conductive structure 106 of the treaded tier 124 (e.g., of the step 120). However, the contact liner 2602 for the to-step contact 122 does not extend into the dielectric liner(s) 1402, and the contact liner 2602 for the through-step contact 126 does not extend into the insulative structure 104 of the treaded tier 124.

In some embodiments, a method of forming a microelectronic device—such as one including the microelectronic device structure 100 of FIG. 1 and FIG. 3 and/or the microelectronic device structure 700 of FIG. 7, and of which may include the structures of FIG. 2, FIG. 4, FIG. 5, and/or FIG. 6—may include both forming and extending the contact openings before replacing or converting the sacrificial structures 804 (FIG. 8) and forming the lateral recess 2402. Various stages of such a method are illustrated in FIG. 50 through FIG. 55, in conjunction with the stages illustrated in FIG. 8 through FIG. 15 and FIG. 40 through FIG. 44, as discussed above.

Figure 50:
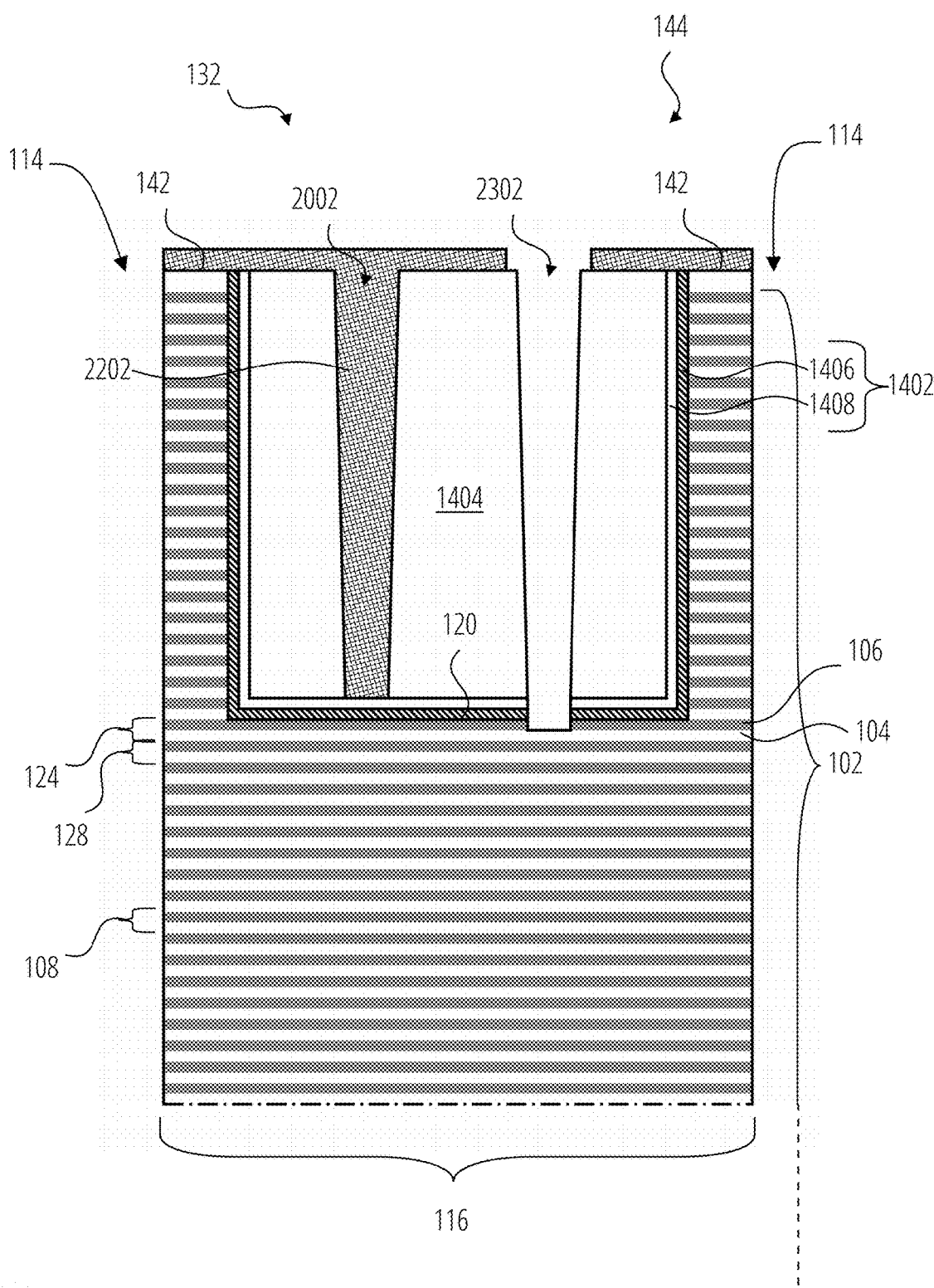
FIG. 50 through FIG. 55, along with FIG. 8 through FIG. 15 and FIG. 40 through FIG. 44, are schematic, cross-sectional, perspective views of various stages of processing (wherein the stage of FIG. 40 follows that of FIG. 15 and the stage of FIG. 50 follows that of FIG. 44) to fabricate the structure of FIG. 54 and/or the structure of FIG. 55, either or both of which structures may be part(s) of a microelectronic device structure in accordance with embodiments of the disclosure, such as any of the aforementioned microelectronic device structures of FIG. 1 and FIG. 3.

The stage illustrated in FIG. 50 may follow that illustrated in FIG. 44. After forming the conductive structures 106 in place of the sacrificial structures 804, the additional sacrificial fill material(s) 4202 may be removed from at least the half-tier extended contact openings 2302 for the through-step contacts 126. In some embodiments, the additional sacrificial fill material(s) 4202 may be wholly removed, and the sacrificial fill material(s) 2202 may be formed to fill and/or cover the initial contact openings 2002 for the to-step contacts 122 (FIG. 1), as illustrated in FIG. 50.

Figure 51:
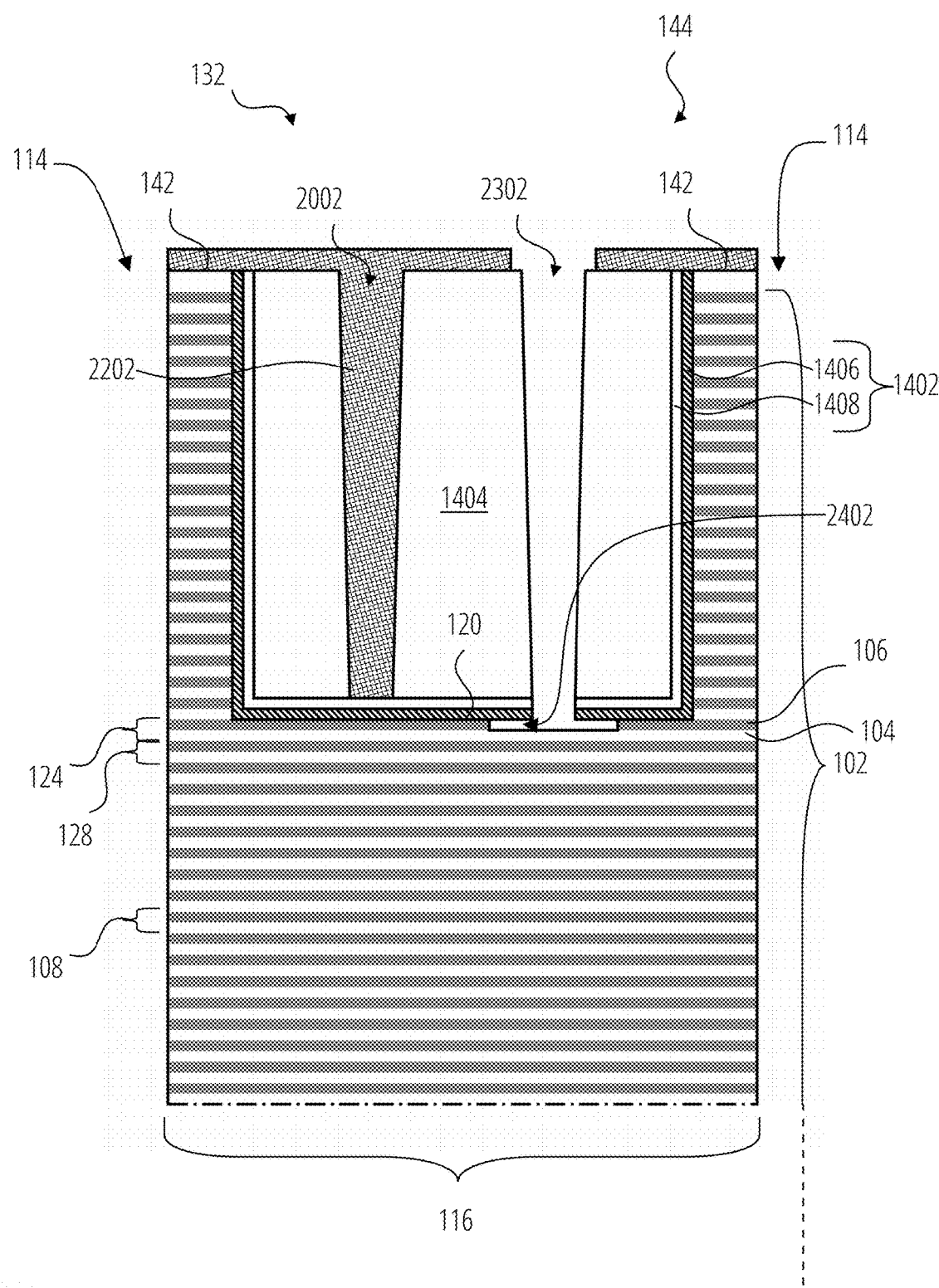

With reference to FIG. 51, the lateral recess 2402 may be formed into the conductive structure 106 that is at the base of the half-tier extended contact opening 2302 in substantially the same manner described above with regard to FIG. 24.

Figure 52:
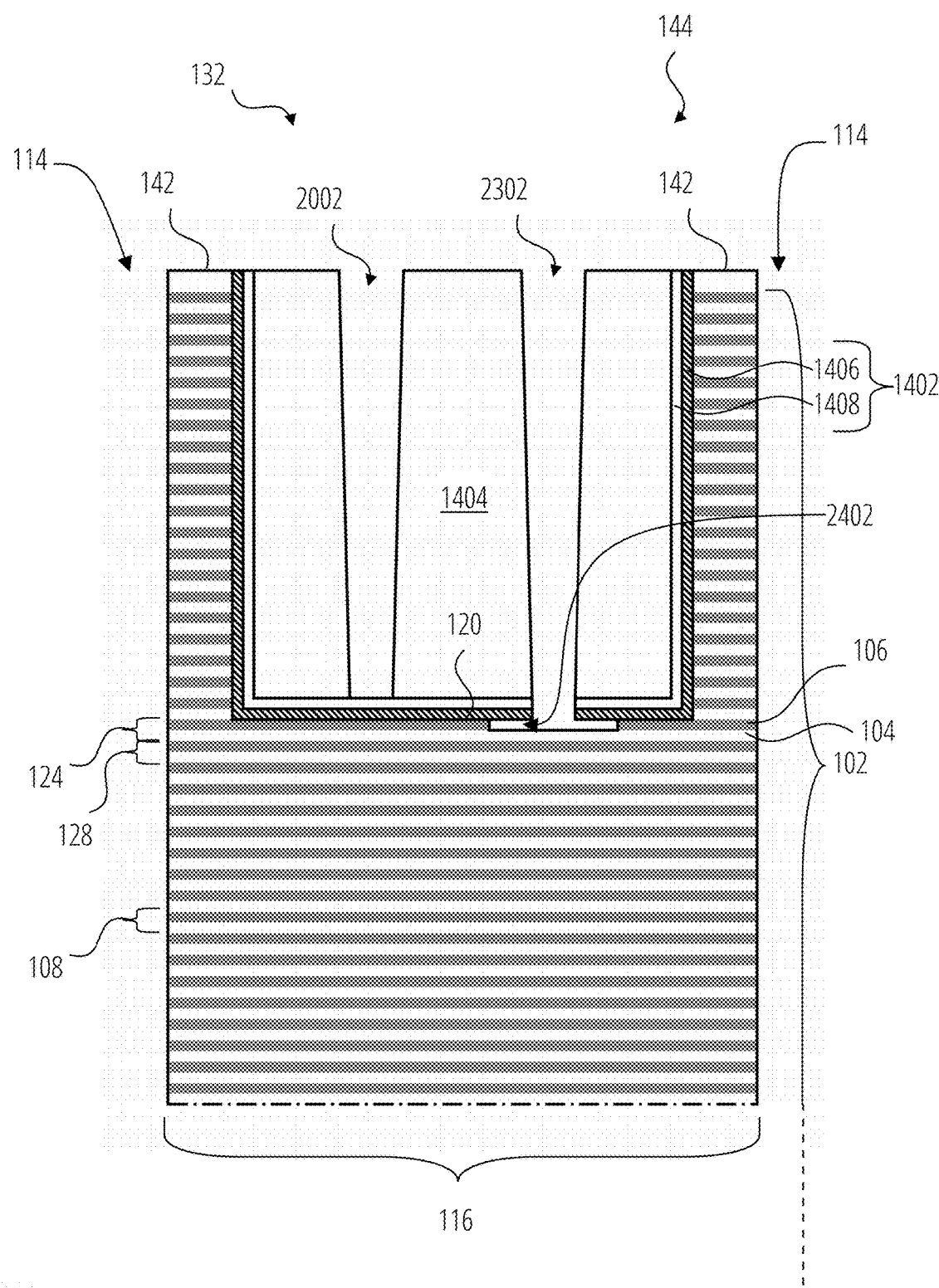

The sacrificial fill material(s) 2202 (and/or the additional sacrificial fill material(s) 4202, if still present) may be removed (e.g., exhumed) to re-open the initial contact openings 2002 of the to-step contacts 122 (FIG. 1), as illustrated in FIG. 52.

Figure 53:
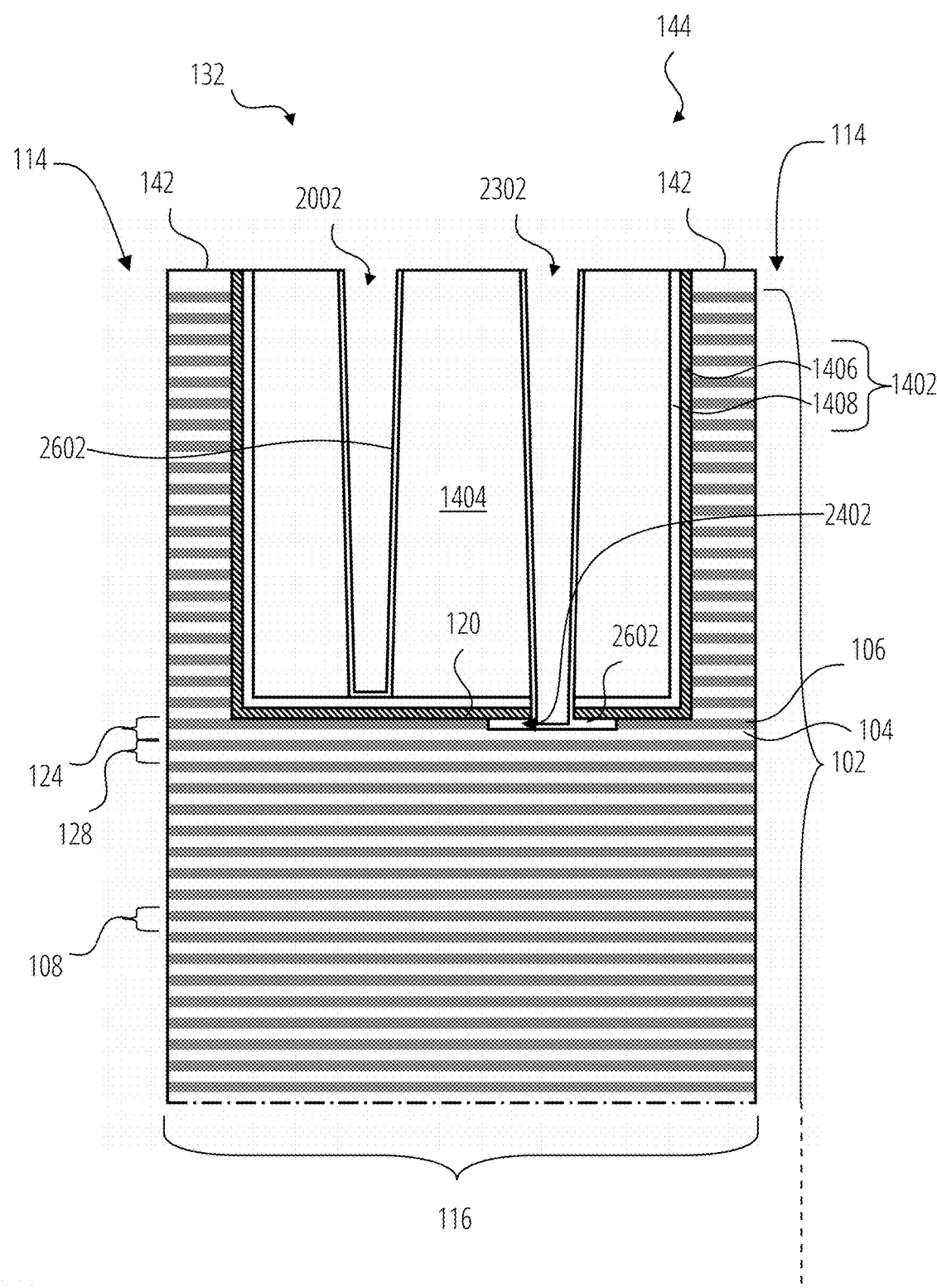

With reference to FIG. 53, the contact liner 2602 may be formed in both the initial contact openings 2002 for the to-step contacts 122 (FIG. 1) and in the half-tier extended contact openings 2302 and the lateral recesses 2402 for the through-step contacts 126 (FIG. 1).

Figure 54:
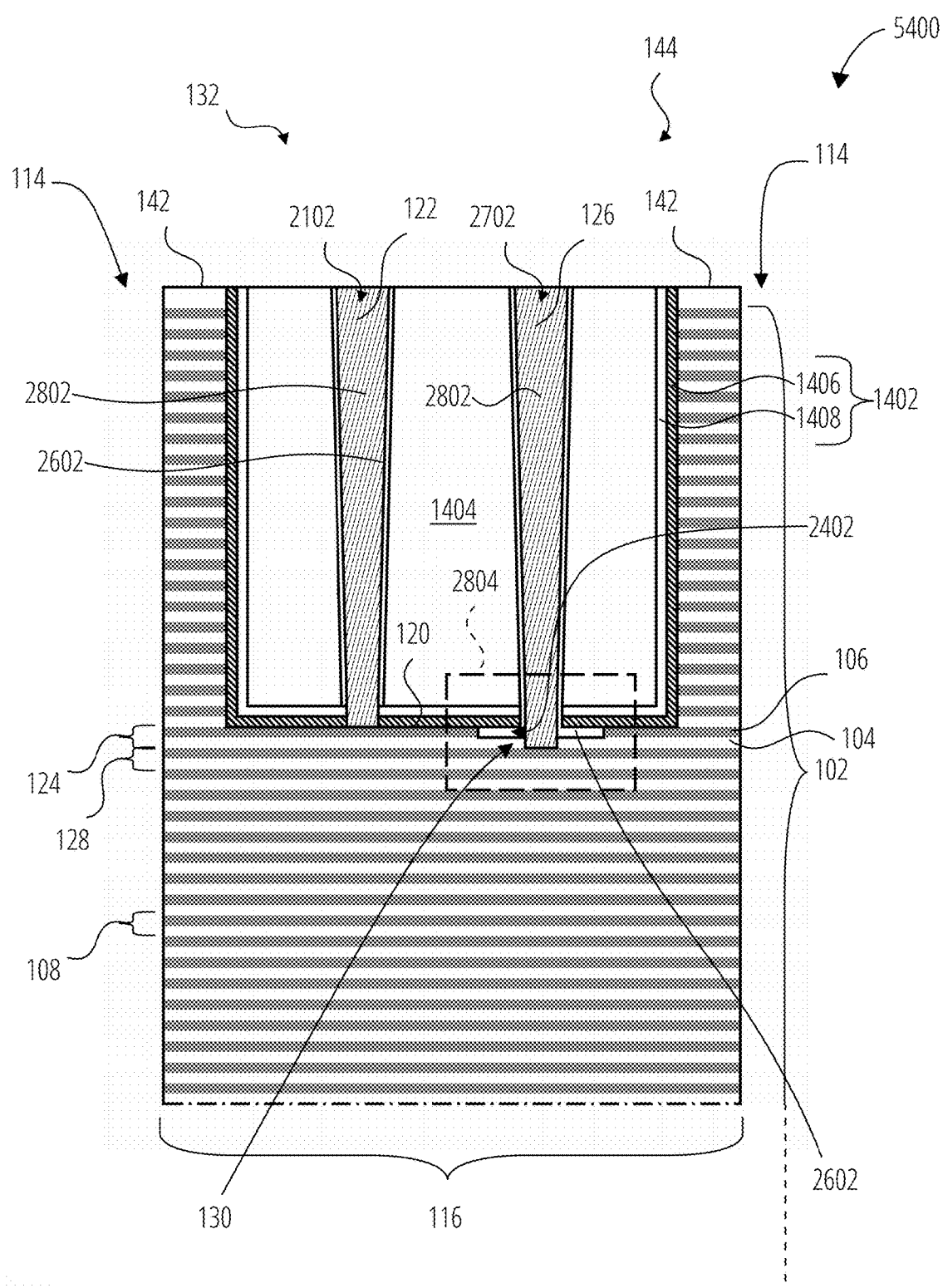

The portion of the contact liner 2602 at the base of the initial contact openings 2002 may be removed, and the vertically adjacent portions of the dielectric liner(s) 1402 may also be removed to form the contact openings 2102 for the to-step contacts 122, as illustrated in FIG. 54. The portion of the contact liner 2602 at the base of the half-tier extended contact opening 2302 (FIG. 53) and the vertically adjacent portion of the insulative structure 104 of the treaded tier 124 may also be removed to form the extended contact openings 2702, as also illustrated in FIG. 54.

Figure 55:
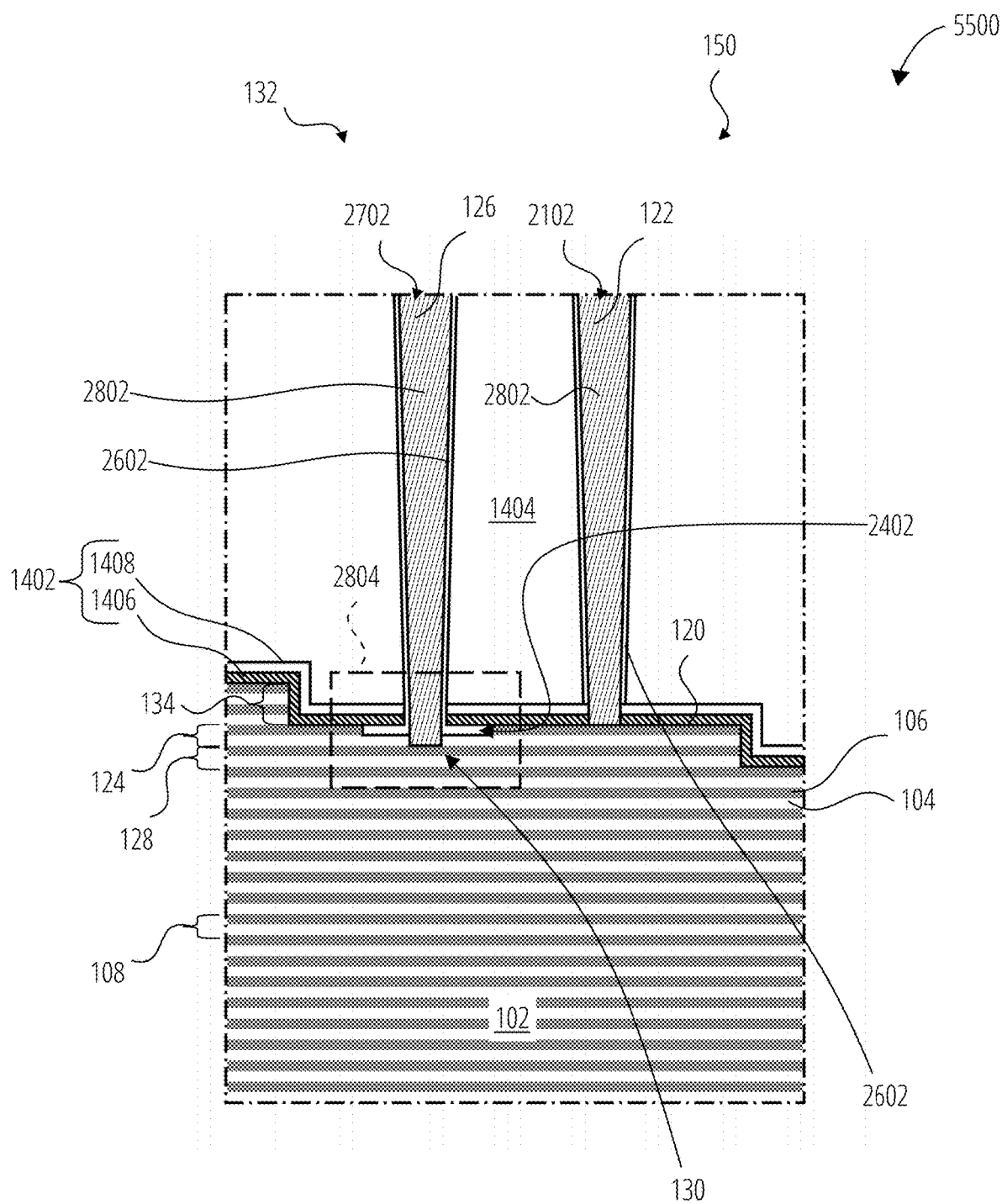

With continued reference to FIG. 54 and also with reference to FIG. 55, the conductive material(s) 2802 may then be formed (e.g., deposited) to complete the to-step contacts 122 and the through-step contacts 126 of structures 5400 for the steps 120 of the multi-series stadium 144 and/or of structures 5500 for the steps 120 of the single-series stadiums 150. In the resulting structures 5400 and 5500, the contact liner 2602 substantially encircles the to-step contacts 122, without extending into the dielectric liner(s) 1402, and the contact liner 2602 substantially encircles the through-step contacts 126 and extends into the dielectric liner(s) 1402. Accordingly, the contact liner 2602 spaces the conductive material(s) 2802 of the to-step contact 122 and the through-step contacts 126 from the insulative fill material(s) 1404, and spaces the conductive material(s) 2802 of the through-step contacts 126 from the dielectric liner(s) 1402. The contact liner 2602 within the lateral recess 2402 also spaces and electrically isolates the through-step contact 126 from the conductive structure 106 of the treaded tier 124 (e.g., of the step 120).

As with the structure 2800 of FIG. 28 and the structure 2900 of FIG. 29, the features illustrated in box 2804 for the structure 5400 of FIG. 54 and for the structure 5500 of FIG. 55 may be otherwise configured as any of that illustrated in box 2804' of FIG. 30A, box 2804'' of FIG. 30B, or box 2804''' of FIG. 30C.

Accordingly, disclosed is a method of forming a microelectronic device. The method comprises forming a tiered stack over a base structure. The tiered stack comprises a vertically alternating sequence of insulative structures and other structures arranged in tiers. Portions of the tiered stack are removed to form a stadium in the tiered stack. The stadium comprises at least one staircase comprising step treads at ends of some of the tiers of the tiered stack. Each of the step treads is provided by an upper surface portion of one of the other structures of the tiered stack. Conductive contact structures are formed to extend to one of the step treads. Forming the conductive contact structures comprises forming a first conductive contact structure in physical contact with the one of the step treads and forming a second conductive contact structure extending through the one of the step treads.

Figure 56:
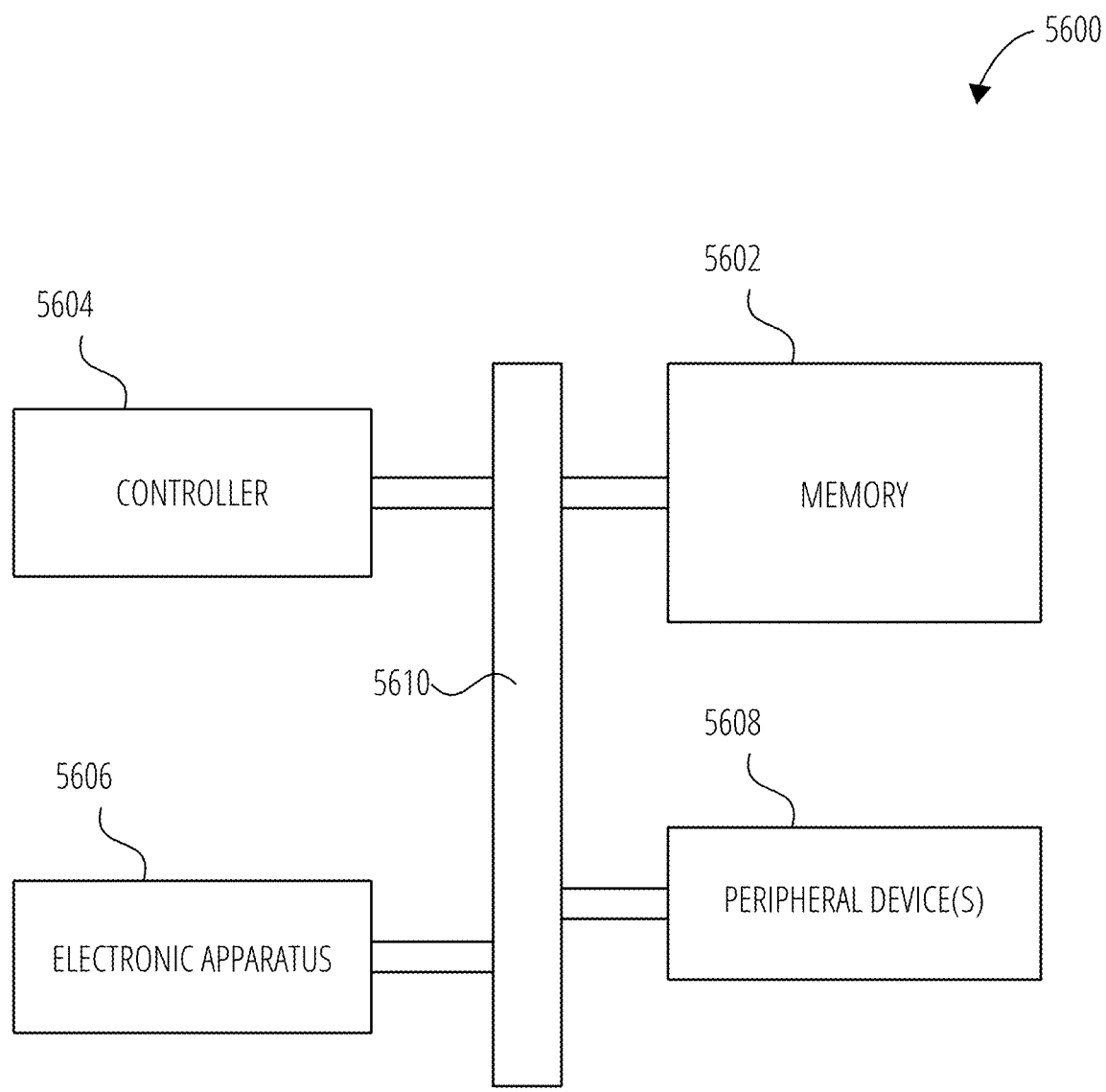
FIG. 56 is a block diagram of an electronic system including a microelectronic device that includes at least one microelectronic device structure of embodiments of the disclosure.

FIG. 56 shows a block diagram of a system 5600, according to embodiments of the disclosure, which system 5600 includes memory 5602 including arrays of vertical strings of memory cells adjacent microelectronic device structure(s) (e.g., microelectronic device structure 100 of FIG. 1 and FIG. 3; and/or microelectronic device structure 700 of FIG. 7). Therefore, the architecture and structure of the memory 5602 may include one or more device structures according to embodiments of the disclosure and may be fabricated according to one or more of the methods described above (e.g., with reference to FIG. 8 through FIG. 55).

The system 5600 may include a controller 5604 operatively coupled to the memory 5602. The system 5600 may also include another electronic apparatus 5606 and one or more peripheral device(s) 5608. The other electronic apparatus 5606 may, in some embodiments, include one or more of microelectronic device structures (e.g., microelectronic device structure 100 of FIG. 1 and FIG. 3; and/or microelectronic device structure 700 of FIG. 7), according to embodiments of the disclosure and fabricated according to one or more of the methods described above. One or more of the controller 5604, the memory 5602, the other electronic apparatus 5606, and the peripheral device(s) 5608 may be in the form of one or more integrated circuits (ICs).

A bus 5610 provides electrical conductivity and operable communication between and/or among various components of the system 5600. The bus 5610 may include an address bus, a data bus, and a control bus, each independently configured. Alternatively, the bus 5610 may use conductive lines for providing one or more of address, data, or control, the use of which may be regulated by the controller 5604. The controller 5604 may be in the form of one or more processors.

The other electronic apparatus 5606 may include additional memory (e.g., with one or more microelectronic device structures (e.g., microelectronic device structure 100 of FIG. 1 and FIG. 3; and/or microelectronic device structure 700 of FIG. 7)), according to embodiments of the disclosure and fabricated according to one or more of the methods described above. Other memory structures of the memory 5602 and/or the other electronic apparatus 5606 may be configured in an architecture other than 3D NAND, such as dynamic random access memory (DRAM), static random access memory (SRAM), synchronous dynamic random access memory (SDRAM), synchronous graphics random access memory (SGRAM), double data rate dynamic ram (DDR), double data rate SDRAM, and/or magnetic-based memory (e.g., spin-transfer torque magnetic RAM (STT-MRAM)).

The peripheral device(s) 5608 may include displays, imaging devices, printing devices, wireless devices, additional storage memory, and/or control devices that may operate in conjunction with the controller 5604.

The system 5600 may include, for example, fiber optics systems or devices, electro-optic systems or devices, optical systems or devices, imaging systems or devices, and information handling systems or devices (e.g., wireless systems or devices, telecommunication systems or devices, and computers).

Any microelectronic device structure included in component(s) of the system 5600 may include one or more of the structures (e.g., structures 2800 and/or 2900 of FIG. 28 and/or FIG. 29, respectively; structures 3300 and/or 3400 of FIG. 33 and/or FIG. 34, respectively; structures 3800 and/or 3900 of FIG. 38 and/or FIG. 39, respectively; structures 4800 and/or 4900 of FIG. 48 and/or FIG. 49, respectively; and/or structures 5400 and/or 5500 of FIG. 54 and/or FIG. 55, respectively). In one, more, or all such microelectronic device structures, one or more single-series stadium 150 may be otherwise configured as the single-series stadium 150' of FIG. 6.

Accordingly, disclosed is an electronic system comprising a microelectronic device, at least one processor in operable communication with the microelectronic device, and at least one peripheral device in operable communication with the at least one processor. The microelectronic device comprises a stack structure comprising tiers. Each of the tiers includes a conductive structure and an insulative structure vertically adjacent the conductive structure. A series of staircased stadiums in the stack structure comprises steps defined by edges of some of the tiers. The steps of at least one of the staircased stadiums has a riser height of at least two of the tiers. Conductive contact structures extend toward the steps of the at least one of the staircased stadiums. At least some of the conductive contact structures land on treads of the steps of the at least one of the staircased stadiums. At least some others of the conductive contact structures extend through the treads of the steps of the at least one of the staircased stadiums.

While the disclosed structures, apparatus (e.g., devices), systems, and methods are susceptible to various modifications and alternative forms in implementation thereof, specific embodiments have been shown by way of example in the drawings and have been described in detail herein. However, the disclosure is not intended to be limited to the particular forms disclosed. Rather, the disclosure encompasses all modifications, combinations, equivalents, variations, and alternatives falling within the scope of the disclosure as defined by the following appended claims and their legal equivalents.

What is claimed is:

1. A microelectronic device, comprising:
a tiered stack comprising a vertically alternating sequence of insulative structures and conductive structures arranged in tiers;
a stadium within the tiered stack and comprising a staircase comprising steps at ends of some of the tiers, the steps each comprising a tread provided by an upper surface portion of one of the conductive structures of the some of the tiers;
conductive contact structures extending to one of the steps and comprising:
a first conductive contact structure terminating at the tread of the one of the steps; and
a second conductive contact structure extending through the tread of the one of the steps; and
a dielectric contact liner spacing the second conductive contact structure from the tread of the one of the steps,
for individuals of the steps, the one of the conductive structures of the some of the tiers defines a lateral recess adjacent the second conductive contact structure, the dielectric contact liner laterally protruding at an elevation of the one of the conductive structures to at least partially fill the lateral recess.

2. The microelectronic device of claim 1, further comprising:
additional conductive contact structures extending to an additional one of the steps and comprising:
a third conductive contact structure terminating at the tread of the additional one of the steps; and
a fourth conductive contact structure extending through the tread of the additional one of the steps.

3. The microelectronic device of claim 2, wherein:
the first conductive contact structure and the third conductive contact structure are within a first series of laterally aligned conductive contact structures; and
the second conductive contact structure and the fourth conductive contact structure are within a second series of laterally aligned conductive contact structures.

4. The microelectronic device of claim 3, wherein the second series of laterally aligned conductive contact structures is longitudinally adjacent the first series of laterally aligned conductive contact structures.

5. The microelectronic device of claim 1, further comprising at least one dielectric material lining the tread of the one of the steps and sidewalls of the tiered stack above the stadium.

6. The microelectronic device of claim 1, wherein the dielectric contact liner extends to substantially encircle the second conductive contact structure in elevations above the one of the steps.

7. The microelectronic device of claim 6, further comprising an additional dielectric contact liner substantially encircling the first conductive contact structure in elevations above the one of the steps.

8. The microelectronic device of claim 6, wherein the first conductive contact structure is in direct physical contact with dielectric fill material that substantially fills space above the stadium within the tiered stack.

9. A microelectronic device, comprising:
a stack structure comprising a vertically alternating sequence of insulative structures and conductive structures arranged in tiers;
a series of stadiums within the stack structure, each of at least some of the stadiums comprising at least one staircase defined in a group of the tiers, the group of the tiers comprising:
treaded tiers, the conductive structures of which provide treads of steps of the at least one staircase; and
covered tiers, the conductive structures of which are each directly vertically below one of the treaded tiers;
at least one conductive contact structure extending to one of the conductive structures providing one of the treads;
at least one other conductive contact structure extending through one of the treaded tiers to one of the conductive structures of the covered tiers; and
a dielectric contact liner spacing the at least one other conductive contact structure from the one of the conductive structures providing the one of the treads through which the at least one other conductive contact structure extends,
the one of the conductive structures defining a lateral recess adjacent the at least one other conductive contact structure, the dielectric contact liner horizontally extending at an elevation of the one of the conductive structures to at least partially fill the lateral recess.

10. The microelectronic device of claim 9, wherein at least one other of the stadiums comprises at least one other staircase defined in an other group of the tiers, the other group of the tiers consisting of other treaded tiers, the conductive structures of which each provide other treads of other steps of the at least one other staircase.

11. The microelectronic device of claim 9, wherein the at least one conductive contact structure and the at least one other conductive contact structure both extend through dielectric liners on the one of the conductive structures providing the one of the treads.

12. The microelectronic device of claim 9, wherein both the at least one conductive contact structure and the at least one other conductive contact structure extend vertically above the one of the treads.

13. The microelectronic device of claim 9, wherein the at least one staircase comprises a descending staircase and an ascending staircase vertically offset from one another.

14. A method of forming a microelectronic device, the method comprising:
forming a tiered stack over a base structure, the tiered stack comprising a vertically alternating sequence of insulative structures and other structures arranged in tiers;
removing portions of the tiered stack to form a stadium within the tiered stack, the stadium comprising at least one staircase comprising steps at ends of some of the tiers of the tiered stack, the steps each comprising a tread provided by an upper surface portion of one of the other structures of the some of the tiers of the tiered stack; and
forming conductive structures in place of the other structures so that each of the steps is provided by an upper surface portion of one of the conductive structures;

forming openings in the conductive structures that provide the steps;
for individuals of the steps:
laterally recessing the one of the conductive structures providing the individual step to form a lateral recess defined by the one of the conductive structures;
forming a dielectric material in the lateral recesses to form a dielectric contact liner;
forming conductive contact structures extending to the individual step, comprising:
forming a first conductive contact structure in physical contact with and terminating at the tread of the individual step; and
forming a second conductive contact structure extending through the individual step adjacent the lateral recess, the dielectric contact liner spacing the second conductive contact structure from the tread of the individual step, the dielectric contact liner laterally protruding at an elevation of the one of the conductive structures providing the individual step to at least partially fill the lateral recess.

15. The method of claim 14, further comprising, before laterally recessing the one of the conductive structures:
forming at least one dielectric liner material on the stadium in the tiered stack; and
forming at least one dielectric fill material on the at least one dielectric liner material to substantially fill a space above the stadium.

16. The method of claim 15, further comprising, before forming the conductive contact structures:
forming contact openings extending through the at least one dielectric fill material and through the at least one dielectric liner material; and
extending one of the contact openings through the one of the conductive structures and through one of the insulative structures, the one of the insulative structures being directly vertically below the one of the conductive structures; and
wherein forming the dielectric material in the lateral recess to form the dielectric contact liner comprises forming the dielectric contact liner in the extended one of the contact openings.

17. The method of claim 15:
further comprising, before forming the conductive contact structures:
forming contact openings extending through the at least one dielectric fill material and through the at least one dielectric liner material;
extending one of the contact openings through the one of the other structures to form a half-tier extended contact opening;
wherein forming the conductive structures in place of the other structures comprises:
substantially removing the other structures of the tiers;
forming the conductive structures between the insulative structures of the tiers so that the each of the steps is provided by the upper surface portion of the one of the conductive structures; and
further comprising extending the half-tier extended contact opening through one of the insulative structures to form a one-tier extended contact opening.

18. The method of claim 17, further comprising:
before substantially removing the other structures of the tiers, substantially filling the other of the contact openings and the half-tier extended contact opening with a sacrificial material; and
before extending the half-tier extended contact opening, substantially removing the sacrificial material from at least the half-tier extended contact opening.

19. The method of claim 18, wherein substantially filling the other of the contact openings and the half-tier extended contact opening with the sacrificial material comprises forming polysilicon in the other of the contact openings and in the half-tier extended contact opening.

20. The method of claim 14, wherein:
forming the second conductive contact structure comprises forming the second conductive contact structure longitudinally adjacent the first conductive contact structure; and
the method further comprises:
forming additional conductive contact structures extending to an additional individual step of the steps, comprising:
forming a third conductive contact structure laterally adjacent the first conductive contact structure and in physical contact with the tread of the additional individual step; and
forming a fourth conductive contact structure laterally adjacent the second conductive contact structure and extending through the tread of the additional individual step.

21. The method of claim 20, wherein:
forming the second conductive contact structure comprises forming the second conductive contact structure laterally adjacent the first conductive contact structure; and
the method further comprises:
forming additional conductive contact structures extending to an additional individual step of the steps, comprising:
forming a third conductive contact structure laterally adjacent the second conductive contact structure and in physical contact with tread of the additional individual step; and
forming a fourth conductive contact structure laterally adjacent the third conductive contact structure and extending through the tread of the additional individual step.

22. An electronic system, comprising:
a microelectronic device comprising:
a tiered stack comprising a vertically alternating sequence of insulative structures and conductive structures arranged in tiers;
a stadium within the tiered stack and comprising a staircase comprising steps at ends of some of the tiers, the steps each comprising a tread provided by an upper surface portion of one of the conductive structures of the some of the tiers, the steps individually having a riser height of at least two of the tiers; and
conductive contact structures extending to one of the steps of the stadium and comprising:
a first conductive contact structure terminating at the tread of the one of the steps; and
a second conductive contact structure extending through the tread of the one of the steps;
a dielectric contact liner spacing the second conductive contact structure from the tread of the one of the steps,
for individuals of the steps, the one of the conductive structures of the some of the tiers defines a lateral recess adjacent the second conductive contact structure, the dielectric contact liner laterally protruding at an elevation of the one of the conductive structures to at least partially fill the lateral recess;
at least one processor in operable communication with the microelectronic device; and
at least one peripheral device in operable communication with the at least one processor.

* * * * *